(12) United States Patent
Yamamoto et al.

(10) Patent No.: US 7,771,912 B2
(45) Date of Patent: *Aug. 10, 2010

(54) POSITIVE RESIST COMPOSITION AND PATTERN FORMING METHOD USING THE SAME

(75) Inventors: Kei Yamamoto, Shizuoka (JP); Shinichi Kanna, Shizuoka (JP); Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 370 days.

This patent is subject to a terminal disclaimer.

(21) Appl. No.: 11/636,517

(22) Filed: Dec. 11, 2006

(65) Prior Publication Data

US 2007/0134589 A1   Jun. 14, 2007

(30) Foreign Application Priority Data

Dec. 9, 2005   (JP)   ............................. 2005-356719
Mar. 17, 2006   (JP)   ............................. 2006-075070
Sep. 22, 2006   (JP)   ............................. 2006-257553

(51) Int. Cl.
G03F 7/039   (2006.01)
G03F 7/20   (2006.01)
G03F 7/30   (2006.01)

(52) U.S. Cl. .................... 430/270.1; 430/326; 430/907; 430/910; 430/921

(58) Field of Classification Search ........................ None
See application file for complete search history.

(56) References Cited

U.S. PATENT DOCUMENTS

| 2004/0224254 A1* | 11/2004 | Carey et al. | .............. 430/270.1 |
| 2005/0069819 A1 | 3/2005 | Shiobara | |
| 2005/0233254 A1* | 10/2005 | Hatakeyama et al. | ....... 430/311 |
| 2006/0246373 A1 | 11/2006 | Wang | |

FOREIGN PATENT DOCUMENTS

| JP | 57-153433 A | 9/1982 |
| JP | 2002-303978 A | 10/2002 |
| WO | WO 2004-068242 A1 | 8/2004 |
| WO | WO 2005-003198 A1 | 1/2005 |

OTHER PUBLICATIONS

B.J. Lin "Semiconductor Foundry, Lithography and Partners" Micropatterning Division, TSMC, Inc., Proceedings of SPIE vol. 4688 (2002) pp. 11-24.

J.A. Hoffnagle, et al. "Liquid Immersion Deep-Ultraviolet Interferometric Lithography" 1999 American Vacuum Society, pp. 3306-3309.

* cited by examiner

*Primary Examiner*—Sin J. Lee
(74) *Attorney, Agent, or Firm*—Sughrue Mion, PLLC

(57) ABSTRACT

A positive resist composition comprises: (A) a resin of which solubility in an alkali developer increases under the action of an acid, (B) a compound capable of generating an acid upon irradiation with actinic rays or radiation, (C) a resin having at least one repeating unit selected from fluorine atom-containing repeating units represented by the following formulae (1-1), (1-2) and (1-3), the resin being stable to an acid and insoluble in an alkali developer, and (D) a solvent:

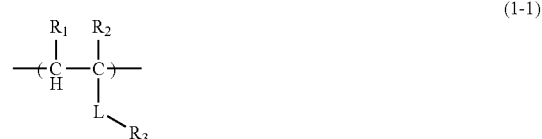

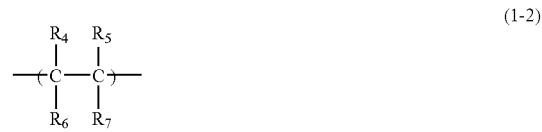

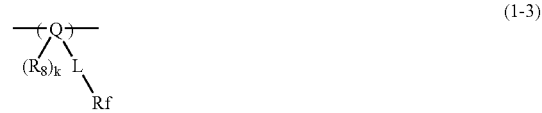

wherein $R_1$ represents a hydrogen atom or an alkyl group; $R_2$ represents a fluoroalkyl group; $R_3$ represents a hydrogen atom or a monovalent organic group; $R_4$ to $R_7$ each independently represents a hydrogen atom, a fluorine atom, an alkyl group, a fluoroalkyl group, an alkoxy group or a fluoroalkoxy group, provided that at least one of $R_4$ to $R_7$ represents a fluorine atom, and $R_4$ and $R_5$, or $R_6$ and $R_7$ may combine to form a ring; $R_8$ represents a hydrogen atom, a fluorine atom or a monovalent organic group; Rf represents a fluorine atom or a fluorine atom-containing monovalent organic group; L represents a single bond or a divalent linking group; Q represents an alicyclic structure; and k represents an integer of 0 to 3.

16 Claims, 1 Drawing Sheet

FIG. 1
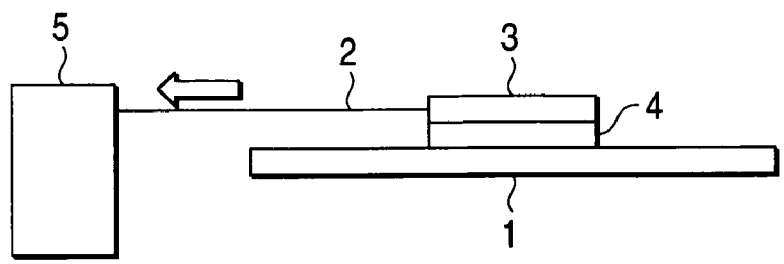
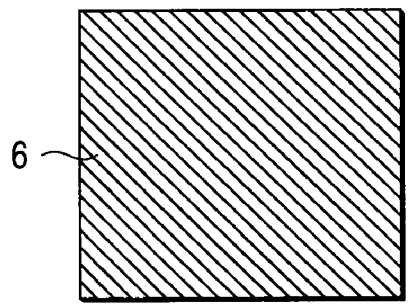
FIG. 2A
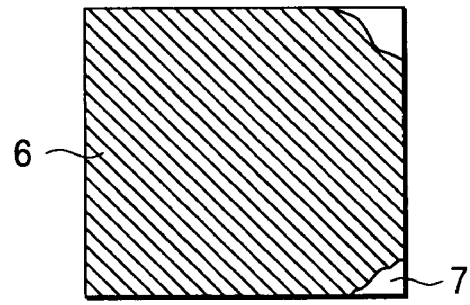
FIG. 2B
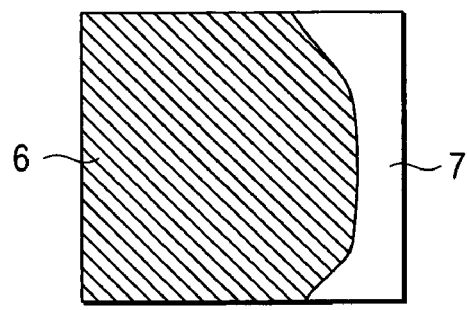
FIG. 2C
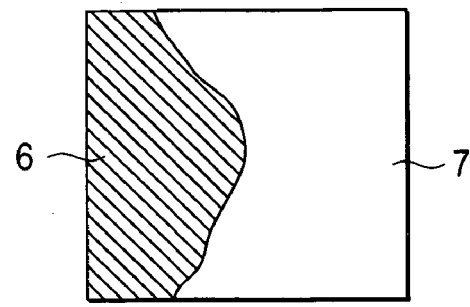
FIG. 2D

POSITIVE RESIST COMPOSITION AND PATTERN FORMING METHOD USING THE SAME

BACKGROUND OF THE INVENTION

1. Field of the Invention

The present invention relates to a positive resist composition for use in the production process of a semiconductor such as IC, in the production of a circuit substrate of liquid crystal, thermal head or the like, and in the lithography process of other photo-applications, and a pattern forming method using the positive resist composition. More specifically, the present invention relates to a positive resist composition suitable for exposure by an immersion-type projection exposure apparatus using a light source of emitting far ultraviolet light at a wavelength of 300 nm or less, and a pattern forming method using the positive resist composition.

2. Description of the Related Art

Along with the miniaturization of semiconductor devices, the trend is moving into shorter wavelength of the exposure light source and higher numerical aperture (high NA) of the projection lens. At present, an exposure machine with NA of 0.84 has been developed, where an ArF excimer laser having a wavelength of 193 nm is used as the light source. As commonly well known, these can be expressed by the following formulae:

(Resolving power)=$k_1 \cdot (\lambda/NA)$ (Focal depth)=$\pm k_2 \cdot \lambda/NA^2$ wherein $\lambda$ is the wavelength of the exposure light source, NA is the numerical aperture of the projection lens, and $k_1$ and $k_2$ are constants related to the process.

In order to realize still shorter wavelength and higher resolving power, studies are being made on an exposure machine where an $F_2$ excimer-laser having a wavelength of 157 nm is used as the light source. However, the lens material used for the exposure apparatus so as to realize shorter wavelength and the material used for the resist are very limited and therefore, it is extremely difficult to stabilize the production cost or quality of the apparatus and materials. This may lead to a failure in procuring the exposure apparatus and the resist each assured of sufficiently high performance and stability within a required time period.

In the related art, a so-called immersion method of filling a high refractive-index liquid (hereinafter sometimes referred to as an "immersion liquid") between the projection lens and the sample has been known as a technique of increasing the resolving power in an optical microscope.

As for the "effect of immersion", assuming that the wavelength of exposure light in air is $\lambda_0$, the refractive index of the immersion liquid to air is n, the convergence half-angle of beam is $\theta$ and $NA_0$=sin $\theta$, the above-described resolving power and focal depth when immersed can be expressed by the following formulae:

(Resolving power)=$k_1 \cdot (\lambda_0/n)/NA_0$ (Focal depth)=$\pm k_2 \cdot (\lambda_0/n)/NA_0^2$ That is, the effect of immersion is equal to use of an exposure wavelength of 1/n. In other words, in the case of a projection optical system with the same NA, the focal depth can be made n times larger by the immersion. This is effective for all pattern profiles and can be combined with super-resolution techniques such as phase-shift method and modified illumination method which are being studied at present.

Examples of the apparatus where this effect is applied to the transfer of a fine image pattern of a semiconductor device are described in JP-A-57-153433.

Recent progress of the immersion exposure technique is reported, for example, in *SPIE Proc.*, 4688, 11 (2002), *J. Vac. Sci. Tecnol. B.* 17 (1999) and *SPIE Proc.*, 3999, 2 (2000). In the case of using an ArF excimer laser as the light source, in view of safety on handling as well as transmittance and refractive index at 193 nm, pure water (refractive index at 193 nm: 1.44) is considered to be a most promising immersion liquid. In the case of using an $F_2$ excimer laser as the light source, a fluorine-containing solution is being studied in the light of balance between transmittance and refractive index at 157 nm, but those satisfied in view of environmental safety or refractive index have been not yet found out. Considering the degree of immersion effect and the maturity of resist, the immersion exposure technique is expected to be most soon mounted on an ArF exposure machine.

Since the discovery of a resist for a KrF excimer laser (248 nm), an image forming method called chemical amplification is used as the image forming method for a resist so as to compensate the reduction in the sensitivity due to light absorption. The image forming method, for example, using positive chemical amplification is an image forming method where an acid generator in the exposed area decomposes upon exposure to generate an acid, the acid generated is used as a reaction catalyst in the baking after exposure (PEB: post exposure bake) to convert the alkali-insoluble group into an alkali-soluble group, and the exposed area is removed by an alkali developer. As for the chemical amplification-type resist composition, a resist composition having mixed therein two or more kinds of resins each having a specific structure is introduced, for example, in International Publication No. WO 2005/003198 and JP-A-2002-303978. An ArF excimer laser resist using this chemical amplification mechanism is predominating at present, but rectangularity of the fine pattern profile after development is not satisfied and improvement is demanded.

Also, it is pointed out that when the chemical amplification-type resist is applied to immersion exposure, the resist layer comes into contact with the immersion liquid at the exposure, as a result, the resist layer deteriorates or a component adversely affecting the immersion liquid bleeds out from the resist layer. International Publication No. WO 2004-068242 describes a case where when the resist for ArF exposure is dipped in water before and after exposure, the resist performance is changed, and this is indicated as a problem in the immersion exposure.

Furthermore, in the immersion exposure process, when the exposure is performed by using a scanning-type immersion exposure machine, unless the immersion liquid moves following the movement of lens, the exposure speed decreases and this may affect the productivity. In the case where the immersion liquid is water, the resist film is preferably hydrophobic and ensures good followability of water.

SUMMARY OF THE INVENTION

Taking into account these problems in the related-art techniques, an object of the present invention is to provide a positive resist composition improved in the pattern profile at normal exposure and immersion exposure and assured of good followability of water at immersion exposure, and a pattern forming method using the positive resist composition.

The present invention is as follows.

(1) A positive resist composition comprising:
(A) a resin of which solubility in an alkali developer increases under the action of an acid,
(B) a compound capable of generating an acid upon irradiation with actinic rays or radiation,
(C) a resin having at least one repeating unit selected from fluorine atom-containing repeating units represented by the following formulae (1-1), (1-2) and (1-3), the resin being stable to an acid and insoluble in an alkali developer, and
(D) a solvent:

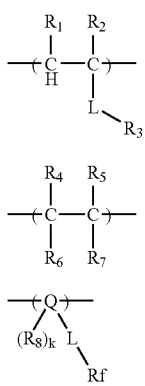

(1-1)

(1-2)

(1-3)

wherein $R_1$ represents a hydrogen atom or an alkyl group;
$R_2$ represents a fluoroalkyl group;
$R_3$ represents a hydrogen atom or a monovalent organic group;
$R_4$ to $R_7$ each independently represents a hydrogen atom, a fluorine atom, an alkyl group, a fluoroalkyl group, an alkoxy group or a fluoroalkoxy group, provided that at least one of $R_4$ to $R_7$ represents a fluorine atom, and $R_4$ and $R_5$, or $R_6$ and $R_7$ may combine to form a ring;
$R_8$ represents a hydrogen atom, a fluorine atom or a monovalent organic group;
Rf represents a fluorine atom or a fluorine atom-containing monovalent organic group;
L represents a single bond or a divalent linking group;
Q represents an alicyclic structure; and
k represents an integer of 0 to 3.

(2) The positive resist composition as described in (1), wherein the resin as the component (A) has a monocyclic or polycyclic alicyclic hydrocarbon structure.

(3) The positive resist composition as described in (1) or (2), wherein the resin as the component (A) has (A1) a repeating unit having a lactone structure and a cyano group.

(4) The positive resist composition as described in (3), wherein the (A1) repeating unit having a lactone structure and a cyano group has a structure represented by the following formula (A2):

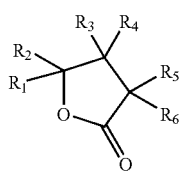

(A2)

wherein $R_1$ to $R_6$ each independently represents a single bond, a hydrogen atom or a substituent, and at least two members out of $R_1$ to $R_6$ may combine with each other to form a ring structure, provided at least one of $R_1$ to $R_6$ represents a cyano group or a substituent having a cyano group.

(5) The positive resist composition as described in (3), wherein the (A1) repeating unit having a lactone structure and a cyano group has a structure represented by the following formula (A6):

(A6)

wherein $R_{18}$ represents a single bond, a hydrogen atom or a substituent;
$L_1$ represents a linking group for linking the carbon atom at the 2-position of the lactone ring and the oxygen atom of the lactone to form a lactone ring structure; and
$R_{18}$ and $L_1$ may combine with each other to form a ring structure.

(6) The positive resist composition as described in any one of (1) to (5), wherein formula (1-1) is represented by the following formula (2-1):

(2-1)

wherein $R_1$ represents a hydrogen atom or an alkyl group, and
$R_3$ represents a hydrogen atom or a monovalent organic group.

(7) The positive resist composition as described in any one of (1) to (6), wherein formula (1-3) is represented by the following formula (3-1):

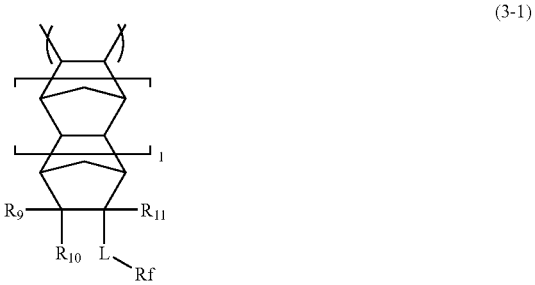

(3-1)

wherein $R_9$, $R_{10}$ and $R_{11}$ each independently represents a hydrogen atom, a fluorine atom or a monovalent organic group, Rf represents a fluorine atom or a fluorine atom-containing monovalent organic group, L represents a single bond or a divalent linking group, and l represents 0 or 1.

(8) The positive resist composition as described in any one of (1) to (7), which further comprises (E) a basic compound.

(9) The positive resist composition as described in any one of (1) to (8), which further comprises (F) a surfactant.

(10) A pattern forming method comprising steps of forming a resist film from the positive resist composition described in any one of (1) to (9), and exposing and developing the resist film.

(11) The pattern forming method as described in (10), wherein the resist film is exposed through an immersion liquid.

Furthermore, preferred embodiments of the present invention are set forth below.

(12) The positive resist composition as described in any one of (1) to (9), wherein the resin as the component (A) contains a repeating unit represented by the following formula (R1), a repeating unit represented by the following formula (R2) and a repeating unit represented by the following formula (R3):

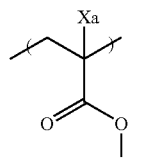
(R1)

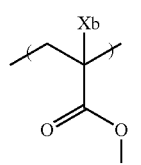
(R2)

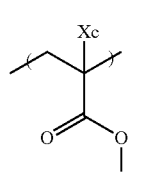
(R3)

wherein Xa, Xb and Xc each independently represents a hydrogen atom or a methyl group, $R_{1a}$ represents a group having a lactone structure, $R_{2a}$ represents a monovalent organic group substituted by a hydroxyl group or a cyano group, and $R_{3a}$ represents a group which desorbs under the action of an acid.

(13) The positive resist composition as described in any one of (1) to (9) and (12), wherein the resin as the component (A) has a weight average molecular weight of 5,000 to 10,000 and a dispersity of 1.2 to 3.0.

(14) The positive resist composition as described in any one of (1) to (9), (12) and (13), wherein the amount added of the resin as the component (C) is from 0.1 to 5.0 mass % based on the entire solid content concentration.

(15) The positive resist composition as described in any one of (1) to (9) and (12) to (14), wherein the compound as the component (B) has a triphenylsulfonium cation structure.

(16) The positive resist composition as described in any one of (1) to (9) and (12) to (15), wherein two or more kinds of solvents are contained as the solvent of the component (D) and at least one solvent is propylene glycol monomethyl ether acetate.

(17) The positive resist composition as described in any one of (1) to (9) and (12) to (16), wherein the solid content concentration is from 3.0 to 10.0 mass %.

(18) The positive resist composition as described in any one of (1) to (9) and (12) to (17), wherein formula (1-1) is represented by the following formula (2-2) or (2-3):

(2-2)

(2-3)

wherein $R_1$ represents a hydrogen atom or an alkyl group, and $R_3$ represents a hydrogen atom or a monovalent organic group.

(19) The positive resist composition as described in any one of (1) to (9) and (12) to (18), wherein formula (1-3) is represented by the following formula (3-2):

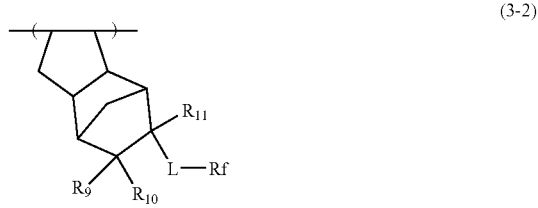
(3-2)

wherein $R_9$, $R_{10}$ and $R_{11}$ each represents a hydrogen atom, a fluorine atom or a monovalent organic group, Rf represents a fluorine atom or a fluorine atom-containing monovalent organic group, and L represents a single bond or a divalent linking group.

BRIEF DESCRIPTION OF THE DRAWINGS

FIG. 1 is a schematic view showing a state where followability of water to the quartz plate is evaluated; and FIGS. 2A to 2D are schematic views showing followability of water for the quartz plate.

1 denotes a positive resist composition-coated wafer; 2 denotes a kite string; 3 denotes a quartz plate; 4 denotes a distilled water; 5 denotes a motor; 6 denotes a region where distilled water remains under the quartz plate; and 7 denotes a region where air enters below the quartz plate

DETAILED DESCRIPTION OF THE INVENTION

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Resin of Which Solubility in an Alkali Developer Increases Under the Action of an Acid The resin of which solubility in an alkali developer increases under the action of an acid, for use in the positive resist composition of the present invention, is a resin having a group capable of decomposing under the action of an acid (hereinafter sometimes referred to as an "acid-decomposable group") in the main or side chain or both the main and side chains of the resin. Of these resins, a resin having in the side chain a group capable of decomposing under the action of an acid is preferred.

The group capable of decomposing under the action of an acid is preferably a group where a hydrogen atom of —COOH group or —OH group is substituted by a group which desorbs under the action of an acid.

Examples of the group which desorbs under the action of an acid include —C($R_{36}$)($R_{37}$)($R_{38}$), —C($R_{36}$)($R_{37}$)(O$R_{39}$) and —C($R_{01}$)($R_{02}$)(O$R_{39}$). In the formulae, $R_{36}$ to $R_{39}$ each independently represents an alkyl group, a cycloalkyl group, an aryl group, an aralkyl group or an alkenyl group, and $R_{36}$ and $R_{37}$, or $R_{36}$ and $R_{39}$ may combine with each other to form a ring. $R_{01}$ and $R_{02}$ each independently represents a hydrogen atom, an alkyl group, a cycloalkyl group, an aryl group, an aralkyl group or an alkenyl group.

In the present invention, the acid-decomposable group is preferably an acetal group or a tertiary ester group.

The repeating unit having an acid-decomposable group is preferably a repeating unit represented by the following formula ($R_3$):

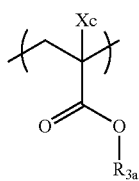

(R3)

In formulae ($R_3$), Xc represents a hydrogen atom or a methyl group.

$R_{3a}$ represents a group which desorbs under the action of an acid.

The methyl group of Xc in formula (R3) may be substituted by a halogen atom (preferably a fluorine atom), a hydroxyl group or the like.

Specific examples of the repeating unit represented by formula (R3) are the same as specific examples of the repeating unit represented by formula (pA) which is described later.

In the case of irradiating ArF excimer laser light on the positive resist composition of the present invention, the resin as the component (A) is preferably a resin having a monocyclic or polycyclic alicyclic hydrocarbon structure and being capable of increasing the solubility in an alkali developer under the action of an acid.

The resin having a monocyclic or polycyclic alicyclic hydrocarbon structure and being capable of increasing the solubility in an alkali developer under the action of an acid (hereinafter sometimes referred to as an "alicyclic hydrocarbon-based acid-decomposable resin") is preferably a resin containing at least one repeating unit selected from the group consisting of a repeating unit having an alicyclic hydrocarbon-containing partial structure represented by any one of the following formulae (pI) to (pV), and a repeating unit represented by the following formula (II-AB).

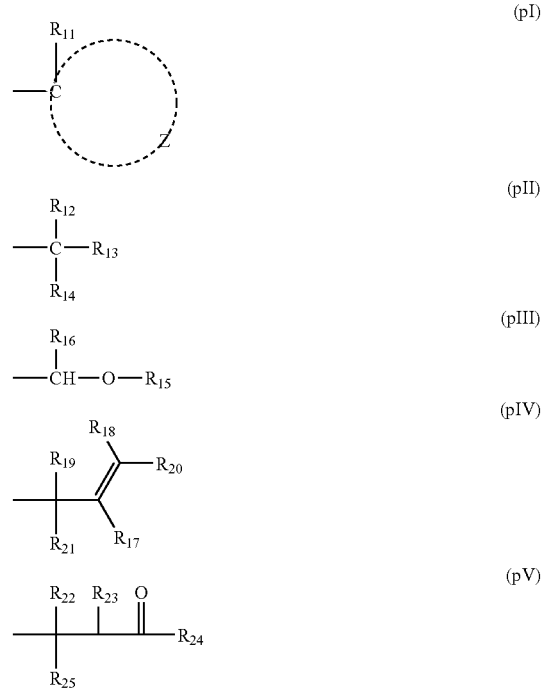

In formulae (pI) to (pV), $R_{11}$ represents a methyl group, an ethyl group, an n-propyl group, an isopropyl group, an n-butyl group, an isobutyl group or a sec-butyl group.

Z represents an atomic group necessary for forming a cycloalkyl group together with the carbon atom.

$R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

$R_{17}$ to $R_{21}$ each independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

$R_{22}$ to $R_{25}$ each independently represents a hydrogen atom, a linear or branched alkyl group having a carbon number of 1 to 4 or a cycloalkyl group, provided that at least one of $R_{22}$ to $R_{25}$ represents a cycloalkyl group, and $R_{23}$ and $R_{24}$ may combine with each other to form a ring.

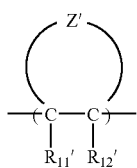

(II-AB)

In formula (II-AB), $R_{11}'$ and $R_{12}'$ each independently represents a hydrogen atom, a cyano group, a halogen atom or an alkyl group.

Z' represents an atomic group for forming an alicyclic structure containing two bonded carbon atoms (C—C).

Formula (II-AB) is preferably the following formula (II-AB1) or (II-AB2):

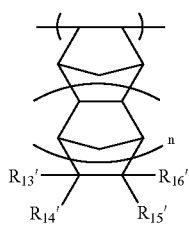

(II-AB1)

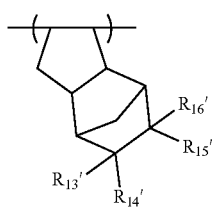

(II-AB2)

In formulae (II-AB1) and (II-AB2), $R_{13}'$ to $R_{16}'$ each independently represents a hydrogen atom, a halogen atom, a cyano group, a hydroxyl group, —COOH, —COOR$_5$, a group capable of decomposing under the action of an acid, —C(═O)—X—A'—R$_{17}'$, an alkyl group or a cycloalkyl group, and at least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH— R$_6$, —CO—NH—SO$_2$—R$_6$ or a group having a lactone structure.

$R_6$ represents an alkyl group or a cycloalkyl group.

n represents 0 or 1.

In formulae (pI) to (pV), the alkyl group of $R_{12}$ to $R_{25}$ indicates a linear or branched alkyl group having a carbon number of 1 to 4, and examples thereof include a methyl group, an ethyl group, a propyl group, an n-butyl group, a sec-butyl group and a tert-butyl group.

The cycloalkyl group of $R_{12}$ to $R_{25}$ and the cycloalkyl group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

These alkyl and cycloalkyl groups each may further have a substituent. Examples of the substituent which these alkyl and cycloalkyl groups each may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). These alkyl, alkoxy and alkoxycarbonyl groups and the like each may further have a substituent. Examples of the substituent which these alkyl, alkoxy and alkoxycarbonyl groups and the like may further have include a hydroxyl group, a halogen atom and an alkoxy group.

The structures represented by formulae (pI) to (pV) each can be used for the protection of an alkali-soluble group in the resin. Examples of the alkali-soluble group include various groups known in this technical field.

Specific examples thereof include a structure where the hydrogen atom of a carboxylic acid group, a sulfonic acid group, a phenol group or a thiol group is substituted by the structure represented by any one of formulae (pI) to (pV). Among these, preferred is a structure where the hydrogen atom of a carboxylic acid group or a sulfonic acid group is substituted by the structure represented by any one of formulae (pI) to (pV).

The repeating unit having an alkali-soluble group protected by the structure represented by any one of formulae (pI) to (pV) is preferably a repeating unit represented by the following formula (pA):

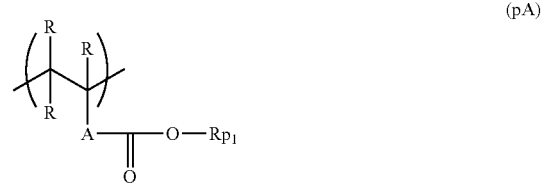

(pA)

In formula (pA), R represents a hydrogen atom, a halogen atom or a linear or branched alkyl group having a carbon number of 1 to 4, and a plurality of R's may be the same or different.

A represents a single bond, a sole group selected from the group consisting of an alkylene group, an ether group, a thioether group, a carbonyl group, an ester group, an amido group, a sulfonamido group, a urethane group and a urea group, or a combination of two or more groups selected therefrom. A is preferably a single bond.

Rp$_1$ represents any one group of formulae (pI) to (pV).

The repeating unit represented by formula (pA) is preferably a repeating unit comprising a 2-alkyl-2-adamantyl (meth)acrylate or a dialkyl(1-adamantyl)methyl(meth)acrylate.

Specific examples of the repeating unit represented by formula (pA) are set forth below.

(In the formulae, Rx represents H, CH₃, CF₃ or CH₂OH, and Rxa and Rxa each represents an alkyl group having a carbon number of 1 to 4.)
1
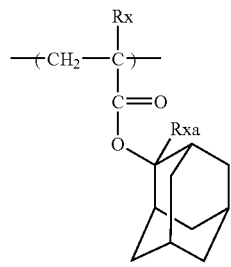
2
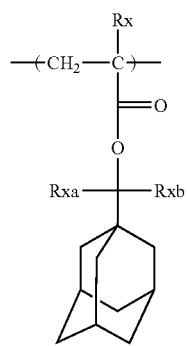
3
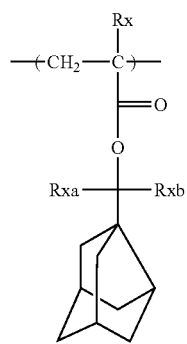
4
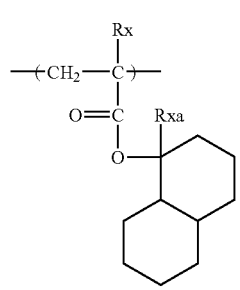
5
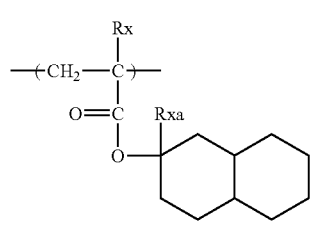
-continued
6
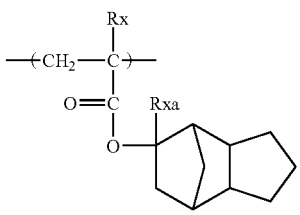
7
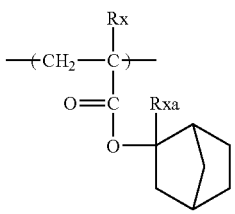
8
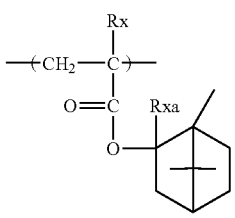
9
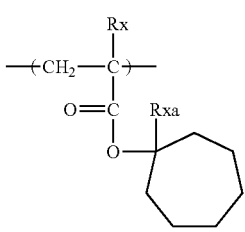
10
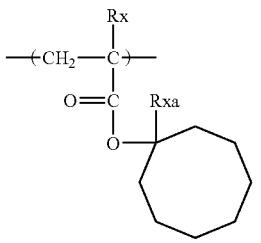
11
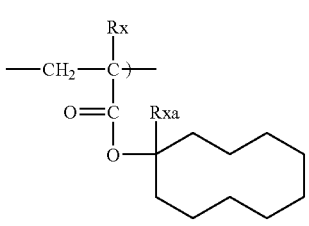
12
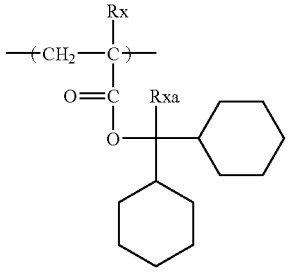

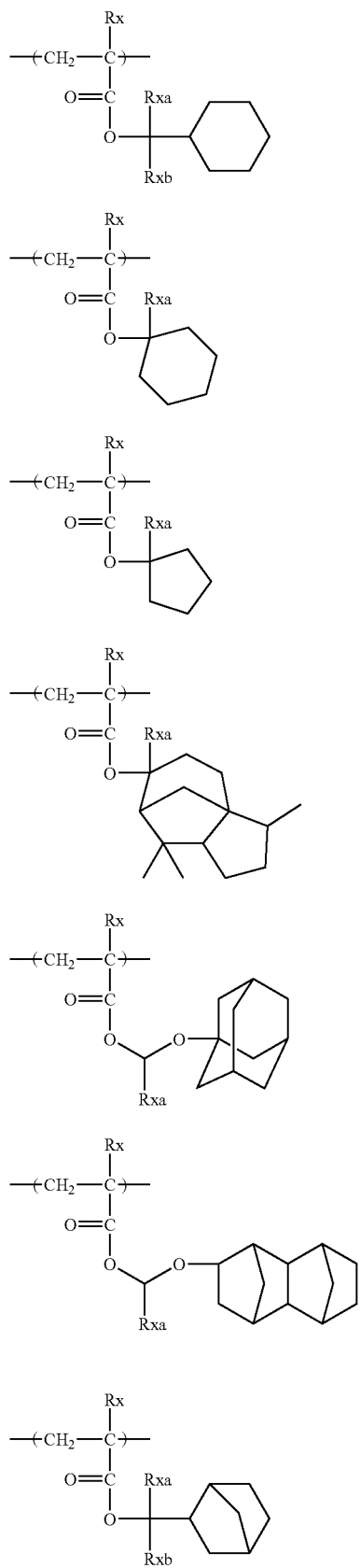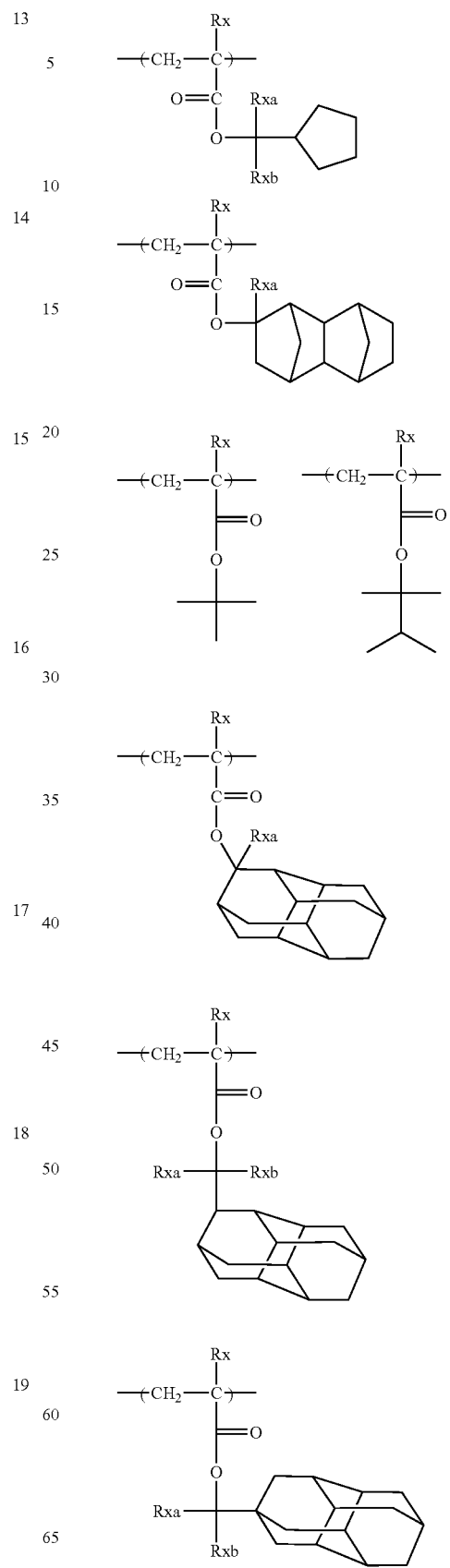

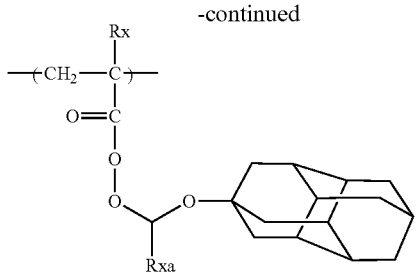

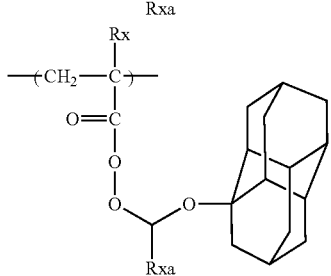

Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$ is preferably a linear or branched alkyl group having a carbon number of 1 to 10, and examples thereof include a methyl group, an ethyl group, an n-propyl group, an isopropyl group, and a linear or branched butyl, pentyl, hexyl or heptyl group.

The atomic group of Z' for forming an alicyclic structure is an atomic group for forming, in the resin, an alicyclic hydrocarbon repeating unit which may have a substituent. In particular, an atomic group for forming a crosslinked alicyclic structure to form a crosslinked alicyclic hydrocarbon repeating unit is preferred.

Examples of the skeleton of the alicyclic hydrocarbon formed are the same as those of the cycloalkyl group of $R_{12}$ to $R_{25}$ in formulae (pI) to (pVI).

The alicyclic hydrocarbon skeleton may have a substituent, and examples of the substituent include $R_{13}'$ to $R_{16}'$ in formulae (II-AB1) and (II-AB2).

In the alicyclic hydrocarbon-based acid-decomposable resin for use in the present invention, the group capable of decomposing under the action of an acid may be contained in at least one repeating unit out of the repeating unit having an alicyclic hydrocarbon-containing partial structure represented by any one of formulae (pI) to (pV), the repeating unit represented by formula (II-AB), and the repeating unit comprising a copolymerization component described later.

Various substituents $R_{13}'$ to $R_{16}'$ in formulae (II-AB1) and (II-AB2) may work out to a substituent of an atomic group for forming an alicyclic structure in formula (II-AB) or an atomic group Z for forming a crosslinked alicyclic structure.

Specific examples of the repeating units represented by formulae (II-AB1) and (II-AB2) are set forth below, but the present invention is not limited thereto.

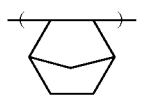

[II-1]

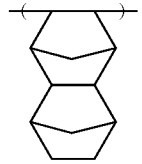

[II-2]

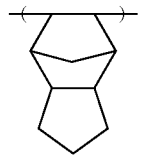

[II-3]

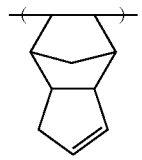

[II-4]

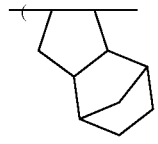

[II-5]

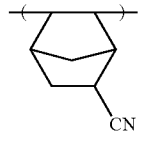

[II-6]

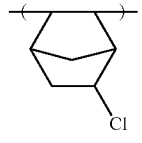

[II-7]

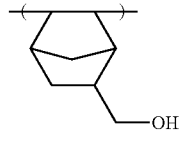

[II-8]

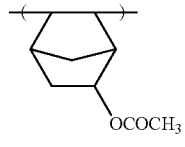

[II-9]

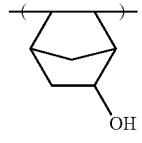

[II-10]

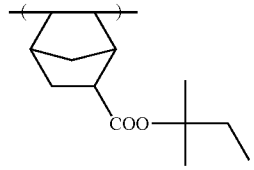

[II-11]

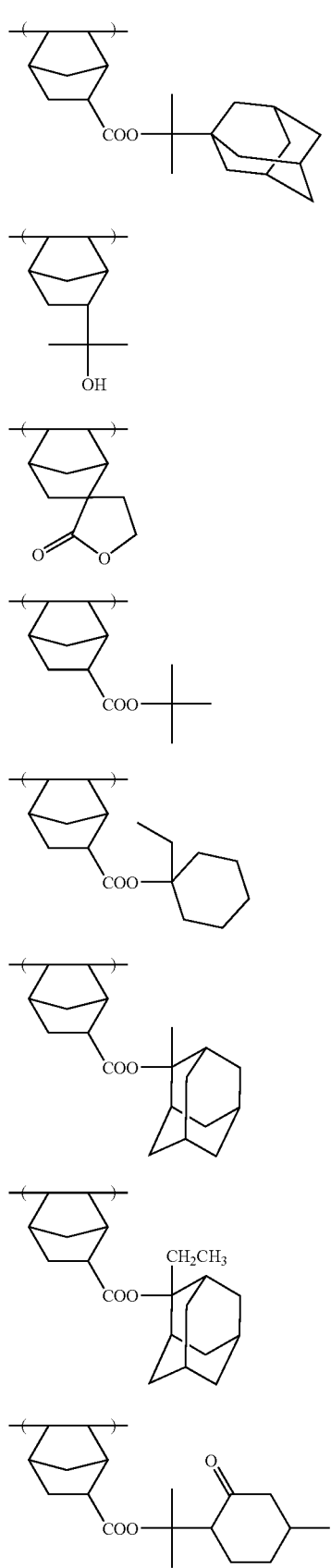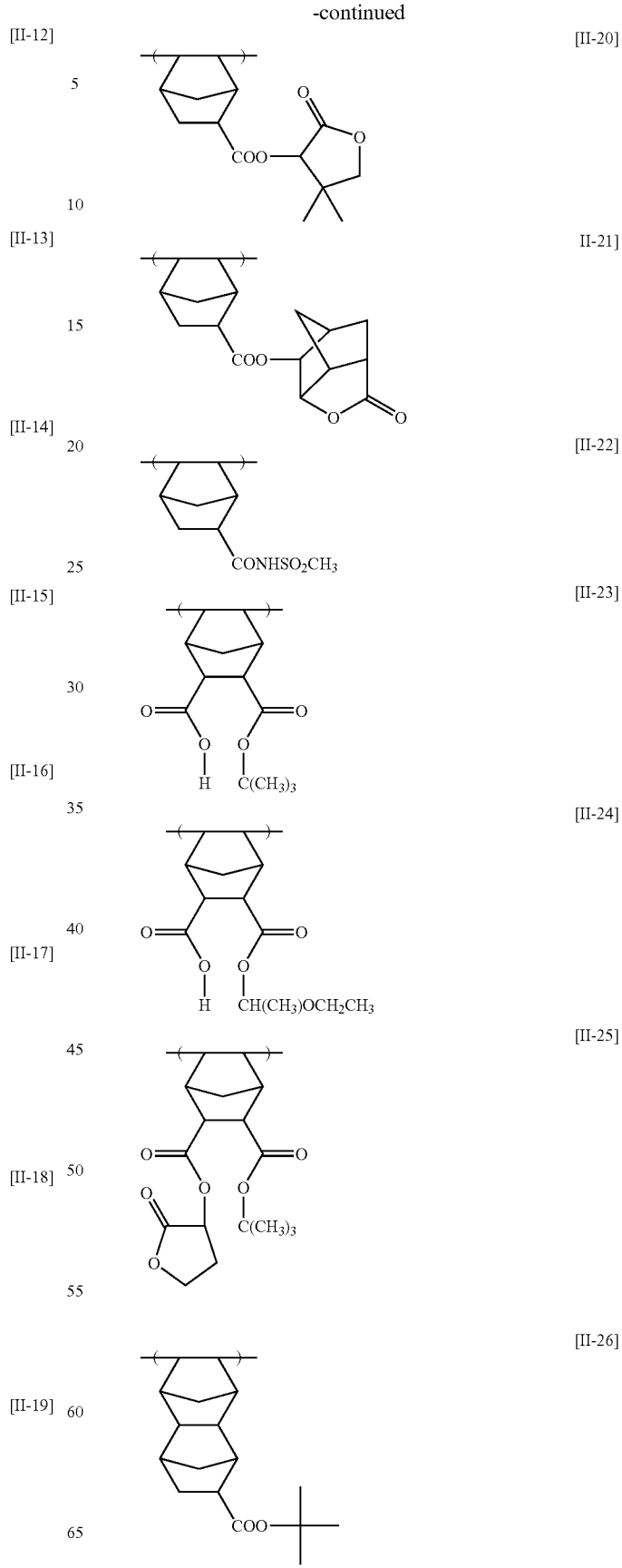

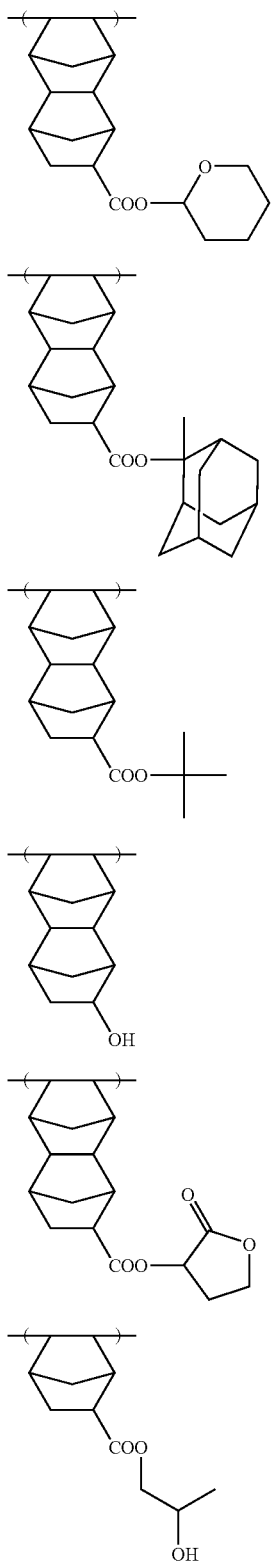

The alicyclic hydrocarbon-based acid-decomposable resin for use in the present invention preferably has a lactone group. As for the lactone group, any group may be used as long as it has a lactone structure, but a group having a 5- to 7-membered ring lactone structure is preferred. The 5- to 7-membered ring lactone structure is preferably condensed with another ring structure in the form of forming a bicyclo or spiro structure. It is more preferred that a repeating unit containing a group having a lactone structure represented by any one of the following formulae (LC1-1) to (LC1-16) is contained. The group having a lactone structure may be bonded directly to the main chain. Among these lactone structures, preferred are (LC1-1), (LC1-4), (LC1-5), (LC1-6), (LC1-13) and (LC1-14). By virtue of using a specific lactone structure, the line edge roughness and development defect are improved.

-continued

LCl-8
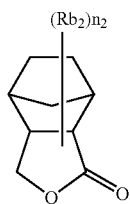

LCl-9
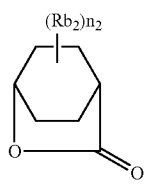

LCl-10
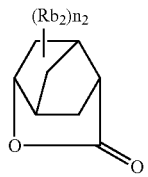

LCl-11
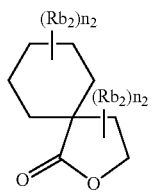

LCl-12
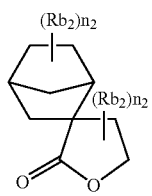

LCl-13
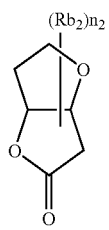

LCl-14
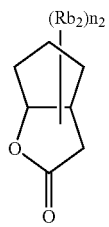

LCl-15
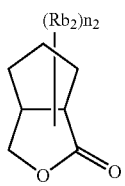

-continued

LCl-16
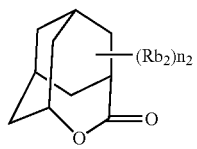

The lactone structure moiety may or may not have a substituent ($Rb_2$). Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. $n_2$ represents an integer of 0 to 4. When $n_2$ is an integer of 2 or more, the plurality of $Rb_2$'s may be the same or different and also, the plurality of $Rb_2$'s may combine with each other to form a ring.

Examples of the repeating unit having a lactone structure represented by any one of formulae (LC1-1) to (LC1-16) include a repeating unit where at least one of $R_{13}'$ to $R_{16}'$ in formula (II-AB1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

(AI)
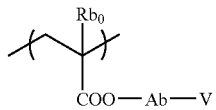

In formula (AI), $Rb_0$ represents a hydrogen atom, a halogen atom or an alkyl group having a carbon number of 1 to 4.

Examples of the alkyl group of $Rb_0$ include a methyl group, an ethyl group, a propyl group, an n-butyl group, a sec-butyl group and a tert-butyl group. The alkyl group of $Rb_0$ may have a substituent. Preferred examples of the substituent which the alkyl group of $Rb_0$ may have include a hydroxyl group and a halogen atom.

Examples of the halogen atom of $Rb_0$ include a fluorine atom, a chlorine atom, a bromine atom and an iodine atom. $Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, preferably a single bond or a linking group represented by -$Ab_1$-$CO_2$—.

$Ab_1$ is a linear or branched alkylene group or a monocyclic or polycyclic cycloalkylene group, preferably a methylene group, an ethylene group, a cyclohexyl residue, an adamantyl residue or a norbornyl residue.

V represents a group having a lactone structure represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

The repeating unit having a lactone structure is preferably a repeating unit represented by the following formula (R1):

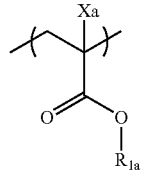
(RI)

In formula (R1), Xa represents a hydrogen atom or a methyl group.

$R_{1a}$ represents a group having a lactone structure.

The methyl group of Xa in formula (R1) may be substituted by a halogen atom (preferably a fluorine atom), a hydroxyl group or the like.

Examples of the lactone structure-containing group of $R_{1a}$ include a group formed by removing one hydrogen atom bonded to the carbon atom from the lactone structure represented by any one of formulae (LC1-1) to (LC1-16).

Specific examples of the repeating unit having a lactone structure are set forth below, but the present invention is not limited thereto.

(In the formulae, Rx is H, $CH_3$, $CH_2OH$ or $CF_3$)

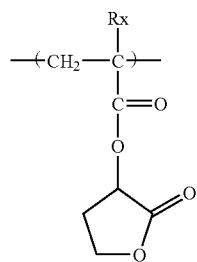
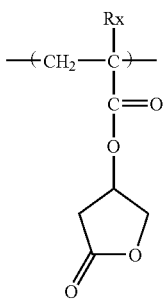
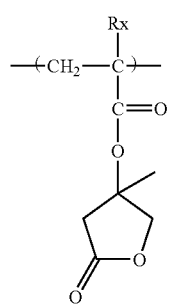
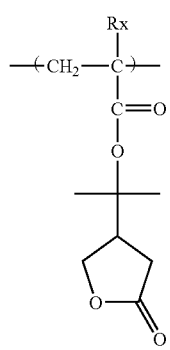
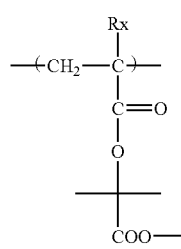
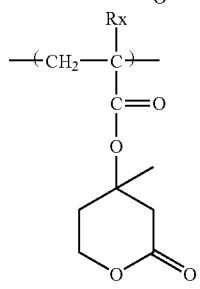

-continued

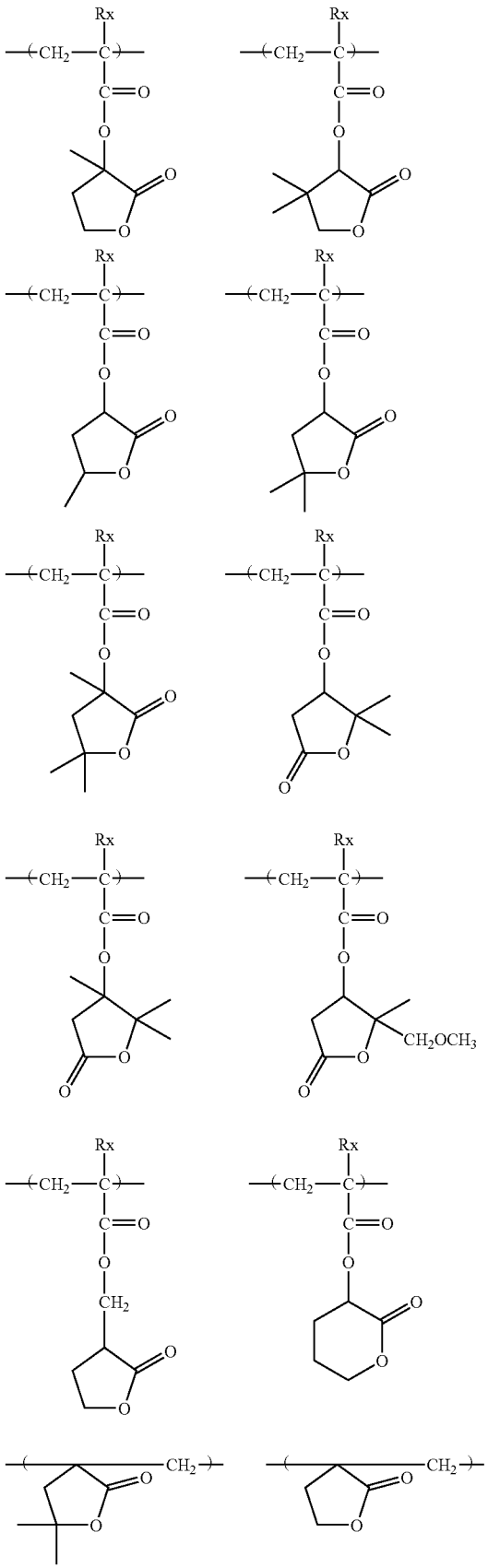

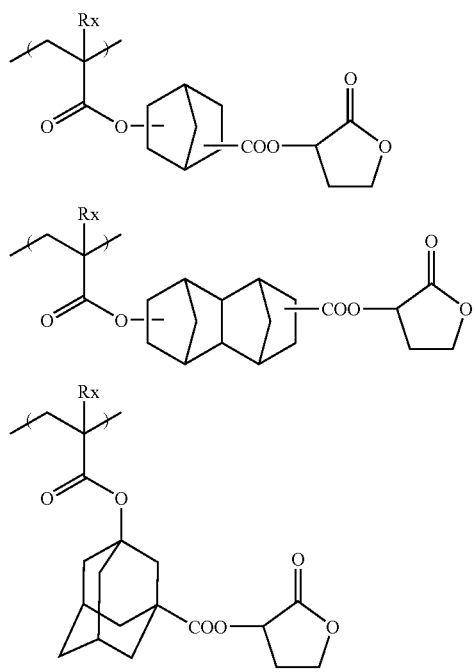
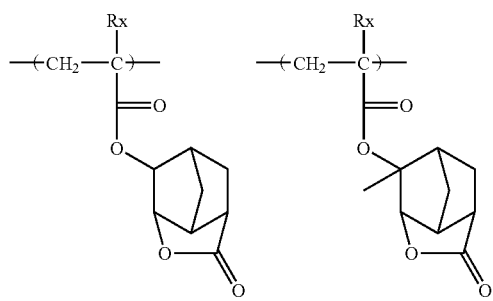
(In the formulae, Rx is H. CH$_3$, CH$_2$OH or CF$_3$.)
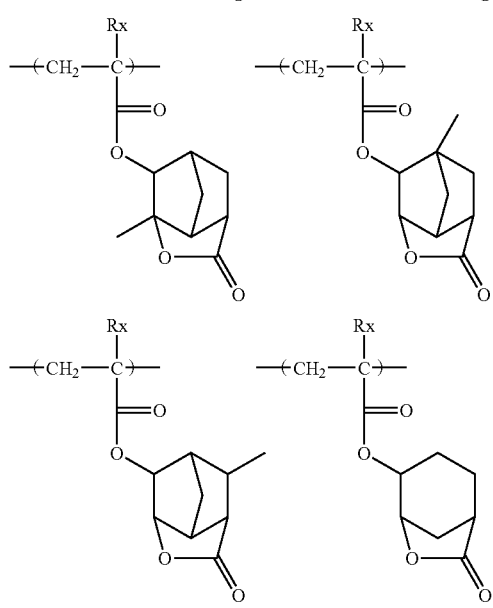
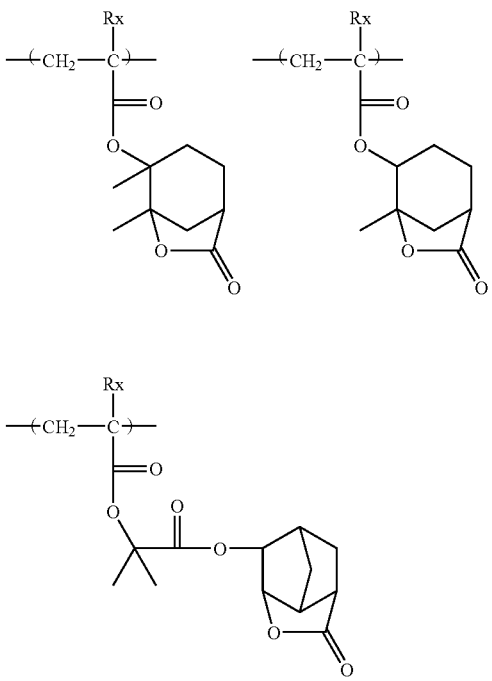
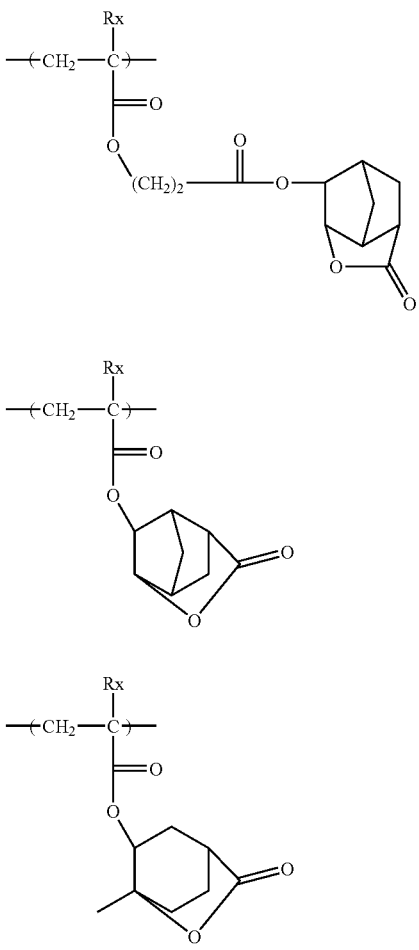

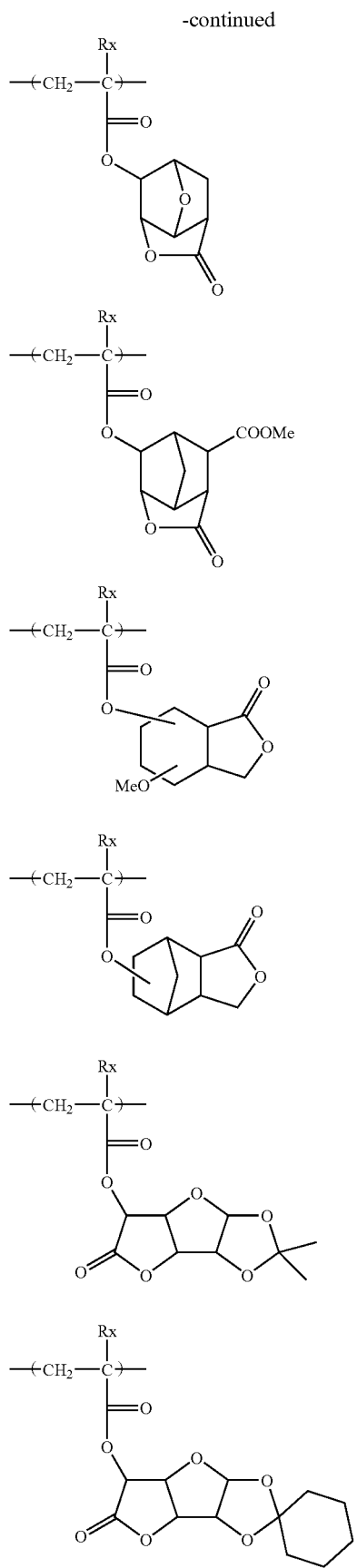
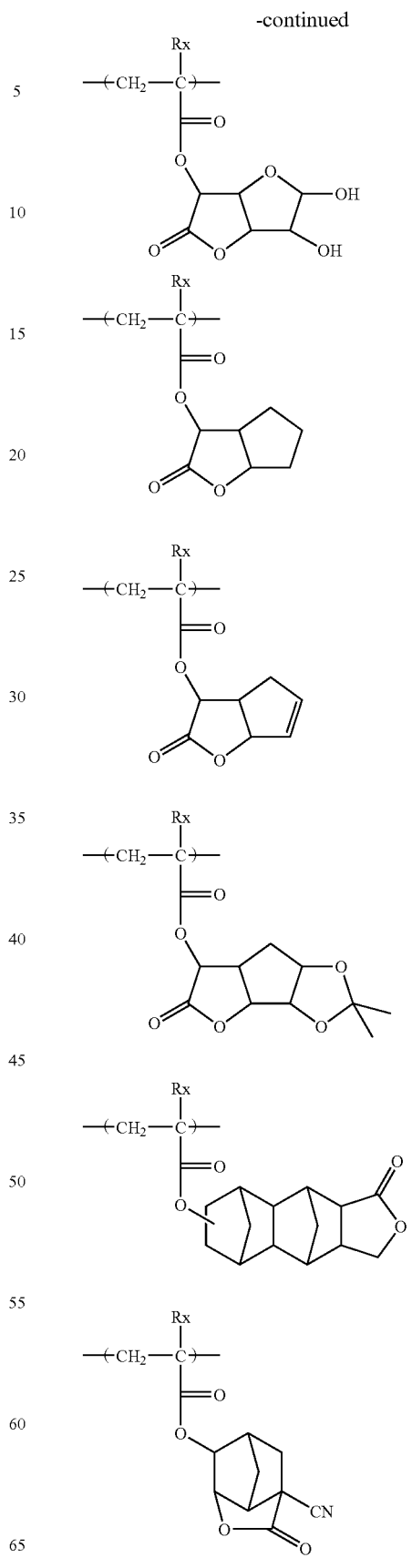

(In the formulae, Rx is H, CH₃, CH₂OH or CF₃.)

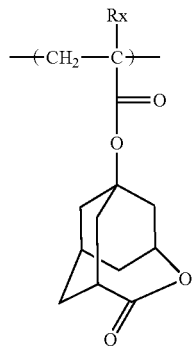
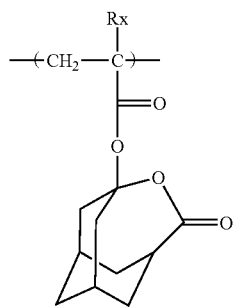
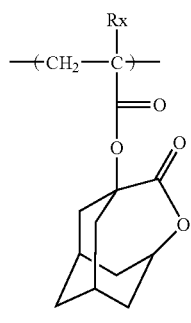
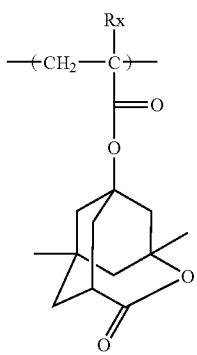
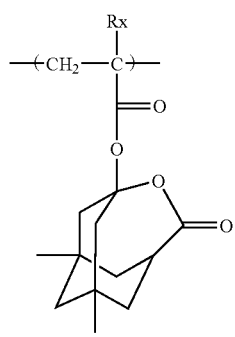
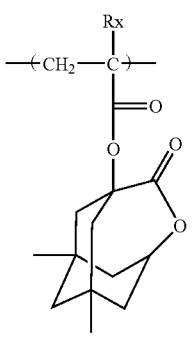
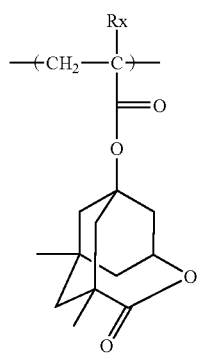
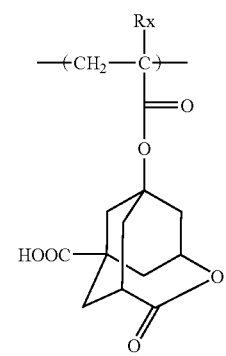

-continued

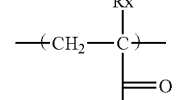
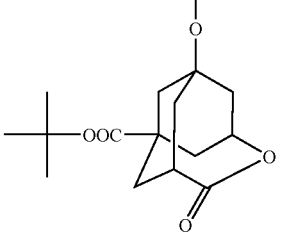
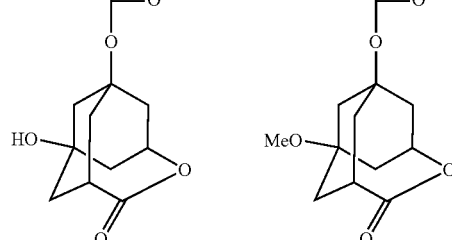
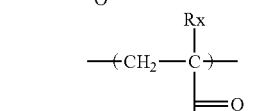
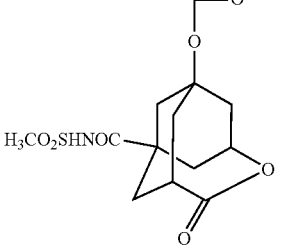

The repeating unit having a lactone structure preferably further has a cyano group.

The (A1) repeating unit having a lactone structure and a cyano group preferably has a structure represented by the following formula (A2):

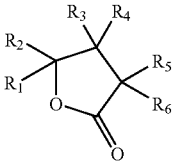

(A2)

In formula (A2), $R_1$ to $R_6$ each independently represents a single bond, a hydrogen atom or a substituent, and at least two members out of $R_1$ to $R_6$ may combine with each other to form a ring structure, provided at least one of $R_1$ to $R_6$ represents a cyano group or a substituent having a cyano group.

The repeating unit having a structure represented by formula (A2) may be sufficient if it has a structure represented by formula (A2) in either the main chain or the side chain of the repeating unit by using, as a bond (single bond), at least one of the portions which can be a hydrogen atom in $R_1$ to $R_6$ (that is, a hydrogen atom as $R_1$ to $R_6$ or a hydrogen atom in the substituent as $R_1$ to $R_6$).

The substituent as $R_1$ to $R_6$ is not particularly limited, and examples thereof include an alkyl group, an alkenyl group, an alkynyl group, a cycloalkyl group, an aryl group, an amino group, an amido group, a ureido group, a urethane group, a hydroxyl group, a carboxyl group, a halogen atom, an alkoxy group, an aryloxy group, an alkylthio group, an arylthio group, an acyl group, an acyloxy group, an alkoxycarbonyl group and a nitro group, in addition to a cyano group. The substituent may further have a substituent. The pairs of $R_1$ and $R_2$, $R_3$ and $R_4$, and $R_5$ and $R_6$ each is substituents on the same carbon atom and may represent a bond to the same atom (for example, carbon atom, oxygen atom, sulfur atom, nitrogen atom) and form a double bond as represented, for example, by C=C, C=O, C=S and C=N bonds. Also, arbitrary two members out of $R_1$ to $R_6$ may bond to the same atom and form a three-membered ring structure or a crosslinked ring structure.

The cyano group-containing substituent as $R_1$ to $R_6$ is not particularly limited and includes those formed by substituting a cyano group to the substituents described above. The carbon number is preferably 12 or less, more preferably 6 or less, excluding the carbon atom of the cyano group.

In particular, the cyano group is preferably bonded directly to the lactone ring.

The (A1) repeating unit having a lactone structure and a cyano group preferably has a structure represented by the following formula (A3):

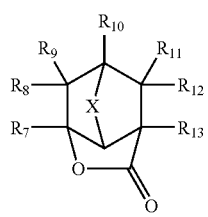

(A3)

In formula (A3), $R_7$ to $R_{13}$ each independently represents a single bond, a hydrogen atom or a substituent, and at least two members out of $R_7$ to $R_{13}$ may combine with each other to form a ring structure.

X represents —O—, —S—, —N($R^N$)$_2$— or —(CH$_2$)$_n$—, $R^N$ represents a hydrogen atom or a substituent having from 1 to 4 carbon atoms, and n represents 1 or 2.

However, at least one of $R_7$ to $R_{13}$ and X represents a cyano group or a group having a cyano group.

The repeating unit having a structure represented by formula (A3) may be sufficient if it has a structure represented by formula (A3) in either the main chain or the side chain of the repeating unit by using, as a bond (single bond), at least one of the portions which can be a hydrogen atom in $R_7$ to $R_{13}$ (that is, a hydrogen atom as $R_7$ to $R_{13}$ or a hydrogen atom in the substituent as $R_7$ to $R_{13}$).

The structure represented by formula (A2) is preferably represented by the following formula (A4):

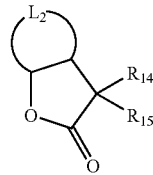

(A4)

In formula (A4), $R_{14}$ and $R_{15}$ each independently represents a single bond, a hydrogen atom or a substituent.

$L_2$ represents a linking group for forming a ring structure. $R_{14}$, $R_{15}$ and $L_2$ may combine with each other to form a ring structure.

However, at least one of $R_{14}$, $R_{15}$ and $L_2$ represents a cyano group or a group having a cyano group.

The repeating unit having a structure represented by formula (A4) may be sufficient if it has a structure represented by formula (A4) in either the main chain or the side chain of the repeating unit by using, as a bond (single bond), at least one of the portions which can be a hydrogen atom in $R_{14}$, $R_{15}$ and $L_2$ (that is, a hydrogen atom as $R_{14}$ and $R_{15}$, a hydrogen atom in the substituent as $R_{14}$ and $R_{15}$, or a hydrogen atom in the linking group as $L_2$).

The structure represented by formula (A2) is preferably represented by the following formula (A5):

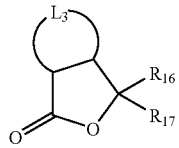

(A5)

In formula (A5), $R_{16}$ and $R_{17}$ each independently represents a single bond, a hydrogen atom or a substituent.

$L_3$ represents a linking group for forming a ring structure. $R_{16}$, $R_{17}$ and $L_3$ may combine with each other to form a ring structure.

However, at least one of $R_{16}$, $R_{17}$ and $L_3$ represents a cyano group or a group having a cyano group.

The repeating unit having a structure represented by formula (A5) may be sufficient if it has a structure represented by formula (A5) in either the main chain or the side chain of the repeating unit by using, as a bond (single bond), at least one of the portions which can be a hydrogen atom in $R_{16}$, $R_{17}$ and $L_3$ (that is, a hydrogen atom as $R_{16}$ and $R_{17}$, a hydrogen atom in the substituent as $R_{16}$ and $R_{17}$, or a hydrogen atom in the linking group as $L_3$).

The (A1) repeating unit having a lactone structure and a cyano group preferably has a structure represented by the following formula (A6):

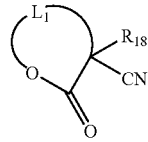

(A6)

In formula (A6), $R_{18}$ represents a single bond, a hydrogen atom or a substituent.

$L_1$ represents a linking group for linking the carbon atom at the 2-position of the lactone ring and the oxygen atom of the lactone to form a lactone ring structure.

$R_{18}$ and $L_1$ may combine with each other to form a ring structure.

The repeating unit having a structure represented by formula (A6) may be sufficient if it has a structure represented by formula (A6) in either the main chain or the side chain of the repeating unit by using, as a bond (single bond), at least one of the portions which can be a hydrogen atom in $R_{18}$ and $L_1$ (that is, a hydrogen atom as $R_{18}$, a hydrogen atom in the substituent as $R_{18}$, or a hydrogen atom in the linking group as $L_1$).

The structure represented by formula (A6) is preferably represented by the following formula (A7):

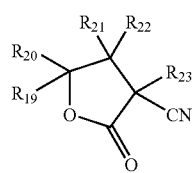

(A7)

In formula (A7), $R_{19}$ to $R_{23}$ each independently represents a single bond, a hydrogen atom or a substituent. At least two members out of $R_{19}$ to $R_{23}$ may combine with each other to form a ring structure.

The repeating unit having a structure represented by formula (A7) may be sufficient if it has a structure represented by formula (A7) in either the main chain or the side chain of the repeating unit by using, as a bond (single bond), at least one of the portions which can be a hydrogen atom in $R_{19}$ to $R_{23}$ (that is, a hydrogen atom as $R_{19}$ to $R_{23}$, a hydrogen atom in the substituent as $R_{19}$ to $R_{23}$, or a hydrogen atom in the substituent as $R_{19}$ to $R_{23}$).

Examples of the repeating unit having a structure represented by any one of formulae (A2) to (A7) include those where a structure represented by any one of formulae (A2) to (A7) is bonded to an arbitrary portion in the skeleton of the following repeating units, that is, those where an arbitrary hydrogen atom in the following repeating units is substituted by using, as a bond (single bond), at least one of the portions which can be a hydrogen atom in the structures represented by formulae (A2) to (A7).

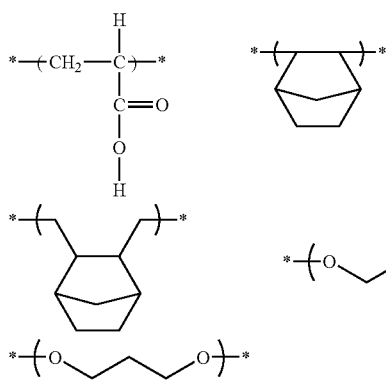

The repeating unit (A1) is preferably a repeating unit derived from an ethylenic double bond, more preferably a repeating unit derived from a (meth)acrylic acid derivative.

The substituents in formulae (A3) to (A7) are the same as those in formula (A2).

The substituents having a cyano group in formulae (A3) to (A7) are the same as those in formula (A2).

Examples of the ring structure formed by combining at least two substituents in formulae (A2) to (A7) with each other include a 5- or 6-membered ring. The ring structure may have a substituent such as cyano group.

Examples of the ring structure formed by each of $L_2$ and $L_3$ in formulae (A4) and (A5) include a norbornane structure. The ring structure may have a substituent such as cyano group.

A more preferred embodiment of the repeating units represented by formulae (M2) to (A7) includes a repeating unit represented by the following formula (A8):

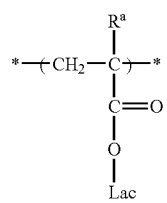

(A8)

In formula (A8), $R^a$ represents a hydrogen atom or an alkyl group having from 1 to 4 carbon atoms, which may have a substituent.

Lac represents a structure represented by any one of formulae (A2) to (A7).

Specific examples of the repeating unit (A1) are set forth below, but the present invention is not limited thereto. In specific examples, the methyl group may be a hydrogen atom.

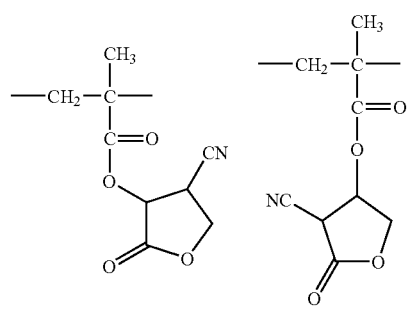

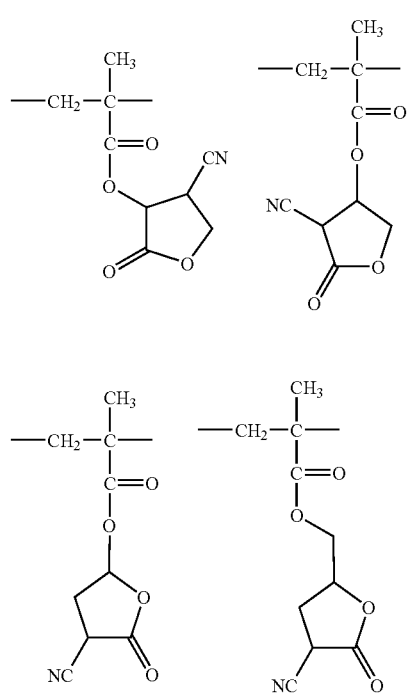

-continued
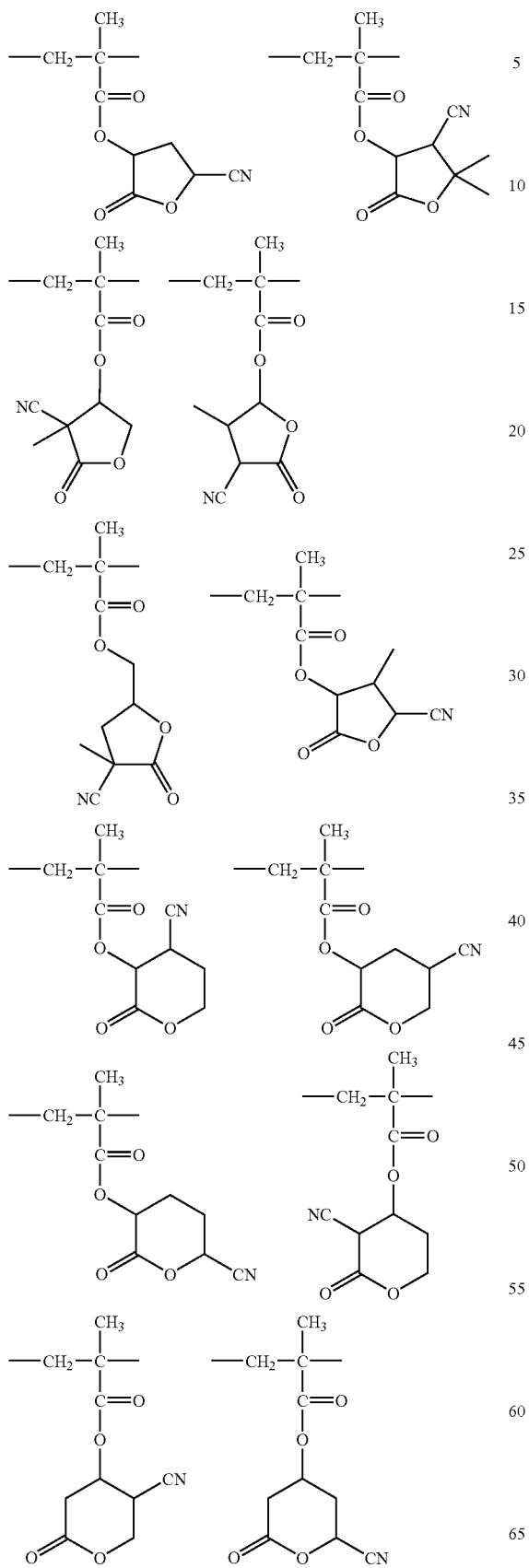
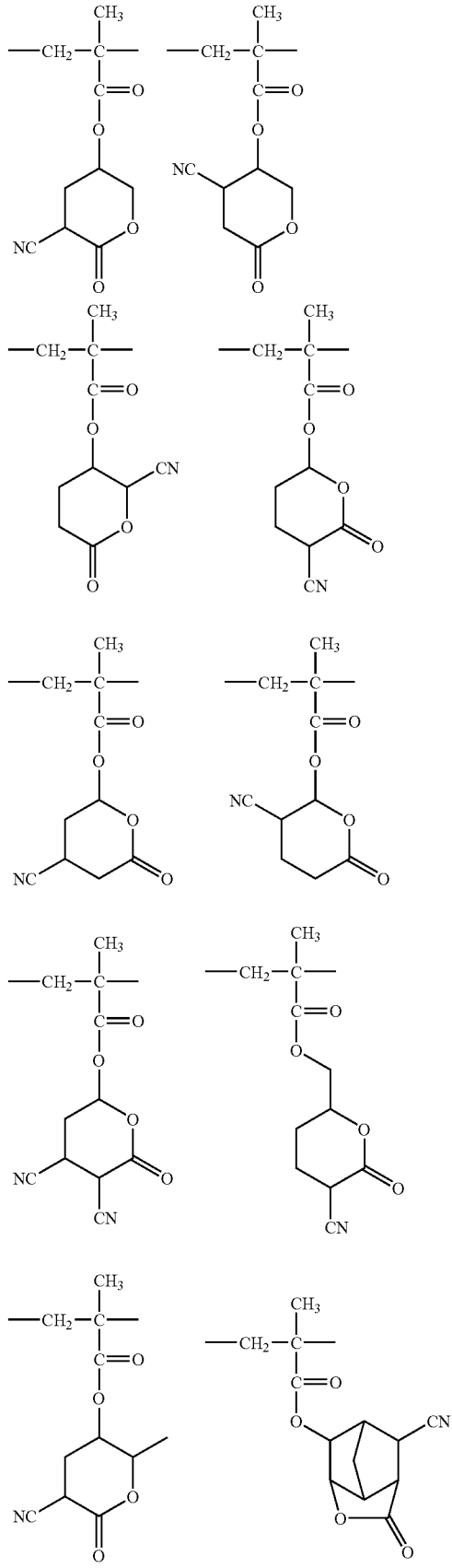

-continued
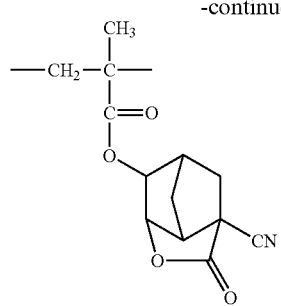
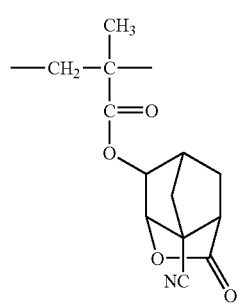
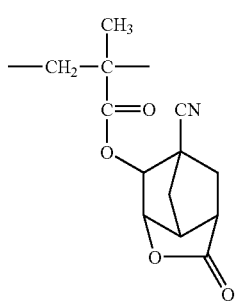
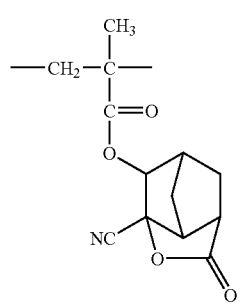
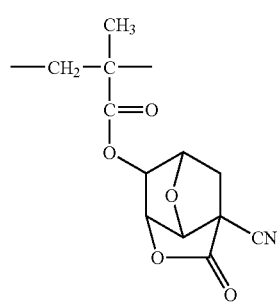
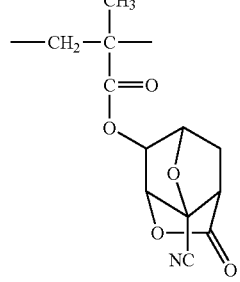
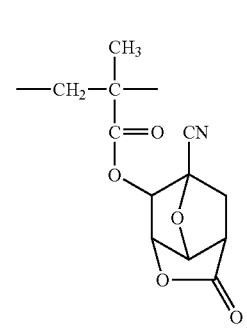
-continued
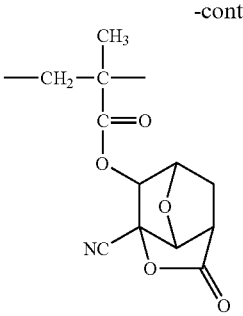
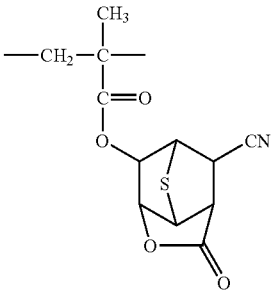
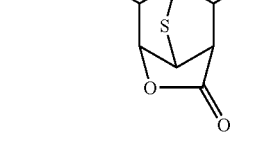
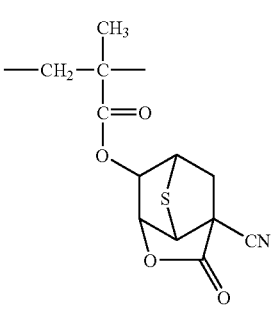
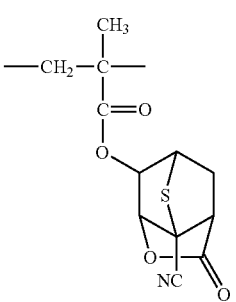
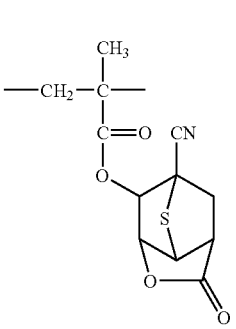
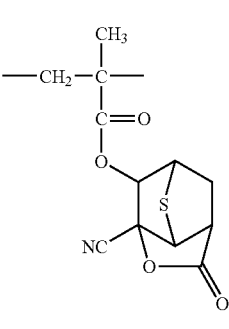

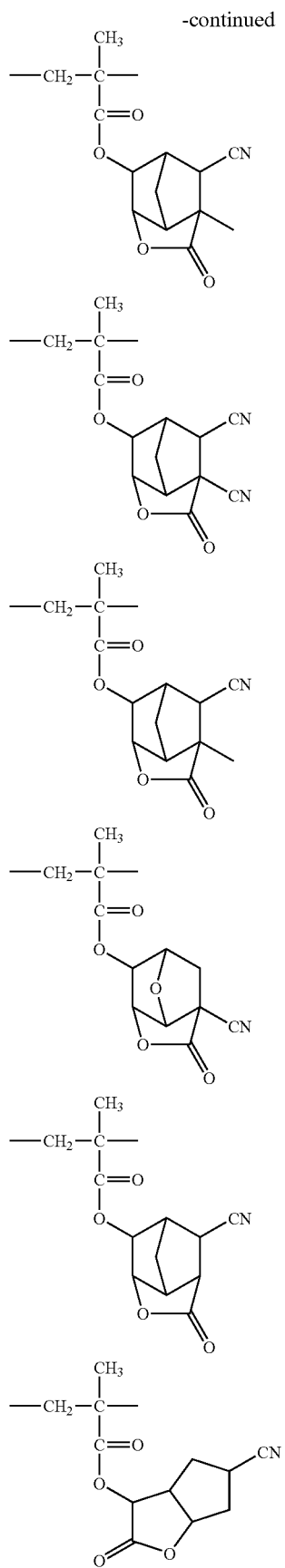
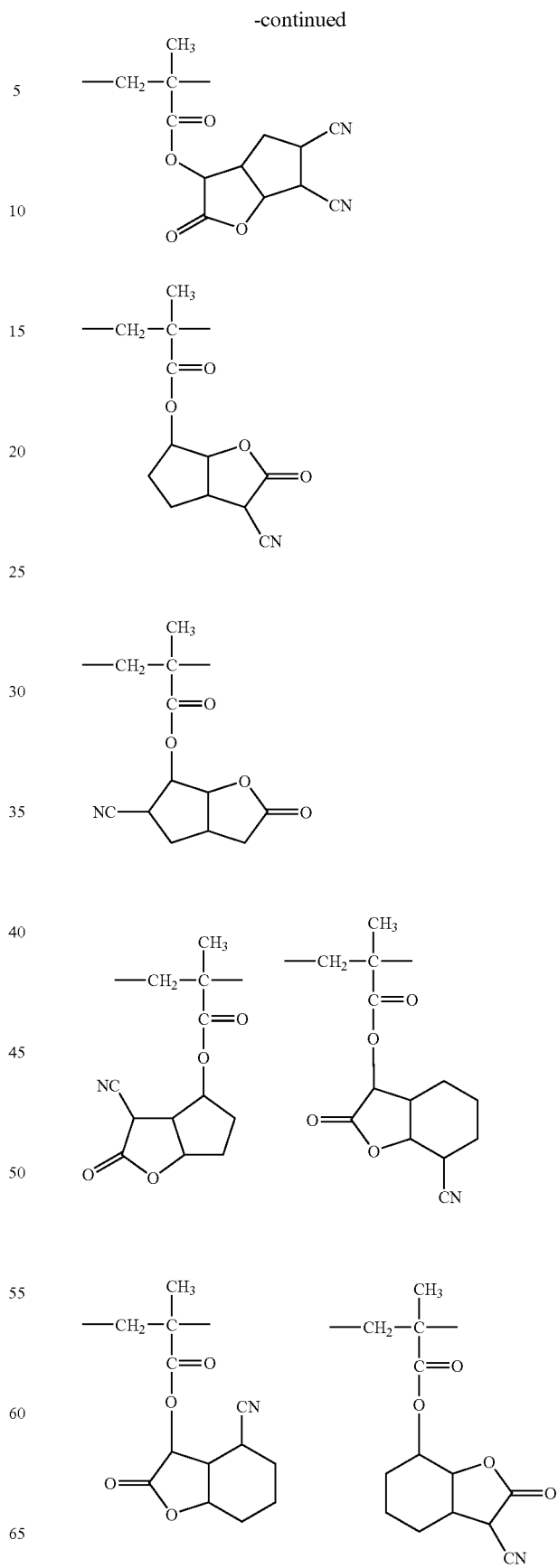

-continued
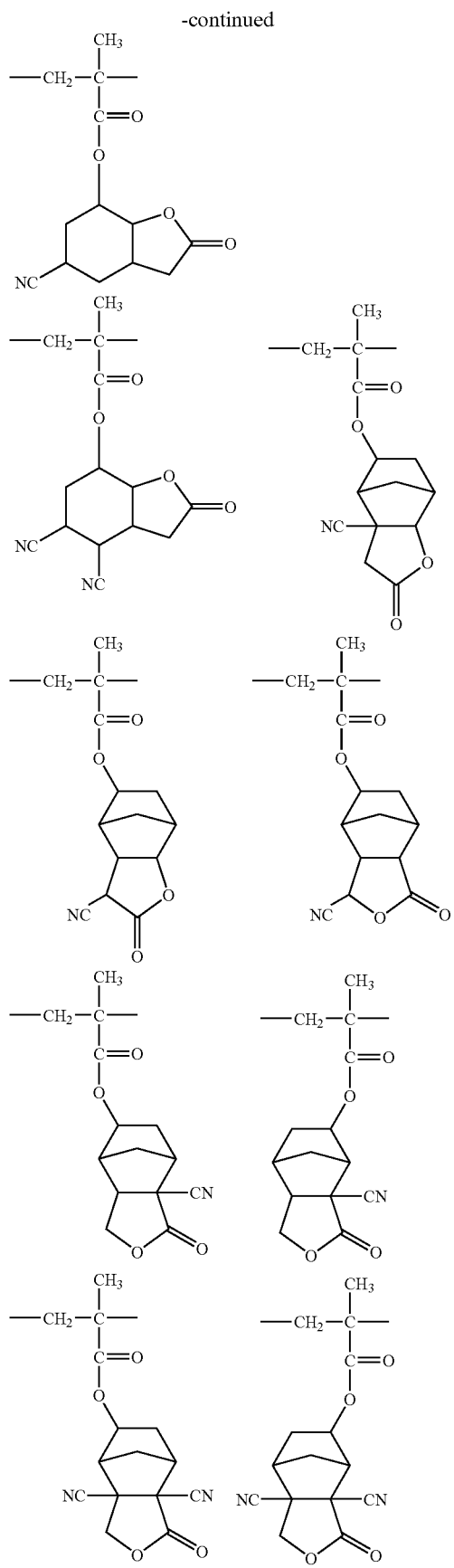
-continued
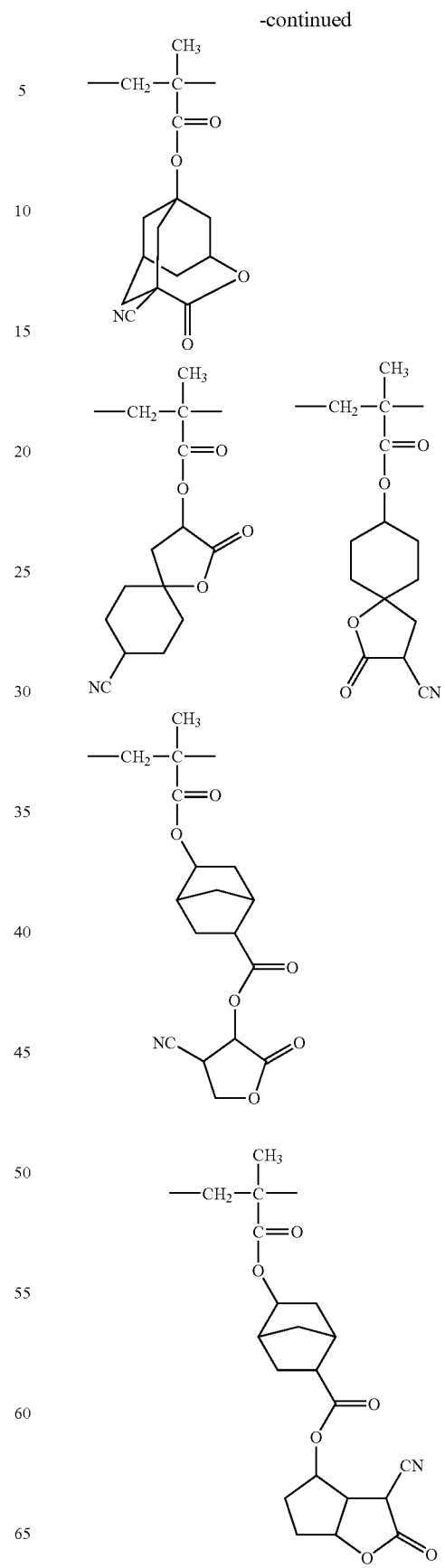

-continued

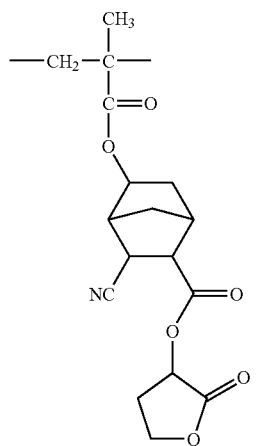
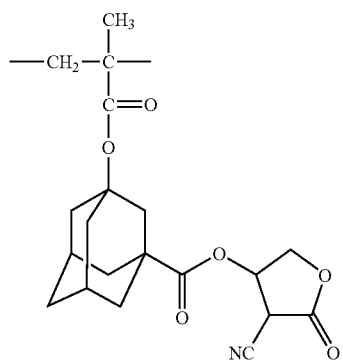
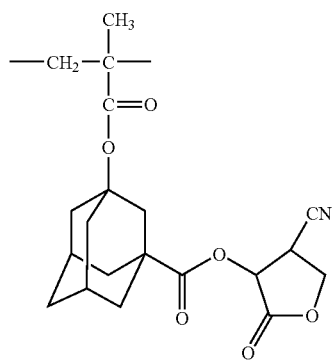
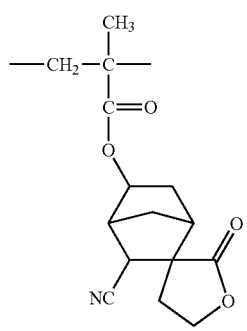

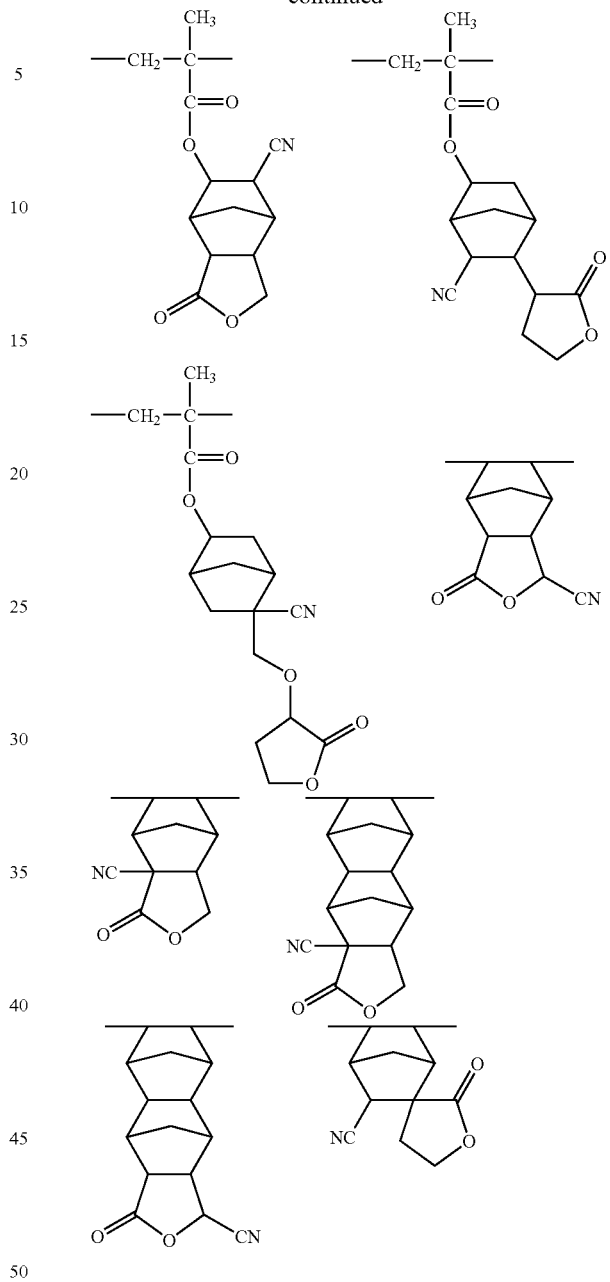

The synthesis method of a monomer corresponding to the repeating unit (A1) is not particularly limited, but a method of synthesizing the monomer through an alkenylcarboxylic acid (Intermediate I) or an ester thereof (Intermediate II) shown in Scheme 1 and Scheme 2 below is preferred. The epoxidation in Scheme 1 may be performed by a general method using mCPBA, dimethyldioxirane or the like. In the case of starting from Intermediate II, the same epoxycarboxylic acid may be obtained by hydrolyzing the ester moiety after epoxidation. The monomer can be efficiently obtained by leading the epoxide obtained to hydroxylactone through a treatment under acidic conditions and imparting a polymerizable group to the produced hydroxyl group. For the monomerization, an arbitrary esterification reaction may be used.

The lactonization in Scheme 2 may be a general lactoniza-tion reaction, and examples thereof include a halolactonization reaction, with an iodolactonization reaction being preferred. The iodine atom of the obtained iodolactone is substituted to a polymerizable group-containing substituent, thereby leading to the monomer.

In formula (R$_2$), Xb represents a hydrogen atom or a methyl group.

R$_{2a}$ represents an organic group substituted by a hydroxyl group or a cyano group.

Scheme 1:

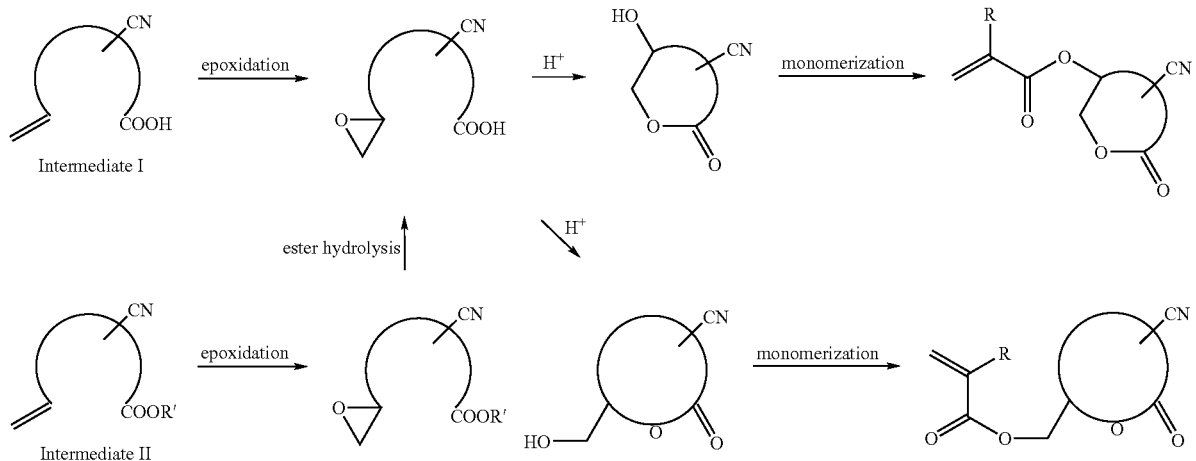

Scheme 2:

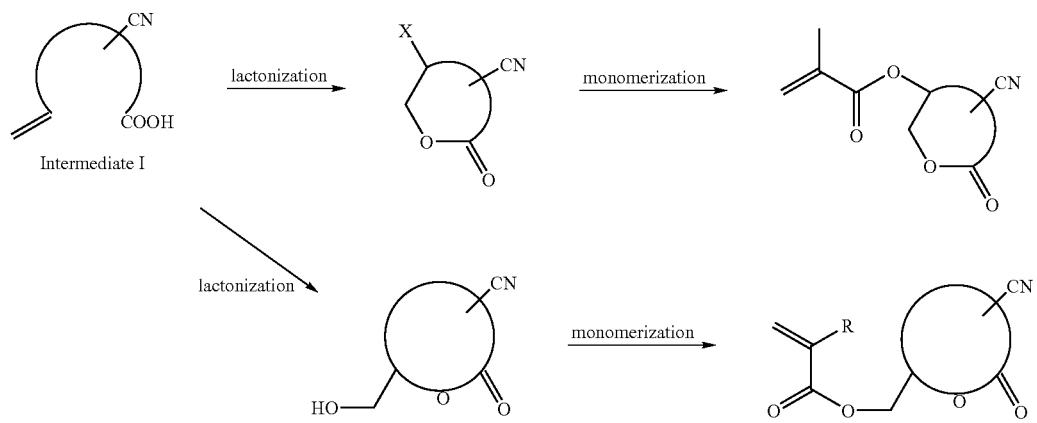

The alicyclic hydrocarbon-based acid-decomposable resin for use in the present invention preferably contains a repeating unit having an organic group substituted by a hydroxyl group or a cyano group.

The repeating unit having an organic group substituted by a hydroxyl group or a cyano group is preferably a repeating unit represented by the following formula (R$_2$):

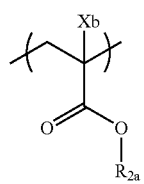

(R2)

The methyl group of Xb in formula (R$_2$) may be substituted by a halogen atom (preferably a fluorine atom), a hydroxyl group or the like.

The organic group substituted by a hydroxyl group or a cyano group of R$_{2a}$ includes an alkyl group substituted by at least one hydroxyl group or cyano group, and an alicyclic hydrocarbon group substituted by at least one hydroxyl group or cyano group. An alicyclic hydrocarbon group substituted by at least one hydroxyl group or cyano group is preferred.

The alicyclic hydrocarbon-based acid-decomposable resin for use in the present invention preferably contains a repeating unit having an alicyclic hydrocarbon structure substituted by a polar group. By virtue of this repeating unit, the adhesion to substrate and the affinity for developer are enhanced. The polar group is preferably a hydroxyl group or a cyano group.

Examples of the alicyclic hydrocarbon structure substituted by a polar group include the structures represented by formulae (VIIa) and (VIIb):

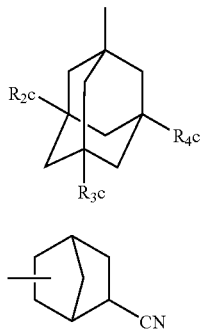

(VIIa)

(VIIb)

In formula (VIIa), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two member(s) out of $R_{2c}$ to $R_{4c}$ is(are) a hydroxyl group with the remaining being a hydrogen atom is preferred, and a structure where two members out of $R_{2c}$ to $R_{4c}$ are a hydroxyl group with the remaining being a hydrogen atom is more preferred.

The group represented by formula (VIIa) is preferably a dihydroxy form or a monohydroxy form, more preferably a dihydroxy form.

Examples of the repeating unit having a group represented by formula (VIIa) or (VIIb) include a repeating unit where at least one of $R_{13}'$ to $R_{16}'$ in formula (II-AB1) or (II-AB2) has a group represented by formula (VIIa) or (VIIb) (for example, $R_5$ of —COOR$_5$ is a group represented by formula (VIIa) or (VIIb)), and repeating units represented by the following formulae (AIIa) and (AIIb):

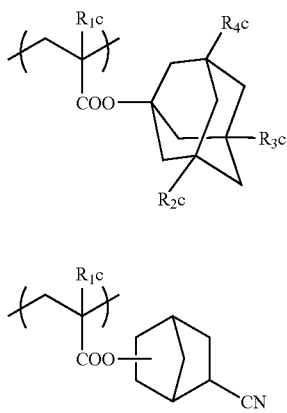

(AIIa)

(AIIb)

In formulae (AIIa) and (AIIb), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formula (VIIa).

Specific examples of the repeating units represented by formulae (R2), (AIIa) and (AIIb) are set forth below, but the present invention is not limited thereto.

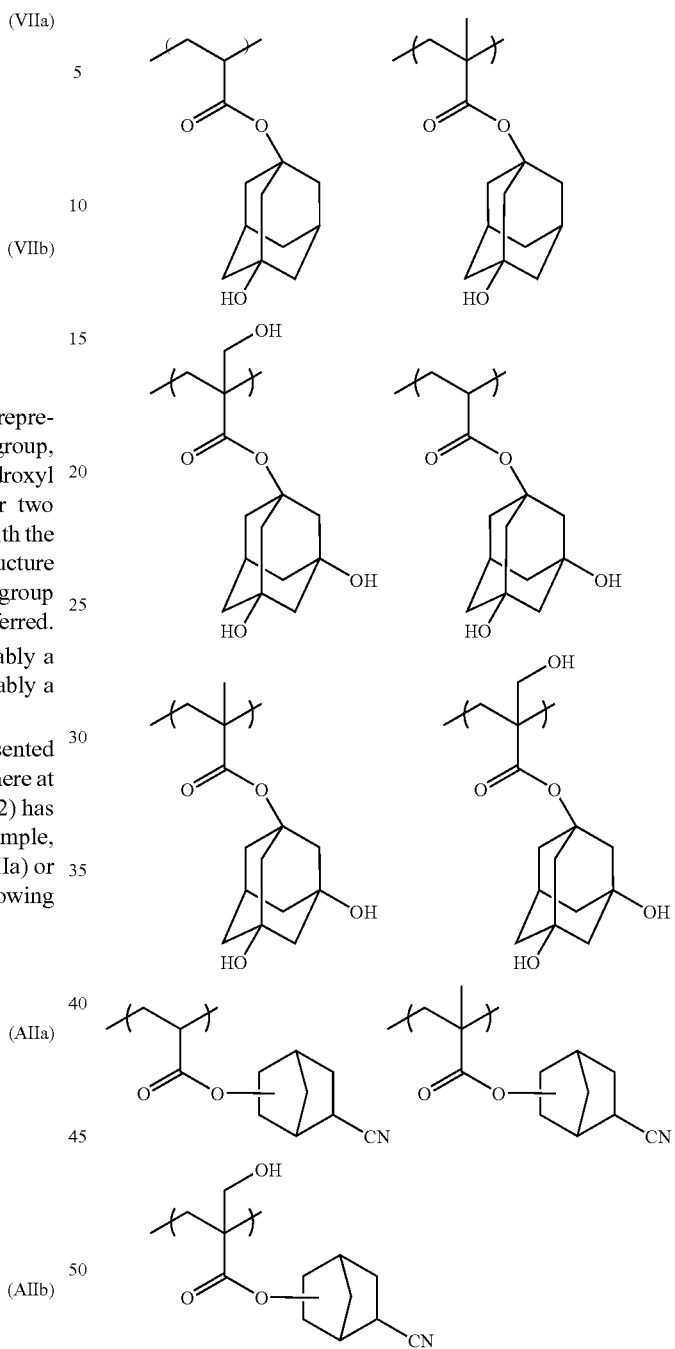

The alicyclic hydrocarbon-based acid-decomposable resin for use in the present invention may contain a repeating unit represented by the following formula (VIII):

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

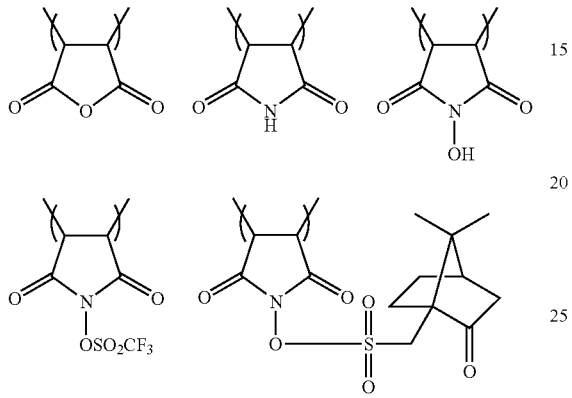

The alicyclic hydrocarbon-based acid-decomposable resin for use in the present invention preferably contains a repeating unit having an alkali-soluble group. The alkali-soluble group includes a carboxyl group, a sulfonamide group, a sulfonylimide group, a bisulfonylimide group, and an aliphatic alcohol with the α-position being substituted by an electron-withdrawing group. Among these, the acid-decomposable resin preferably contains a repeating unit having a carboxyl group.

By virtue of containing such a repeating unit, the resolution increases in the usage of forming contact holes. As for the repeating unit having an alkali-soluble group including a carboxyl group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit at the terminal of a polymer chain where an alkali-soluble group is introduced by using an alkali-soluble group-containing polymerization initiator or chain transfer agent at the polymerization, are preferred. The linking group may have a monocyclic or polycyclic hydrocarbon structure. In particular, a repeating unit by an acrylic acid or a methacrylic acid is preferred.

The content of the repeating unit having an alkali-soluble group is preferably from 1 to 20 mol %, more preferably from 3 to 15 mol %, still more preferably from 5 to 10 mol %, based on all repeating units in the polymer.

Specific examples of the repeating unit having an alkali-soluble group are set forth below, but the present invention is not limited thereto.

(In the formulae, Rx is H, $CH_3$, $CF_3$ or $CH_2OH$.)

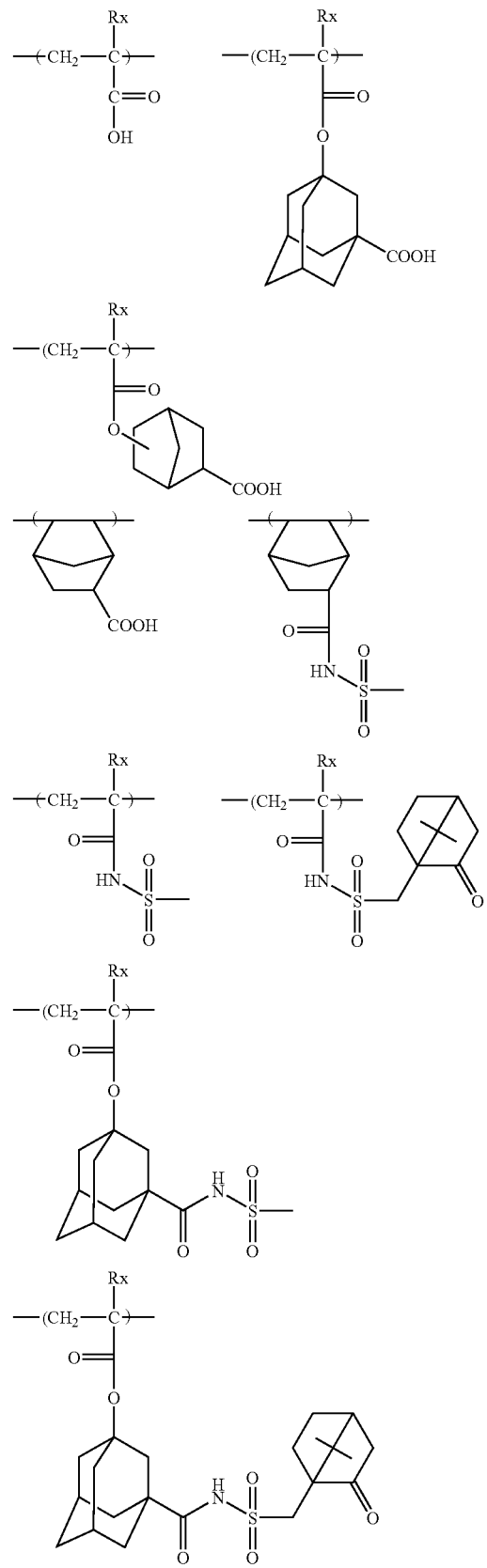

-continued

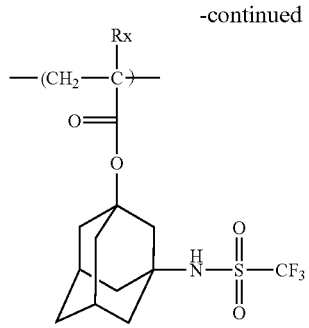

The alicyclic hydrocarbon-based acid-decomposable resin for use in the present invention may contain a repeating unit having from 1 to 3 groups represented by the following formula (F1). By virtue of this repeating unit, the line edge roughness performance is enhanced.

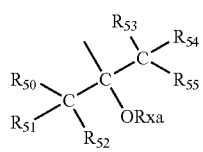
(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rxa represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group.

It is preferred that $R_{50}$ to $R_{55}$ all are a fluorine atom.

The organic group represented by Rxa is preferably an acid-decomposable protective group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

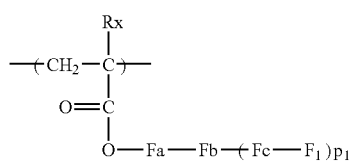
(F2)

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group, preferably a single bond.

Fb represents a monocyclic or polycyclic hydrocarbon group.

Fc represents a single bond or a linear or branched alkylene group, preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a structure of formula (F1) are set forth below.

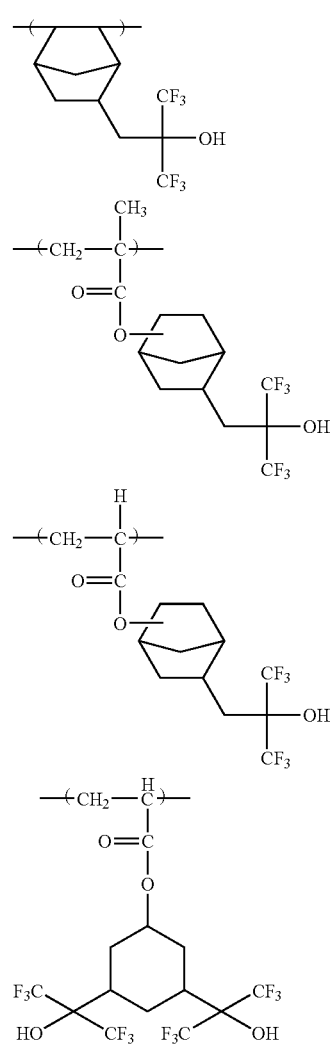

The alicyclic hydrocarbon-based acid-decomposable resin for use in the present invention may further contain a repeating unit having an alicyclic hydrocarbon structure and not having an acid-decomposable group. By containing such a repeating unit, the dissolving out of low molecular components into the immersion liquid from the resist film at the immersion exposure can be prevented. Examples of this repeating unit include 1-adamantyl(meth)acrylate, tricyclodecanyl(meth)acrylate and cyclohexyl(meth)acrylate.

The alicyclic hydrocarbon-based acid-decomposable resin for use in the present invention may contain, in addition to the above-described repeating units, various repeating structural units for the purpose of controlling dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the alicyclic hydrocarbon-based acid-decomposable resin, particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

The preferred embodiment of the alicyclic hydrocarbon-based acid-decomposable resin for use in the present invention includes the followings:

(1) a resin containing a repeating unit having an alicyclic hydrocarbon-containing partial structure represented by any one of formulae (pI) to (pV) (side chain type), preferably containing a (meth)acrylate repeating unit having a structure represented by any one of formulae (pI) to (pV), and (2) a resin containing a repeating unit represented by formula (II-AB) (main chain type).

The embodiment of (2) further includes, for example, (3) a resin having a repeating unit represented by formula (II-AB), a maleic anhydride derivative and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 20 to 70 mol %, more preferably from 20 to 50 mol %, still more preferably from 25 to 40 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

As for the repeating structural unit based on the monomer of the above-described further copolymerization component, the content thereof in the resin may also be appropriately determined according to the desired resist performance but in general, the content is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

In the case of using the composition of the present invention for exposure with ArF, the resin preferably has no aromatic group in view of transparency to ArF light.

The alicyclic hydrocarbon-based acid-decomposable resin for use in the present invention is preferably a resin where all repeating units are composed of a (meth)acrylate repeating unit. In this case, the repeating units all may be a methacrylate, all may be an acrylate, or may be a methacrylate/acrylate mixture, but the acrylate repeating unit content is preferably 50 mol % or less based on all repeating units. The alicyclic hydrocarbon-based acid-decomposable resin for use in the present invention is more preferably a ternary copolymerization polymer comprising from 20 to 50 mol % of the repeating unit having an alicyclic hydrocarbon-containing partial structure represented by any one of formulae (pI) to (pV), from 20 to 50 mol % of the repeating unit having a lactone structure and from 5 to 30 mol % of the repeating unit having an alicyclic hydrocarbon structure substituted by a polar group, or a quaternary copolymerization polymer further comprising from 0 to 20 mol % of other repeating units.

In particular, the resin is preferably a ternary copolymerization polymer comprising from 20 to 50 mol % of a repeating unit having an acid-decomposable group represented by any one of the following formulae (ARA-1) to (ARA-5), from 20 to 50 mol % of a repeating unit having a lactone group represented by any one of the following formulae (ARL-1) to (ARL-6), and from 5 to 30 mol % of a repeating unit having an alicyclic hydrocarbon structure substituted by a polar group represented by any one of the following formulae (ARH-1) to (ARH-3), or a quaternary copolymerization polymer further comprising from 5 to 20 mol % of the repeating unit containing a carboxyl group or a structure represented by formula (F1), or the repeating unit having an alicyclic hydrocarbon structure and not exhibiting acid decomposability.

(In the formulae, $Rxy_1$ represents a hydrogen atom or a methyl group, and $Rxa_1$ and $Rxb_1$ each represents a methyl group or an ethyl group).

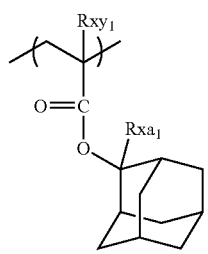

ARA-1

-continued
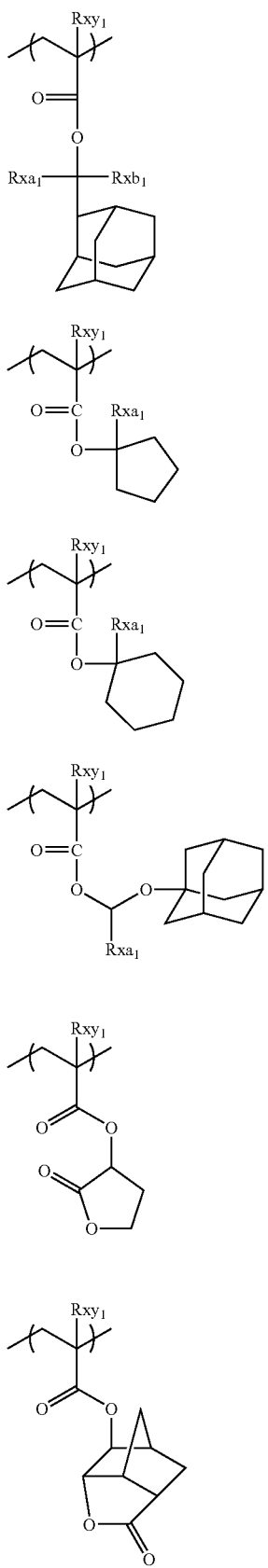
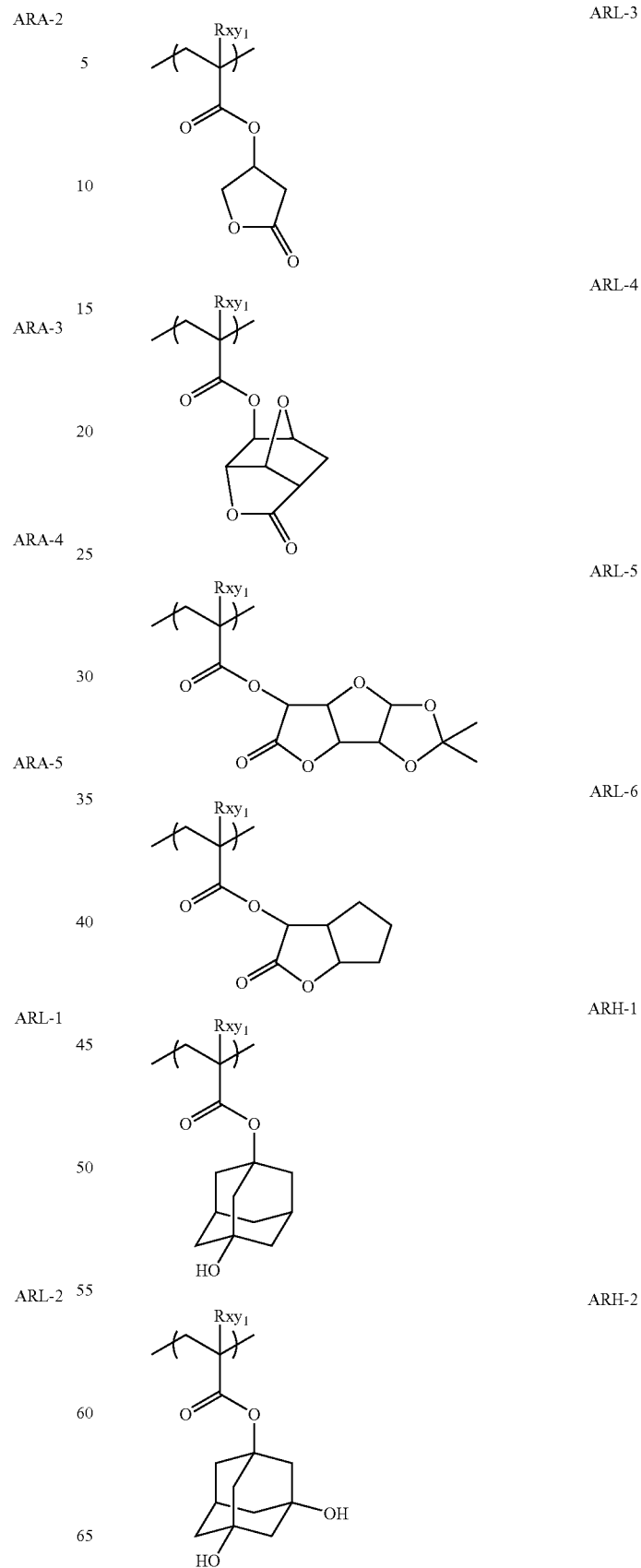

-continued

ARH-3

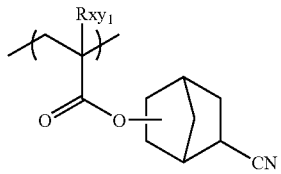

The alicyclic hydrocarbon-based acid-decomposable resin for use in the present invention can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent capable of dissolving the composition of the present invention, which is described later, such as propylene glycol monomethyl ether acetate, propylene glycol monomethyl ether and cyclohexanone. The polymerization is more preferably performed by using the same solvent as the solvent used in the resist composition of the present invention. By the use of this solvent, production of particles during storage can be suppressed.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C.

In the case of irradiating the positive resist composition of the present invention with KrF excimer laser light, electron beam, X-ray or high-energy light at a wavelength of 50 nm or less (e.g., EUV), the resin as the component (A) is preferably an acid-decomposable resin having a hydroxystyrene-based repeating unit (hereinafter, sometimes referred to as a "hydroxystyrene-based acid-decomposable resin"). Preferred examples of the hydroxystyrene-based acid-decomposable resin include a copolymer of hydroxystyrene/hydroxystyrene protected by a group which desorbs under the action of an acid, a copolymer of hydroxystyrene/tertiary alkyl (meth)acrylate, a copolymer of hydroxystyrene/hydroxystyrene protected by a group which desorbs under the action of an acid/tertiary alkyl(meth)acrylate, a copolymer of hydroxystyrene/hydroxystyrene protected by a group which desorbs under the action of an acid/styrene, a copolymer of hydroxystyrene/tertiary alkyl(meth)acrylate/styrene, and a copolymer of hydroxystyrene/hydroxystyrene protected by a group which desorbs under the action of an acid/tertiary alkyl (meth)acrylate/styrene.

Specific examples of the hydroxystyrene-based acid-decomposable resin are set forth below, but the present invention is not limited thereto.

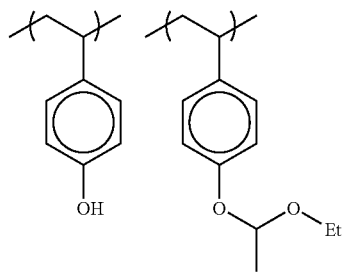

(R-1)

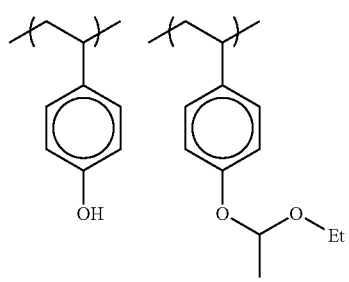

(R-2)

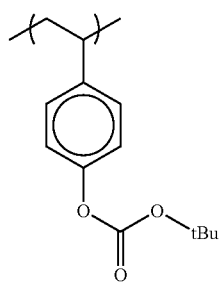

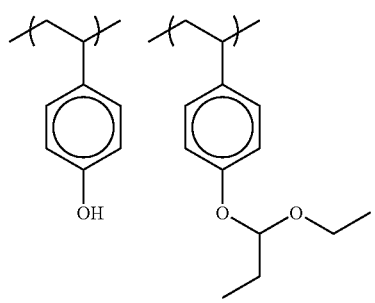

(R-3)

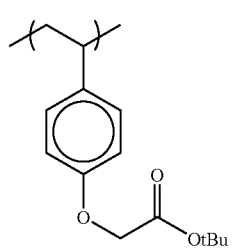

-continued
(R-4)
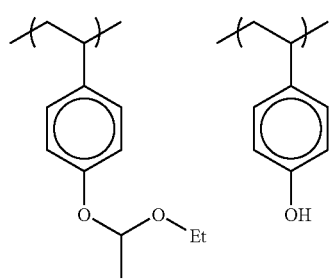
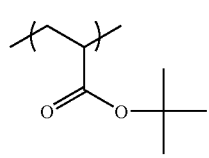
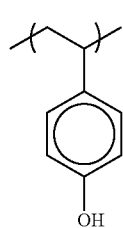
(R-5)
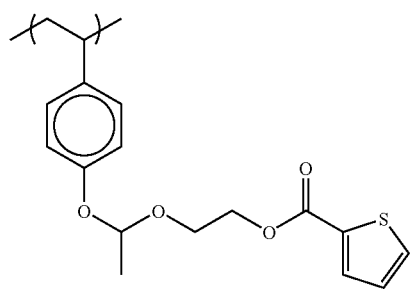
(R-6)
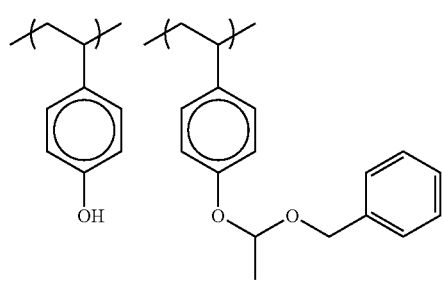
(R-7)
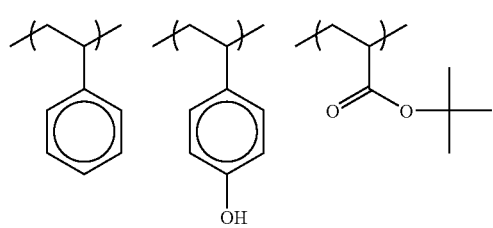
-continued
(R-8)
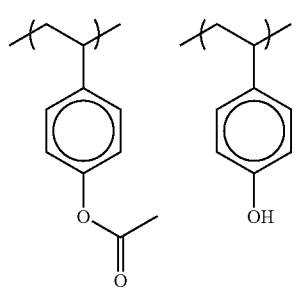
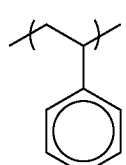
(R-9)
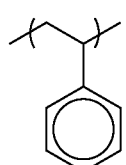
(R-10)
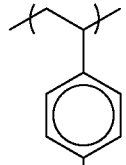
(R-11)
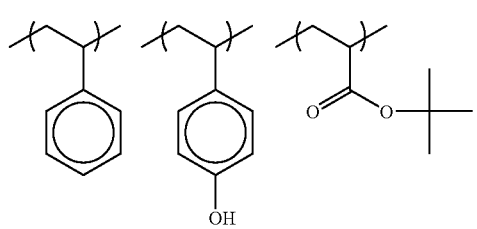

-continued

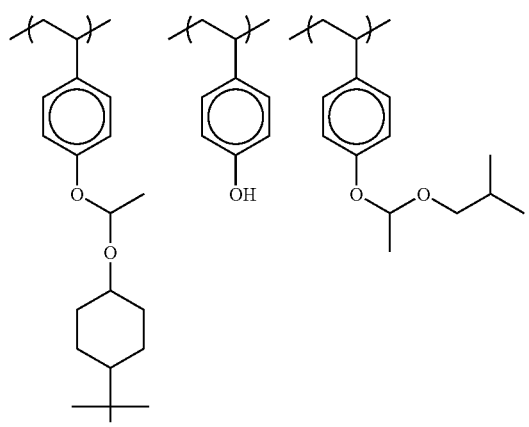
(R-12)

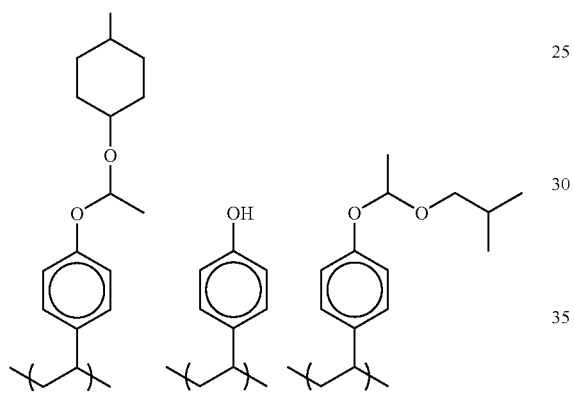

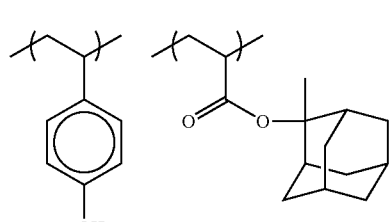
(R-13)

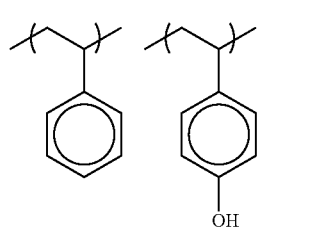
(R-14)

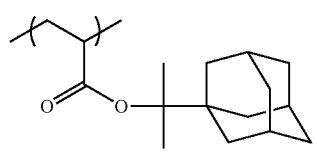

-continued

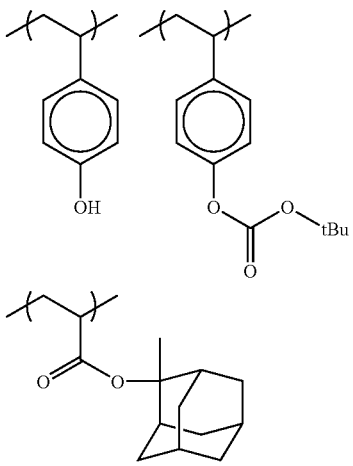
(R-15)

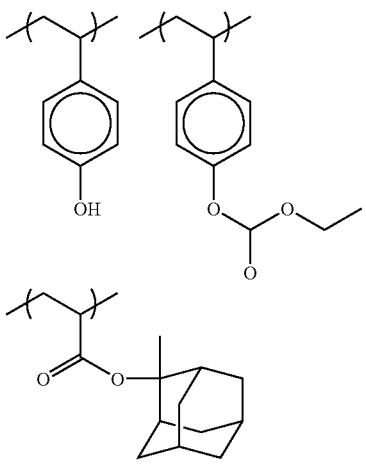
(R-16)

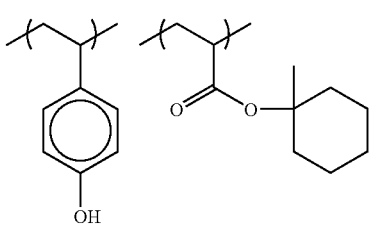
(R-17)

In these specific examples, "tBu" indicates a tert-butyl group.

In the hydroxystyrene-based acid-decomposable resin, the content of the acid-decomposable group is expressed by B/(B+S) using the number (B) of acid-decomposable groups in the resin and the number (S) of alkali-soluble groups not protected by a group which desorbs under the action of an acid. The content is preferably from 0.01 to 0.7, more preferably from 0.05 to 0.50, still more preferably from 0.05 to 0.40.

The hydroxystyrene-based acid-decomposable resin can be obtained by reacting an alkali-soluble resin with a precursor of a group which desorbs under the action of an acid or by copolymerizing various monomers with a monomer corresponding to a repeating unit having an alkali-soluble group protected by a group which desorbs under the action of an acid, and this is disclosed in European Patent 254853, JP-A-2-25850, JP-A-3-223860 and JP-A-4-251259.

The weight average molecular weight of the resin as the component (A) is preferably from 1,000 to 200,000, more preferably from 3,000 to 20,000, still more preferably from 5,000 to 10,000, as calculated in terms of polystyrene by the GPC method. When the weight average molecular weight is from 1,000 to 200,000, the heat resistance, dry etching resistance and developability can be prevented from deterioration and also, the deterioration in the film-forming property due to high viscosity can be prevented.

The dispersity (molecular weight distribution) is usually from 1 to 5, preferably from 1.2 to 3.0. As the molecular weight distribution is smaller, the resolution and resist profile are more excellent, the side wall of the resist pattern is smoother, and the roughness property is more improved.

The amount of metal components such as Na, K, Ca, Fe and Mg contained in the resin of the component (A) is preferably small. Specifically, the amount of each metal species contained in the resin is preferably 300 ppb or less, more preferably 200 ppb or less, still more preferably 100 ppb or less.

Examples of the method for reducing the amount of metal components contained in the resin include a method of dissolving the resin of the component (A) in a solvent and filtering the obtained solution through an ion exchange filter.

In the positive resist composition of the present invention, the amount of all resins for use in the present invention blended in the entire composition is preferably from 50 to 99.99 mass %, more preferably from 60 to 99.0 mass %, based on the entire solid content.

With respect to the resin as the component (A) used in the present invention, one species may be used or a plurality of species may be used in combination.

[2] (B) Compound Capable of Generating an Acid Upon Irradiation with Actinic Rays or Radiation The positive resist composition of the present invention comprises a compound capable of generating an acid upon irradiation with actinic rays or radiation (hereinafter, sometimes referred to as an "acid generator").

The acid generator may be appropriately selected from a photoinitiator for photocationic polymerization, a photoinitiator for photoradical polymerization, a photo-decoloring agent for coloring matters, a photo-discoloring agent, a known compound capable of generating an acid upon irradiation with actinic rays or radiation, which is used for microresist or the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with actinic rays or radiation is introduced into the main or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Pat. No. 126,712 may also be used.

Out of the compounds capable of generating an acid upon irradiation with actinic rays or radiation, preferred compounds include compounds represented by the following formulae (ZI), (ZII) and (ZIII):

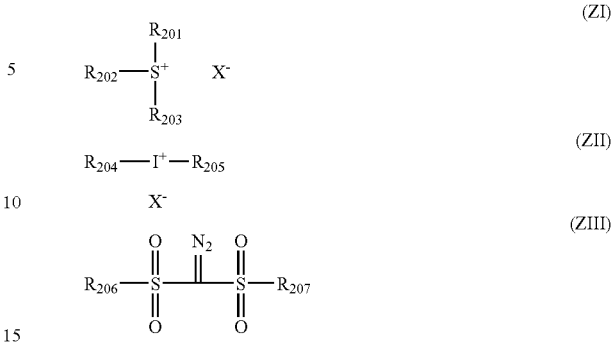

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes organic anions represented by the following formulae:

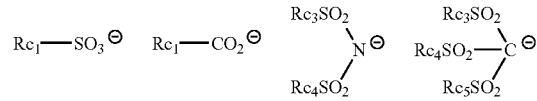

In the formulae, $Rc_1$ represents an organic group.

The organic group of $Rc_1$ includes an organic group having a carbon number of 1 to 30, and preferred examples thereof include an alkyl group which may be substituted, a cycloalkyl group, an aryl group, and a group where a plurality of these groups are connected through a single bond or a linking group such as —O—, —CO$_2$—, —S—, —SO$_3$— and —SO$_2$N(Rd$_1$)—.

$Rd_1$ represents a hydrogen atom or an alkyl group.

$Rc_3$, $Rc_4$ and $Rc_5$ each independently represents an organic group.

Preferred organic groups of $Rc_3$, $Rc_4$ and $Rc_5$ are the same as the preferred organic groups in $Rc_1$. The organic group is preferably a perfluoroalkyl group having a carbon number of 1 to 4.

$Rc_3$ and $Rc_4$ may combine to form a ring.

The group formed by combining $Rc_3$ and $Rc_4$ includes an alkylene group, a cycloalkylene group and an arylene group, and a perfluoroalkylene group having a carbon number of 2 to 4 is preferred.

The organic group of $Rc_1$ and $Rc_3$ to $Rc_5$ is preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon irradiation with light increases and the sensitivity is enhanced. Also, when $Rc_3$ and $Rc_4$ are combined to form a ring, the acidity of the acid generated upon irradiation with light increases and the sensitivity is advantageously enhanced.

In formula (ZI), the carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The preferred component (ZI) includes compounds (ZI-1), (ZI-2) and (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$, to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkyl sulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be either linear or branched and is preferably a linear or branched alkyl group having a carbon number of 1 to 10 (e.g., methyl, ethyl, propyl, butyl, pentyl). The alkyl group as $R_{201}$ to $R_{203}$ is more preferably a linear or branched 2-oxoalkyl group or an alkoxycarbonylmethyl group.

The cycloalkyl group as $R_{201}$ to $R_{203}$ is preferably a cycloalkyl group having a carbon number of 3 to 10 (e.g., cyclopentyl, cyclohexyl, norbornyl). The cycloalkyl group as $R_{201}$ to $R_{203}$ is more preferably a cyclic 2-oxoalkyl group.

The linear, branched or cyclic 2-oxoalkyl group as $R_{201}$ to $R_{203}$ is preferably a group having >C=O at the 2-position of the above-described alkyl or cycloalkyl group.

The alkoxy group in the alkoxycarbonylmethyl group as $R_{201}$ to $R_{203}$ is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

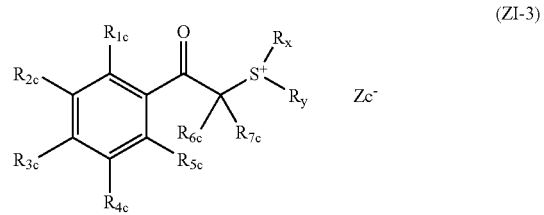

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine with each other to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $X^-$ in formula (ZI).

The alkyl group as $R_{1c}$ to $R_{7c}$ may be either linear or branched and this is, for example, a linear or branched alkyl group having a carbon number of 1 to 20, preferably from 1 to 12 (for example, a methyl group, an ethyl group, a linear or branched propyl group, a linear or branched butyl group, and a linear or branched pentyl group).

The cycloalkyl group as $R_{1c}$ to $R_{7c}$ is preferably a cycloalkyl group having a carbon number of 3 to 8 (e.g., cyclopentyl, cyclohexyl).

The alkoxy group as $R_{1c}$ to $R_{5c}$ may be linear, branched or cyclic and this is, for example, an alkoxy group having a carbon number of 1 to 10, preferably a linear or branched alkoxy group having a carbon number of 1 to 5 (for example, a methoxy group, an ethoxy group, a linear or branched propoxy group, a linear or branched butoxy group, and a linear or branched pentoxy group) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a compound, the solubility in a solvent is more enhanced and production of particles during storage can be suppressed.

The alkyl group of $R_x$ and $R_y$ is the same as the alkyl group of $R_{1c}$ to $R_{7c}$. The alkyl group as $R_x$ and $R_y$ is more preferably a linear or branched 2-oxoalkyl group or an alkoxycarbonylmethyl group.

The cycloalkyl group of $R_x$ and $R_y$ is the same as the cycloalkyl group of $R_{1c}$ to $R_{7c}$. The cycloalkyl group as $R_x$ and $R_y$ is more preferably a cyclic 2-oxoalkyl group.

The linear, branched or cyclic 2-oxoalkyl group includes a group having $>C=O$ at the 2-position of the alkyl group or cycloalkyl group as $R_{1c}$ to $R_{7c}$.

The alkoxy group in the alkoxycarbonylmethyl group is the same as the alkoxy group of $R_{1c}$ to $R_{5c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably an aryl group such as phenyl group and naphthyl group, or a heteroaryl group such as indole residue and pyrrole residue, more preferably a phenyl group or an indole residue.

The alkyl group of $R_{204}$ to $R_{207}$ may be linear or branched and is preferably a linear or branched alkyl group having a carbon number of 1 to 10 (e.g., methyl, ethyl, propyl, butyl, pentyl).

The cycloalkyl group of $R_{204}$ to $R_{207}$ is preferably a cycloalkyl group having a carbon number of 3 to 10 (e.g., cyclopentyl, cyclohexyl, norbornyl).

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion, and examples thereof are the same as those of the non-nucleophilic anion of $X^-$ in formula (ZI).

Out of the compounds capable of generating an acid upon irradiation with actinic rays or radiation, preferred compounds further include compounds represented by the following formulae (ZIV), (ZV) and (ZVI):

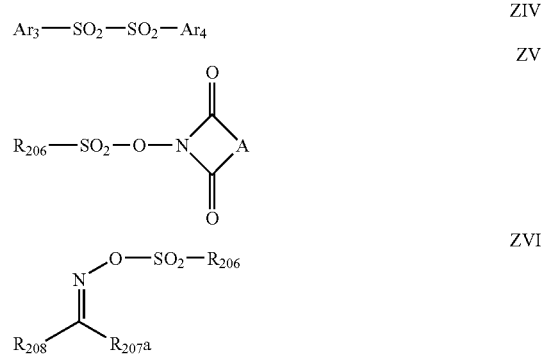

In formulae (ZIV) to (ZVI), $Ar_3$ and $Ar_4$ each independently represents an aryl group.

$R_{206}$ represents an alkyl group, a cycloalkyl group or an aryl group.

$R_{207a}$ and $R_{208}$ each independently represents an alkyl group, a cycloalkyl group, an aryl group or an electron-withdrawing group. $R_{207a}$ is preferably an aryl group, and $R_{208}$ is preferably an electron-withdrawing group, more preferably a cyano group or a fluoroalkyl group.

A represents an alkylene group, an alkenylene group or an arylene group.

Among the compounds capable of generating an acid upon irradiation with actinic rays or radiation, compounds represented by formulae (ZI) to (ZIII) are more preferred.

Among the compounds capable of generating an acid upon irradiation with actinic rays or radiation, a compound having a triphenylsulfonium cation structure is still more preferred.

A carboxylate may also be used as the acid generator and in this case, the acid generator is preferably used by mixing it with a fluorosulfonate and/or a sulfonate.

The acid generator may have a plurality of atoms having a lone pair, such as nitrogen atom, in the anion moiety. In this case, the acid generator is preferably used by mixing it with a fluorosulfonate and/or a sulfonate.

Preferred examples out of the compounds capable of generating an acid upon irradiation with actinic rays or radiation are set forth below.

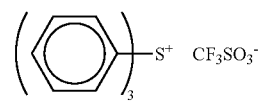

(z1)

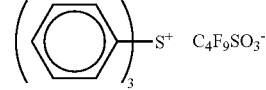

(z2)

(z3)
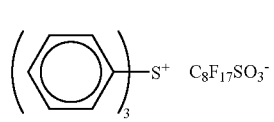
(z4)
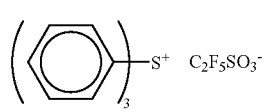
(z5)
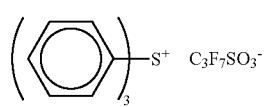
(z6)
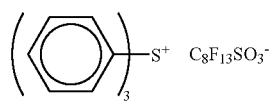
(z7)
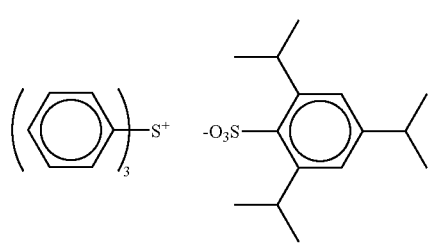
(z8)
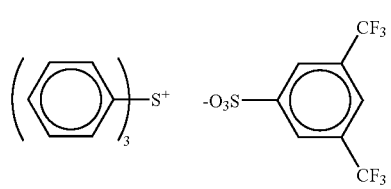
(z9)
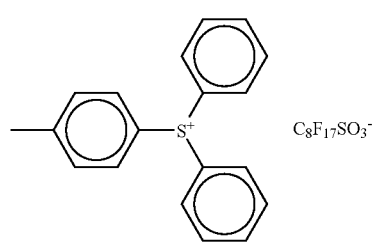
(z10)
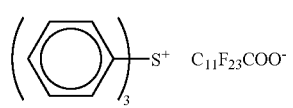
(z11)
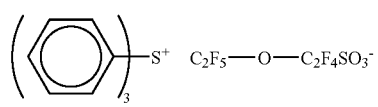
(z12)
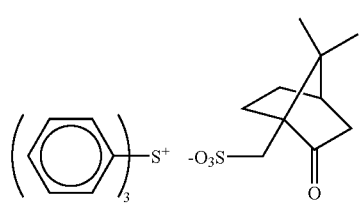

(z13)
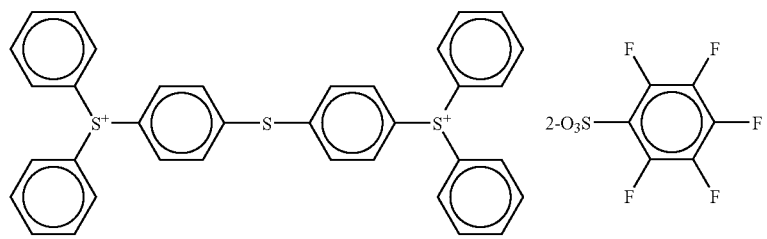
(z14)
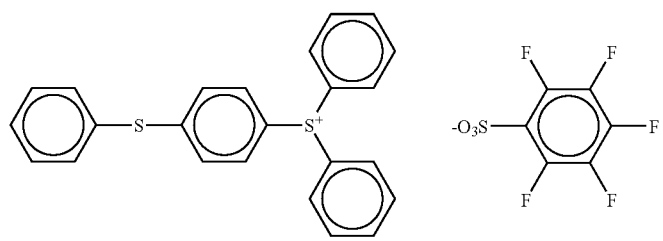
(z15)
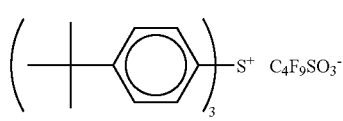
(z16)
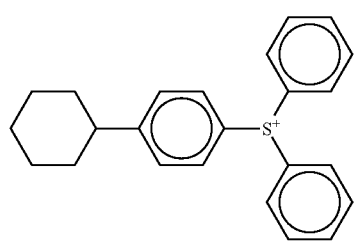
(z17)
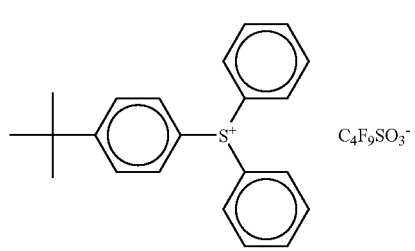
(z18)
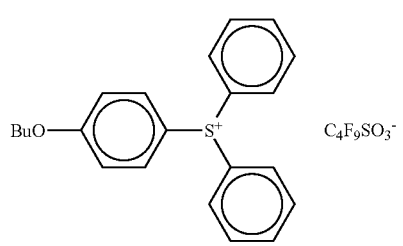
(z19)
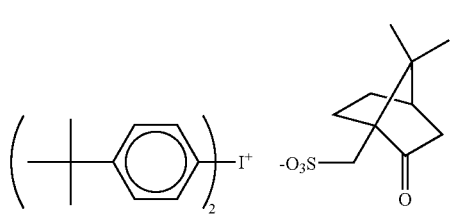

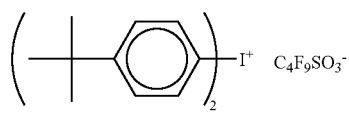 (z20)
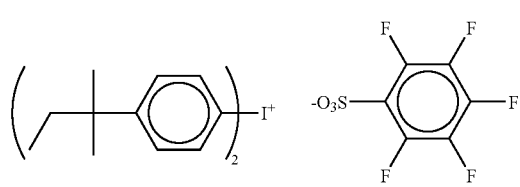 (z21)
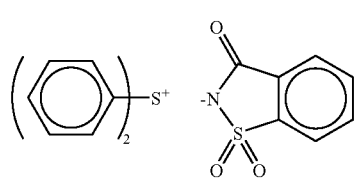 (z22)
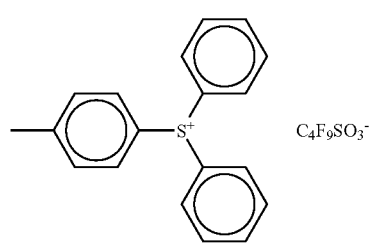 (z23)
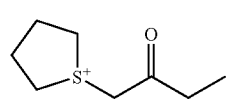 (z24)
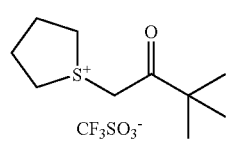 (z25)
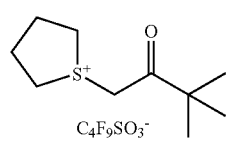 (z26)
 (z27)
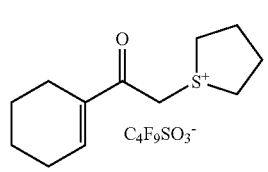 (z28)

-continued
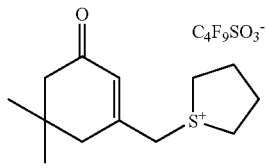
(z29)
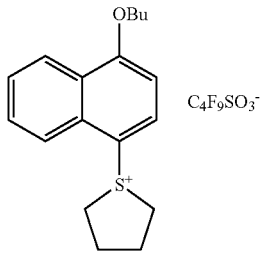
(z30)
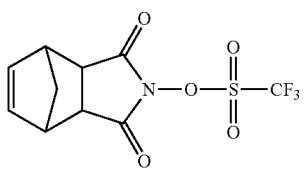
(z31)
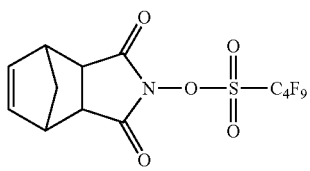
(z32)
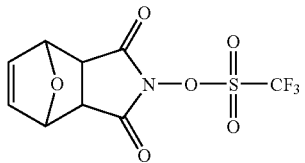
(z33)
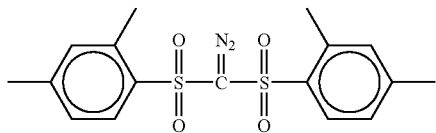
(z34)
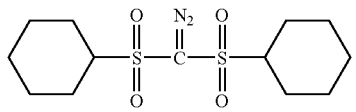
(z35)
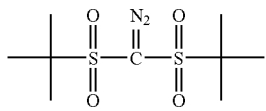
(z36)
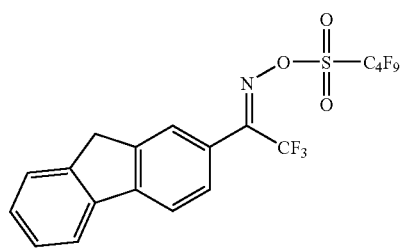
(z37)

-continued
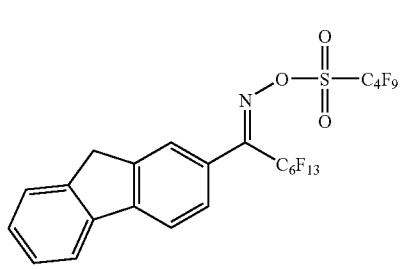
(z38)
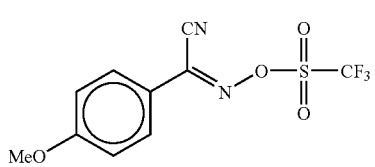
(z39)
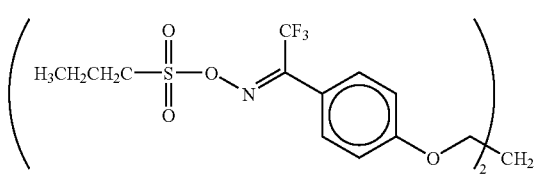
(z40)
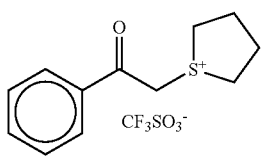
(z41)
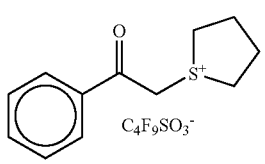
(z42)
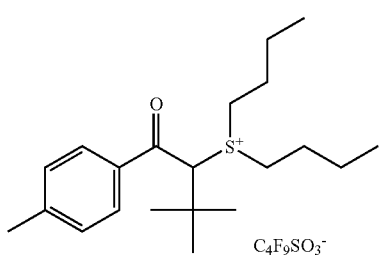
(z43)
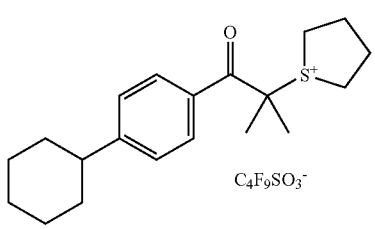
(z44)
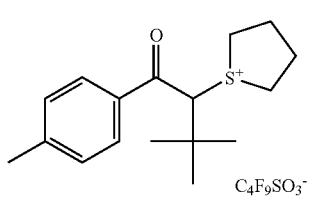
(z45)

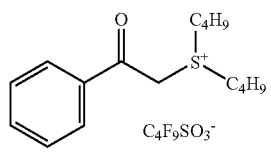
(z46)
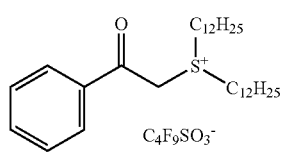
(z47)
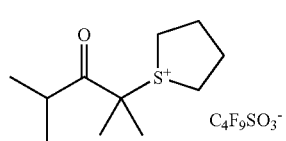
(z48)
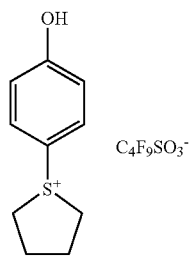
(z49)
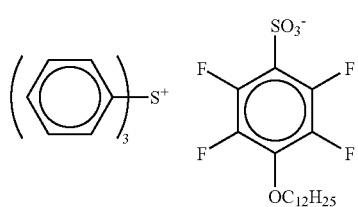
(z50)
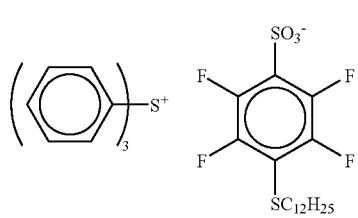
(z51)
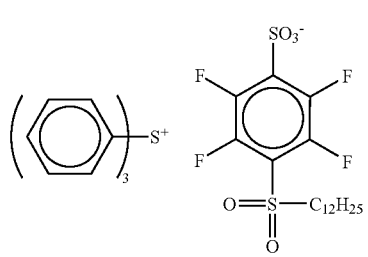
(z52)
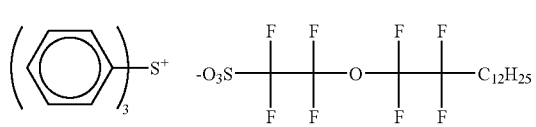
(z53)

-continued
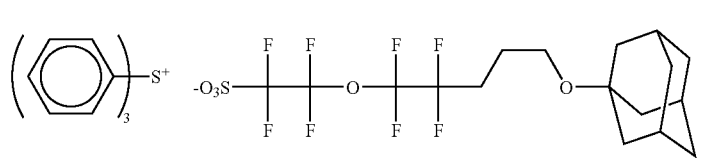 (z54)
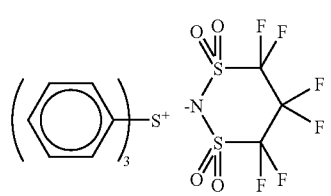 (z55)
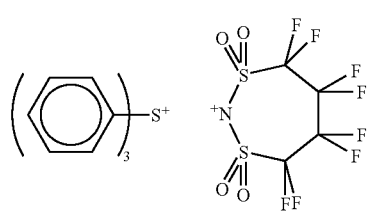 (z56)
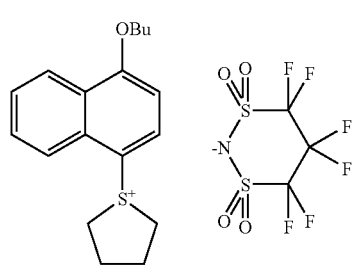 (z57)
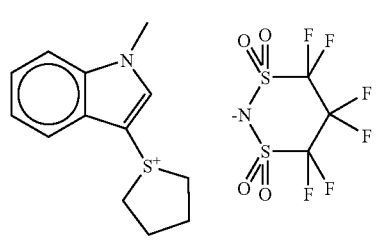 (z58)
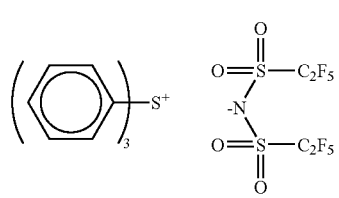 (z59)
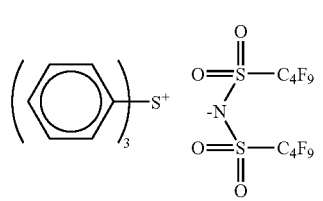 (z60)

(z61)
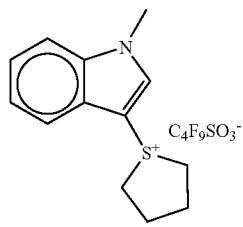
(z62)
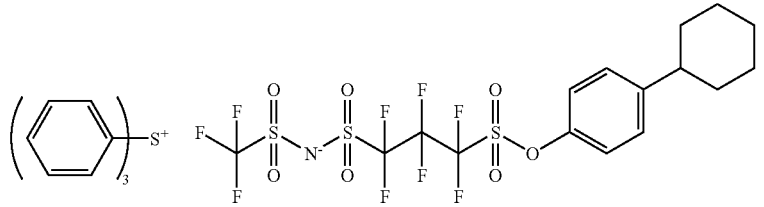
(z63)
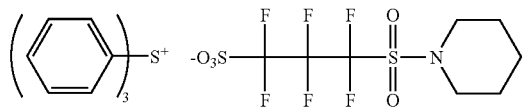
(z64)
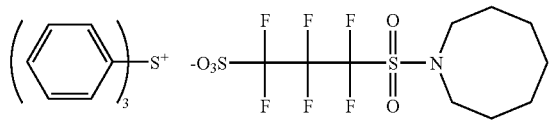
(z65)
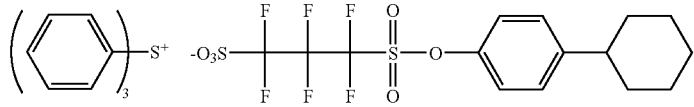
(z66)
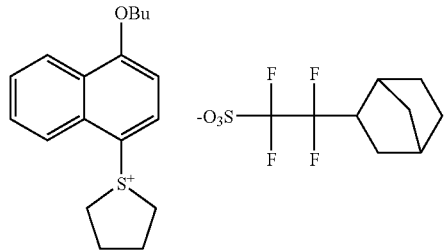
(z67)
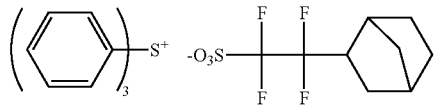
(z68)
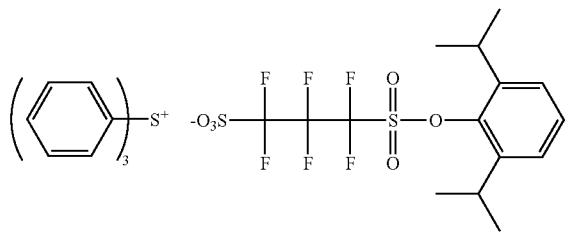

-continued
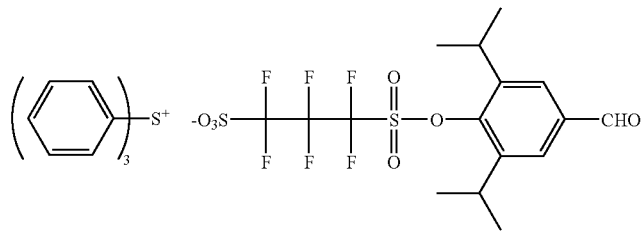
(z69)
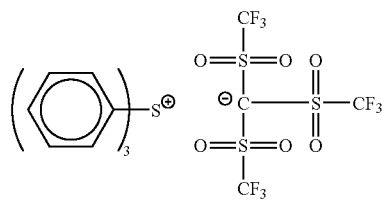
(z70)
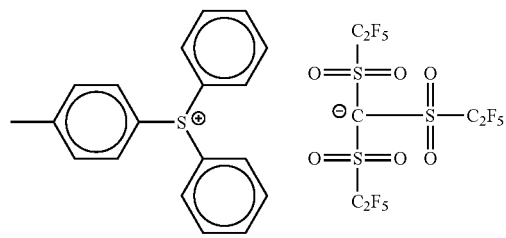
(z71)
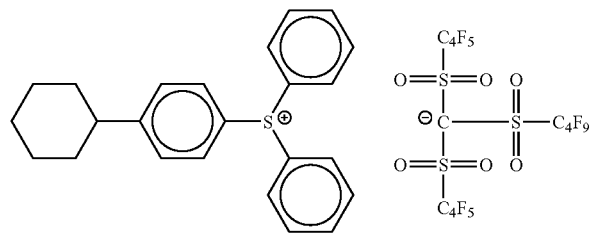
(z72)
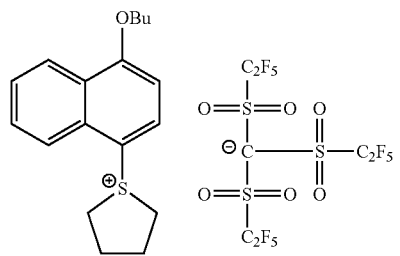
(z73)
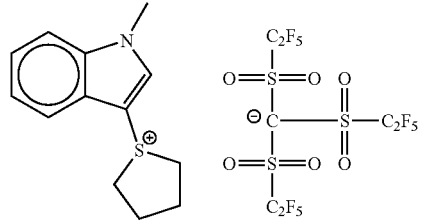
(z74)
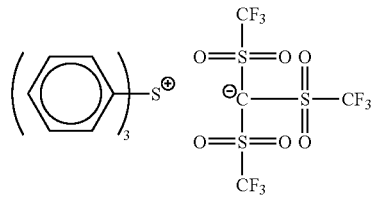
(z75)

-continued
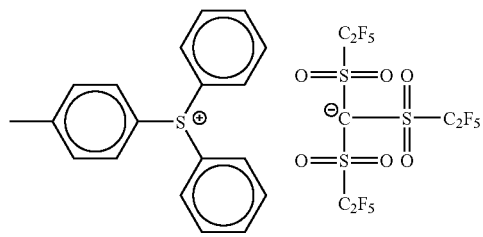
(z76)
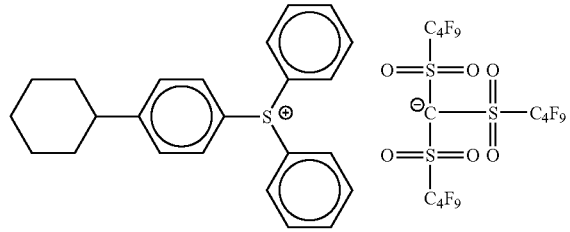
(z77)
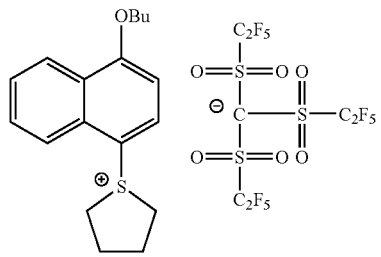
(z78)
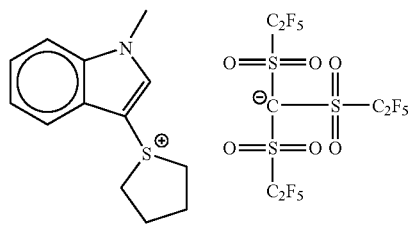
(z79)
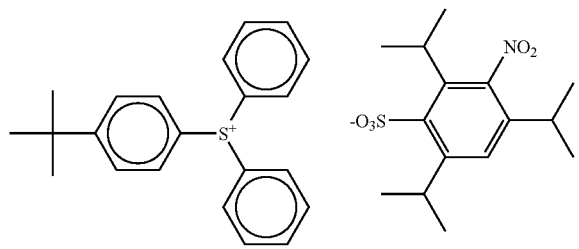
(z80)
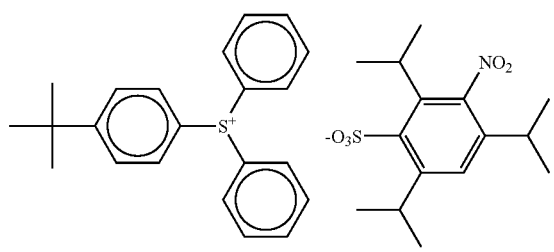
(z80)

-continued

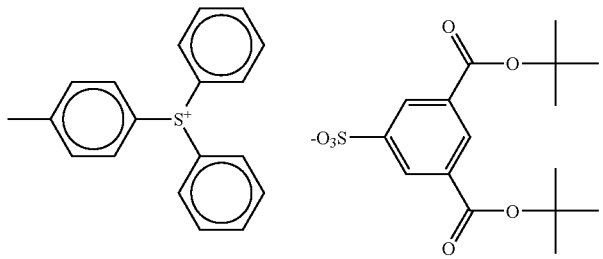

(z81)

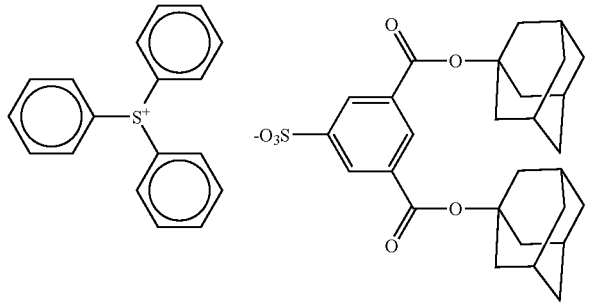

(z82)

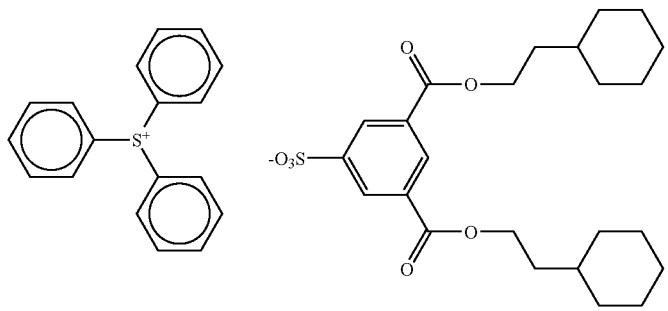

(z83)

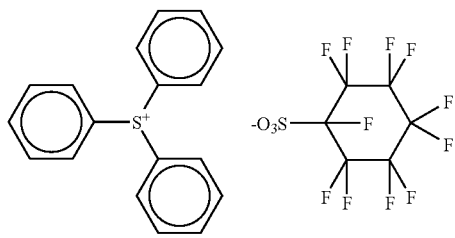

(z84)

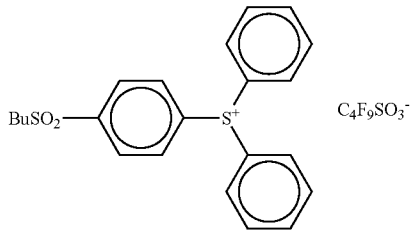

(z85)

One acid generator may be used alone, or two or more kinds of acid generators may be used in combination. In the case of using two or more kinds of acid generators in combination, compounds capable of generating two kinds of organic acids differing in the total atom number except for hydrogen atom by 2 or more are preferably combined.

The content of the acid generator is preferably from 0.1 to 20 mass %, more preferably from 0.5 to 10 mass %, still more preferably from 1 to 8 mass %, based on the entire solid content of the positive resist composition.

[3] (C) Resin Having at Least One Repeating Unit Selected from Fluorine Atom-Containing Repeating Units Represented by Formulae (1-1), (1-2) and (1-3), the Resin Being Stable to an Acid and Insoluble in an Alkali Developer The positive resist composition of the present invention comprises a resin having at least one repeating unit selected from fluorine atom-containing repeating units represented by the following formulae (1-1), (1-2) and (1-3), the resin being stable to an acid and insoluble in an alkali developer (sometimes referred to as a "resin as the component (C)").

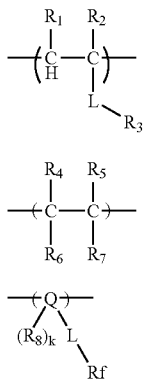

In formulae (1-1) to (1-3), $R_1$ represents a hydrogen atom or an alkyl group.

$R_2$ represents a fluoroalkyl group.

$R_3$ represents a hydrogen atom or a monovalent organic group.

$R_4$ to $R_7$ each independently represents a hydrogen atom, a fluorine atom, an alkyl group, a fluoroalkyl group, an alkoxy group or a fluoroalkoxy group, provided that at least one of $R_4$ to $R_7$ represents a fluorine atom, and $R_4$ and $R_5$, or $R_6$ and $R_7$ may combine to form a ring.

$R_8$ represents a hydrogen atom, a fluorine atom or a monovalent organic group.

Rf represents a fluorine atom or a fluorine atom-containing monovalent organic group.

L represents a single bond or a divalent linking group.

Q represents an alicyclic structure.

k represents an integer of 0 to 3.

In the resin as the component (C), the term "insoluble in an alkali developer" indicates that the resin as the component (C) does not contain an alkali-soluble group or a group which produces an alkali-soluble group under the action of an acid or an alkali developer. The dissolution rate of the resin as the component (C) in an alkali developing solution which is an aqueous 2.38 wt % tetramethylammonium hydroxide solution at 23° C., is preferably 0.1 nm/s or less.

Examples of the alkali-soluble group include a phenolic hydroxyl group, a carboxylic acid group, a fluorinated alcohol group, a sulfonic acid group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylsulfonyl)-methylene group and a tris(alkylcarbonyl)methylene group.

The alkyl group of $R_1$ in formula (1-1) is preferably a linear or branched alkyl group having a carbon number of 1 to 5, and examples thereof include a methyl group, an ethyl group, an n-propyl group, an isopropyl group, an n-butyl group, an isobutyl group, a sec-butyl group, a pentyl group, an isopentyl group, a neopentyl group and a tert-pentyl group.

$R_1$ is preferably a hydrogen atom.

The fluoroalkyl group of $R_2$ is, for example, a group formed by substituting at least one fluorine atom to the above-described linear or branched alkyl group having a carbon number of 1 to 5, and the fluoroalkyl group is preferably a perfluoroalkyl group.

$R_2$ is preferably a trifluoromethyl group.

The monovalent organic group of $R_3$ is, for example, a sole group selected from the group consisting of an alkyl group (preferably having a carbon number of 1 to 15), a cycloalkyl group (preferably having a carbon number of 3 to 15), a fluoroalkyl group (preferably having a carbon number of 1 to 15), a fluorocycloalkyl group (preferably having a carbon number of 3 to 15), an aryl group (preferably having a carbon number of 6 to 15), a fluoroaryl group (preferably having a carbon number of 6 to 15), an acyl group (preferably having a carbon number of 2 to 15) and an alkoxycarbonyl group (preferably having a carbon number of 2 to 15), or a group formed by combining two or more groups selected therefrom directly or through a divalent linking group.

The divalent linking group of L is, for example, a sole group selected from the group consisting of an alkylene group, an arylene group, an ether group, a thioether group, a carbonyl group, an ester group, an amido group, a urethane group and a urea group, or a combination of two or more groups selected therefrom.

The alkyl group and fluoroalkyl group of $R_4$ to $R_7$ in formula (1-2) are the same as the alkyl group and fluoroalkyl group of $R_1$ in formula (1-1).

The alkoxy group of $R_4$ to $R_7$ is preferably an alkoxy group having a carbon number of 1 to 5, and examples thereof include a methoxy group, an ethoxy group, a propoxy group and an n-butoxy group.

The fluoroalkoxy group of $R_4$ to $R_7$ is, for example, a group formed by substituting at least one fluorine atom to the above-described alkoxy group having a carbon number of 1 to 5.

Examples of the organic group of Rs in formula (1-3) are the same as those of the organic group of $R_3$ in formula (1-1).

The fluorine atom-containing monovalent organic group of Rf is, for example, a linear or branched alkyl group (preferably having a carbon number of 1 to 10) substituted by at least one fluorine atom, or a cycloalkyl group (preferably having a carbon number of 3 to 10) substituted by at least one fluorine atom.

The divalent linking group of L is, for example, a sole group selected from the group consisting of an alkylene group, an arylene group, an ether group, a thioether group, a carbonyl group, an ester group, an amido group, a urethane group and a urea group, or a combination of two or more groups selected therefrom.

The alicyclic structure of Q includes, for example, the following structures, but the present invention is not limited thereto. p represents an integer of 0 to 3.

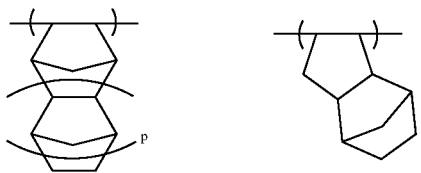

Formula (1-1) is preferably represented by any one of the following formulae (2-1) to (2-3):

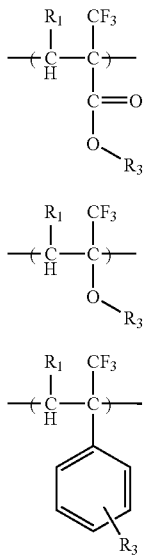

(2-1)

(2-2)

(2-3)

In formulae (2-1) to (2-3), $R_1$ represents a hydrogen atom or an alkyl group.

$R_3$ represents a hydrogen atom or a monovalent organic group.

$R_1$ and $R_3$ in formulae (2-1) to (2-3) have the same meanings as $R_1$ and $R_3$ in formula (1-1).

Formula (1-3) is preferably represented by any one of the following formulae (3-1) and (3-2):

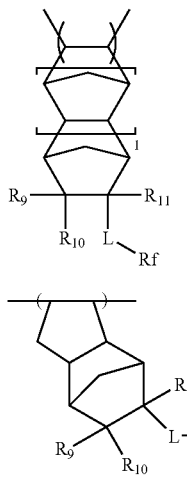

(3-1)

(3-2)

In formulae (3-1) and (3-2), $R_9$, $R_{10}$ and $R_{11}$ each independently represents a hydrogen atom, a fluorine atom or a monovalent organic group.

Rf represents a fluorine atom or a monovalent organic group having a fluorine atom.

L represents a single bond or a divalent linking group.

l represents 0 or 1.

Rf and L in formulae (3-1) and (3-2) have the same meanings as Rf and L in formula (1-3).

Examples of the monovalent organic group of $R_9$, $R_{10}$ and $R_{11}$ are the same as those of the monovalent organic group of $R_3$ in formula (1-1).

Specific examples of the repeating units represented by formulae (1-1), (1-2) and (1-3) are set forth below, but the present invention is not limited thereto.

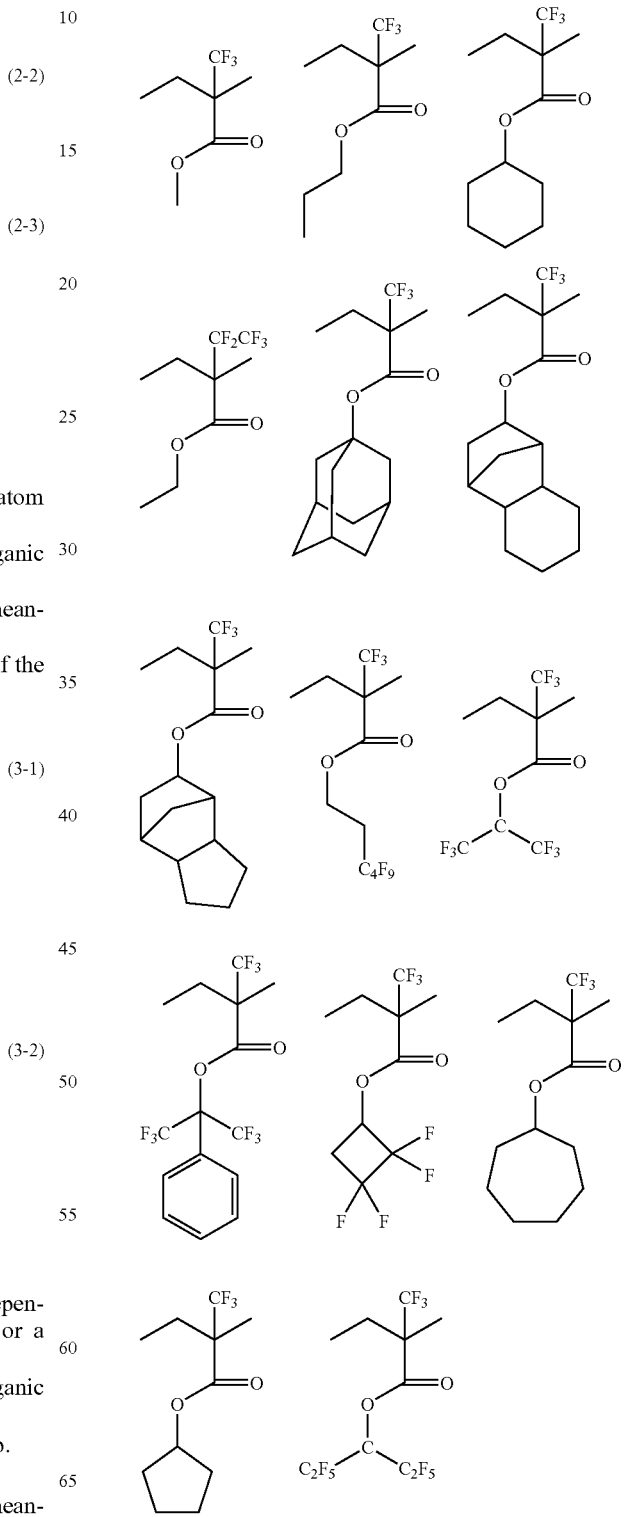

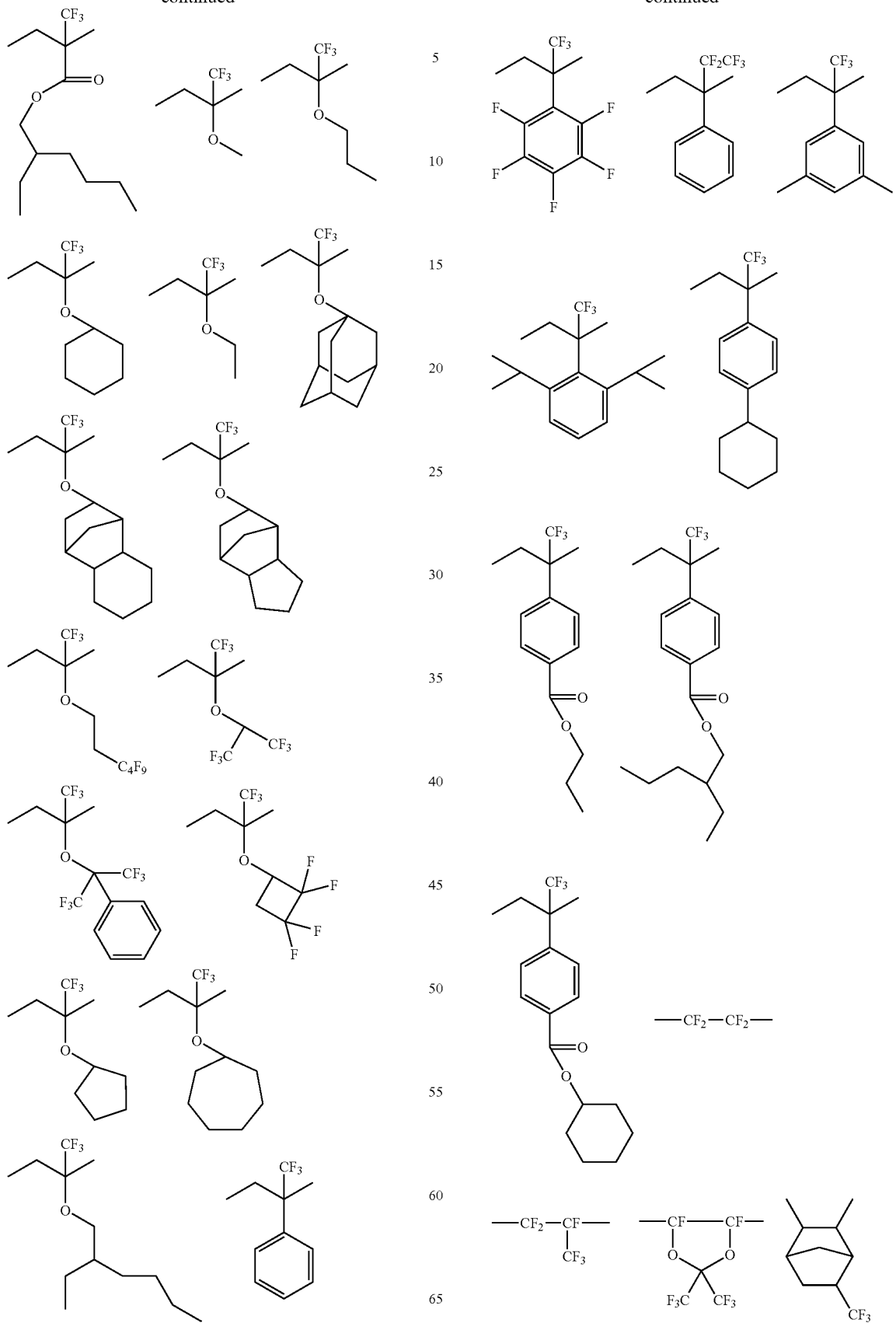

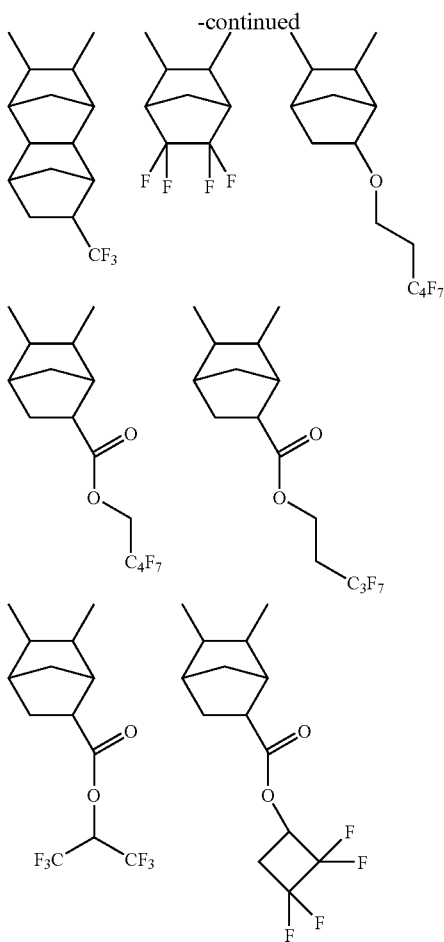

The resin as the component (C) may be a polymer comprising a repeating unit represented by formula (1-1), (1-2) or (1-3), or a polymer having a repeating unit represented by formula (1-1), (1-2) or (1-3) and other repeating units.

In the resin as the component (C), the content of the repeating unit represented by formula (1-1), (1-2) or (1-3) is preferably from 1 to 100 mol %, more preferably from 20 to 100 mol %, still more preferably from 50 to 100 mol %, based on the resin.

The resin as the component (C) may contain various repeating units other than the repeating units represented by formulae (1-1) to (1-3).

However, the repeating unit other than the repeating units represented by formulae (1-1) to (1-3) does not contain an alkali-soluble group or a group which produces an alkali-soluble group under the action of an acid or an alkali developer.

Examples of such a repeating unit include, but are not limited to, repeating units corresponding to the monomers described below.

Examples of the monomer include a compound having one addition-polymerizable unsaturated bond selected from acrylic acid esters, methacrylic acid esters, acrylamides, methacrylamides, allyl compounds, vinyl ethers, vinyl esters and styrenes.

Other than these, an addition-polymerizable unsaturated compound copolymerizable with the monomers corresponding to the above-described various repeating units may be copolymerized.

The weight average molecular weight of the resin as the component (C) is preferably from 1,000 to 100,000, more preferably from 1,000 to 50,000, still more preferably from 1,000 to 20,000.

The residual monomer amount in the resin as the component (C) is preferably from 0 to 10 mass %, more preferably from 0 to 5 mass %. Also, in view of the resolution, resist profile, and side wall, roughness or the like of the resist pattern, the molecular weight distribution (Mw/Mn, also called dispersity) is preferably from 1 to 5, more preferably from 1 to 3.

Similarly to the resin as the component (A), it is preferred that the resin as the component (C) has of course less impurities such as metal and also, the content of the residual monomer or oligomer component is not more than a specific value, for example, 0.1 mass % by BPLC. When these conditions are satisfied, not only the resist can be more improved in the sensitivity, resolution, process stability, pattern profile and the like but also a resist free of aging change in the in-liquid foreign matter, sensitivity and the like can be obtained.

The amount of metal components such as Na, K, Ca, Fe and Mg contained in the resin as the component (C) is preferably small. Specifically, the amount of each metal species contained in the resin is preferably 300 ppb or less, more preferably 200 ppb or less, still more preferably 100 ppb or less.

A film formed from the resin as the component (C) alone and a solvent preferably has a receding contact angle of 70° to 110°. The coating conditions are not particularly limited, and examples of the coating method include a spin-cast method.

The amount added of the resin as the component (C) is preferably from 0.1 to 5 mass %, more preferably from 0.2 to 4 mass %, still more preferably from 0.3 to 3 mass %, yet still more preferably from 0.3 to 1 mass %, based on the entire solid content of the positive resist composition. At this time, the receding contact angle of the resist film is from 50° to 90°, preferably from 60° to 80°.

With respect to the resin as the component (C), one species may be used or two or more species may be used.

The resin as the component (C) may be a commercially available product or may be synthesize by an ordinary method. For example, the resin may be obtained by general purification such as radical polymerization employed for the synthesis of the resin as the component (A). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent capable of dissolving the resist composition, such as propylene glycol monomethyl ether acetate, propylene glycol monomethyl ether and cyclohexanone.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). Together with the polymerization initiator, a chain transfer agent such as thiol compound may be used in combination. The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 20 to 50 mass %, and the reaction temperature is usually from 10 to 150° C., preferably from 30 to 120° C., more preferably from 60 to 100° C.

After the completion of reaction, the reactant is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only polymers having a molecular weight lower than a specific molecular weight; a reprecipitation method of adding dropwise the resin solution in a bad solvent to solidify the resin in the bad solvent and thereby remove residual monomers or the like; and a purification method in a solid state, such as washing of the resin with a bad solvent after separation by filtration. For example, the resin is precipitated as a solid through contact with a solvent in which the resin is sparingly soluble or insoluble (bad solvent) and which is in a volume amount of 10 times or less, preferably from 10 to 5 times, the reaction solution.

[4] (D) Solvent

The positive resist composition of the present invention is used by dissolving the above-described components in a predetermined solvent.

Examples of the solvent which can be used include an organic solvent such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the present invention, one solvent may be used alone or some solvents may be used as a mixture, but it is preferred to use a mixed solvent containing two or more kinds of solvents having different functional groups. By this use, the solubility of the material is enhanced and not only production of particles in aging can be suppressed but also a good pattern profile can be obtained. Preferred examples of the functional group contained in the solvent include an ester group, a lactone group, a hydroxyl group, a ketone group and a carbonate group. The mixed solvent having different functional groups is preferably a mixed solvent in any one of the following (S1) to (S5):

(S1) a mixed solvent prepared by mixing a hydroxyl group-containing solvent and a hydroxyl group-free solvent;

(S2) a mixed solvent prepared by mixing a solvent having an ester structure and a solvent having a ketone structure;

(S3) a mixed solvent prepared by mixing a solvent having an ester structure and a solvent having a lactone structure;

(S4) a mixed solvent prepared by mixing a solvent having an ester structure, a solvent having a lactone structure, and a hydroxyl group-containing solvent; and (S5) a mixed solvent prepared by mixing a solvent having an ester structure, a solvent having a carbonate structure, and a hydroxyl group-containing solvent.

By the use of such a mixed solvent, production of particles during storage of the resist solution can be reduced and generation of a defect at the coating can be suppressed.

Examples of the hydroxyl group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the hydroxy group-free solvent include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethyl sulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate, 2-heptanone and cyclohexanone are more preferred.

Examples of the solvent having a ketone structure include cyclohexanone and 2-heptanone, with cyclohexanone being preferred.

Examples of the solvent having an ester structure include propylene glycol monomethyl ether acetate, ethyl ethoxypropionate and butyl acetate, with propylene glycol monomethyl ether acetate being preferred.

Examples of the solvent having a lactone structure include γ-butyrolactone.

Examples of the solvent having a carbonate structure include propylene carbonate and ethylene carbonate, with propylene carbonate being preferred.

The mixing ratio (by mass) between the hydroxy group-containing solvent and the hydroxy group-free solvent is from 1/99 to 99/1, preferably from 10/90 to 90/10, more preferably from 20/80 to 60/40. A mixed solvent containing the hydroxy group-free solvent in a proportion of 50 mass % or more is particularly preferred in view of coating uniformity.

The mixing ratio (by mass) between the solvent having an ester structure and the solvent having a ketone structure is from 1/99 to 99/1, preferably from 10/90 to 90/10, more preferably from 40/60 to 80/20. A mixed solvent containing the solvent having an ester structure in a proportion of 50 mass % or more is particularly preferred in view of coating uniformity.

The mixing ratio (by mass) between the solvent having an ester structure and the solvent having a lactone structure is from 70/30 to 99/1, preferably from 80/20 to 99/1, more preferably from 90/10 to 99/1. A mixed solvent containing the solvent having an ester structure in a proportion of 70 mass % or more is particularly preferred in view of aging stability.

In the case of mixing a solvent having an ester structure, a solvent having a lactone structure and a hydroxyl group-containing solvent, the mixed solvent preferably contains from 30 to 80 wt % of the solvent having an ester structure, from 1 to 20 wt % of the solvent having a lactone structure, and from 10 to 60 wt % of the hydroxyl group-containing solvent.

In the case of mixing a solvent having an ester structure, a solvent having a carbonate structure and a hydroxyl group-containing solvent, the mixed solvent preferably contains from 30 to 80 wt % of the solvent having an ester structure, from 1 to 20 wt % of the solvent having a carbonate structure, and from 10 to 60 wt % of the hydroxyl group-containing solvent.

The preferred embodiment of the solvent which can be used in the present invention is a solvent containing an alkylene glycol monoalkyl ether carboxylate (preferably propylene glycol monomethyl ether acetate), more preferably a mixed solvent of an alkylene glycol monoalkyl ether carboxylate with other solvents, where the other solvent is at least one solvent having a functional group selected from a hydroxyl group, a ketone group, a lactone group, an ester group, an ether group and a carbonate group, or having a plurality of these functional groups in combination. The particularly preferable mixed solvent is a mixed solvent of at least one member selected from ethyl lactate, γ-butyrolactone, propylene glycol monomethyl ether, butyl acetate and cyclohexanone, with propylene glycol monomethyl ether acetate.

In the positive resist composition of the present invention, the solid content concentration is preferably from 3.0 to 10.0 mass %.

[5] (E) Basic Compound

The positive resist composition of the present invention preferably comprises a basic compound for reducing the change of performance in aging from exposure until heating, or controlling the in-film diffusion of an acid generated upon exposure.

The basic compound includes a nitrogen-containing basic compound and an onium salt compound. As for the preferred structure of the nitrogen-containing basic compound, the compound includes those having a partial structure represented by any one of the following formulae (A) to (E):

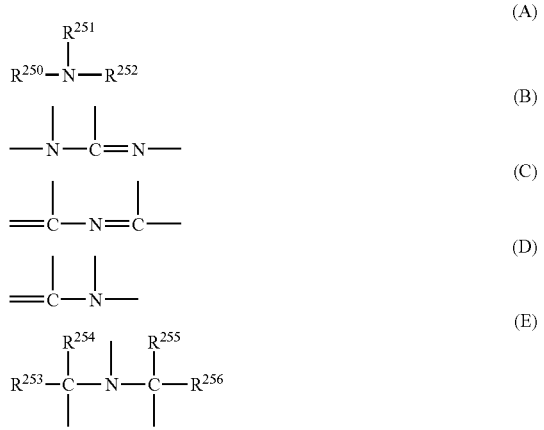

In formula (A), $R^{250}$, $R^{251}$ and $R^{252}$ each independently represents a hydrogen atom, an alkyl group having a carbon number of 1 to 20, a cycloalkyl group having a carbon number of 3 to 20, or an aryl group having a carbon number of 6 to 20, and $R^{250}$ and $R^{251}$ may combine with each other to form a ring. These groups each may have a substituent. The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These alkyl or cycloalkyl groups each may contain an oxygen atom, a sulfur atom or a nitrogen atom in the alkyl chain.

In formula (E), $R^{253}$, $R^{254}$, $R^{255}$ and $R^{256}$ each independently represents an alkyl group having a carbon number of 1 to 6, or a cycloalkyl group having a carbon number of 3 to 6.

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, and specific examples thereof include triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is converted into a carboxylate, and examples thereof include acetate, adamnantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dioctylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline and N,N-bis(hydroxyethyl)-p-toluidine.

The basic compound is more preferably an aniline derivative, still more preferably an aniline derivative in which an alkyl group having a carbon number of 1 to 20 or an alkyl group having a hydroxyl group and/or an ether bond is substituted on the nitrogen atom or the aromatic ring.

A tetraalkylammonium salt-type nitrogen-containing basic compound may also be used. Among these compounds, a tetraalkylammonium hydroxide having a carbon number of 1 to 8 (e.g., tetramethylammonium hydroxide, tetraethylammonium hydroxide, tetra-(n-butyl)ammonium hydroxide) is preferred.

One of these basic compounds may be used alone, or two or more species thereof may be used. The amount of the basic component used is usually from 0.001 to 10 mass %, preferably from 0.01 to 5 mass %, based on the solid content of the positive resist composition. The amount used is preferably 0.001 mass % or more for obtaining a sufficiently high addition effect and preferably 10 mass % or less in view of sensitivity or developability of the unexposed area.

[6] (F) Surfactant

The positive resist composition of the present invention preferably further comprises a surfactant, more preferably any one fluorine-containing and/or silicon-containing surfactant (a fluorine-containing surfactant, a silicon-containing surfactant or a surfactant containing both a fluorine atom and a silicon atom), or two or more species thereof When the positive resist composition of the present invention contains a surfactant, a resist pattern with good sensitivity, resolution and adhesion as well as less development defects can be obtained when an exposure light source of 250 nm or less, particularly 220 nm or less, is used.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K. K.); Florad FC430 and 431 (produced by Sumitomo 3M Inc.); Megafac F171, F173, F176, F189 and $R_{08}$ (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); and PF636 (produced by OMNOVA), PF656 (produced by OMNOVA), PF6320 (produced by OMNOVA) and PF6520 (produced by OMNOVA). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used as the surfactant. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) may be not only a binary copolymer but also a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megafac F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene))acrylate (or methacrylate), a copolymer of a $C_6F_{13}$ group-containing acrylate (or methacrylate) with a (poly(oxyethylene)) acrylate (or methacrylate) and a (poly-(oxypropylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers, polyoxyethylene alkylallyl ethers, polyoxyethylene-polyoxypropylene block copolymers, sorbitan aliphatic esters and polyoxyethylene sorbitan aliphatic esters.

One surfactant may be added alone, or several surfactants may be added in combination.

The amount of the surfactant used is preferably from 0.0001 to 2 mass %, more preferably from 0.001 to 1 mass %, based on the entire amount of the positive resist composition (excluding the solvent).

[7] (G) Dissolution Inhibiting Compound Capable of Decomposing Under the Action of an Acid to Increase the Solubility in an Alkali Developer and Having a Molecular Weight of 3,000 or Less (Hereinafter, Sometimes Referred to as a "Dissolution Inhibiting Compound")

The positive resist composition of the present invention may contain a dissolution inhibiting compound.

In order to prevent reduction in the transparency to light at 220 nm or less, the dissolution inhibiting compound is preferably an alicyclic or aliphatic compound containing an acid-decomposable group, such as acid-decomposable group-containing cholic acid derivatives described in *Proceeding of SPIE*, 2724, 355 (1996).

The molecular weight of the dissolution inhibiting compound is 3,000 or less, preferably from 300 to 3,000, more preferably from 500 to 2,500.

The amount of the dissolution inhibiting compound added is preferably from 1 to 30 mass %, more preferably from 2 to 20 mass %, based on the solid content of the positive resist composition.

Specific examples of the dissolution inhibiting compound are set forth below, but the present invention is not limited thereto.

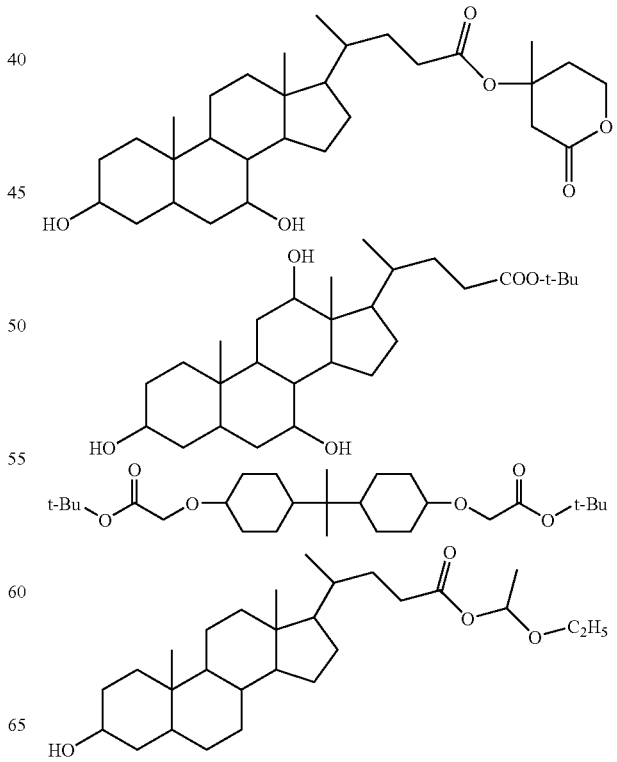

-continued

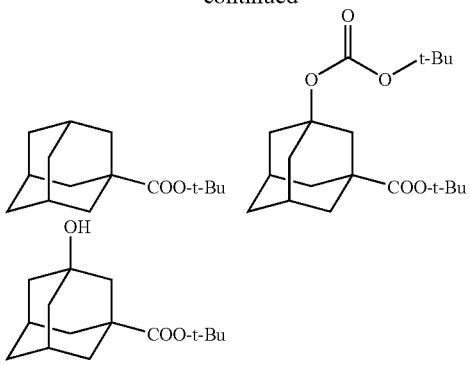

<Other Additives>

If desired, the positive resist composition of the present invention may further contain, for example, a dye, a plasticizer, a photosensitizer and a compound capable of accelerating the solubility in a developer.

The compound capable of accelerating the dissolution in a developer, which can be used in the present invention, is a low molecular compound containing two or more phenolic OH groups or one or more carboxy group and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the acid-decomposable resin. The amount added is preferably 50 mass % or less with a view to suppressing the development residue or preventing the deformation of pattern at the development.

The phenol compound having a molecular weight of 1,000 or less can be easily synthesized by one skilled in the art while referring to the method described, for example, in JP-A-4-122938, JP-A-2-28531, U.S. Pat. No. 4,916,210 and European Pat. No. 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

In the positive resist composition of the present invention, the amount of metal impurities contained in the positive resist composition is preferably 100 ppb or less, more preferably 20 ppb or less, still more preferably 5 ppb or less. Examples of the metal impurity contained in the positive resist composition include Na, K, Ca, Fe, Mg, Mn, Pd, Ni, Zn, Pt, Ag and Cu.

Examples of the method for reducing the amount of metal impurities contained in the positive resist composition include a method of dissolving the positive resist resin in a solvent and filtering the obtained solution through an ion exchange filter.

Examples of the process for producing the positive resist composition of the present invention include a production process of a positive resist composition, comprising a step of filtering a solution containing the resin as the component (A) through an ion exchange filter, a step of adding a photoacid generator and if desired, an organic basic compound, a surfactant and the like to the solution to prepare a mixed solution, and a step of filtering the mixed solution through an insoluble colloid-removing filter.

Known examples of the method for reducing metal impurities of an organic polymer in general include liquid separation-washing and a treatment with an acidic ion exchange resin or chelate resin, but a treatment using an acid is not preferred because in the case of a resist composition containing an acid-decomposable compound, it is generally difficult to efficiently treat metal impurities and at the same time, maintain the stability during the treatment.

The positive resist composition of the present invention is used by dissolving the components described above in a predetermined organic solvent, preferably in the above-described mixed solvent, filtering the solution, and coating it on a predetermined support as follows. The filter used for filtering is preferably a filter made of polytetrafluoroethylene, polyethylene or nylon and having a pore size of 0.1 micron or less, more preferably 0.05 microns or less, still more preferably 0.03 microns or less.

For example, the positive resist composition is coated on a substrate (e.g., silicon/silicon dioxide-coated substrate) as those used in the production of precision integrated circuit devices, to an arbitrary thickness (usually from 50 to 500 nm) by an appropriate coating method such as spinner or coater. After the coating, the composition is dried by spinning or baking to form a resist film. The baking temperature may be appropriately set but is usually from 60 to 150° C., preferably from 90 to 130° C.

Subsequently, the resist film is exposed through a mask or the like to form a pattern.

The exposure amount may be appropriately set but is usually from 1 to 100 mJ/cm$^2$. After the exposure, spinning and/or baking is preferably performed, and the resist film is then developed and rinsed to obtain a pattern.

Before and after exposure, a step of washing the resist film surface may be applied. The solvent used for the washing is preferably pure water, but the solvent is not limited thereto as long as it does not dissolve the resist film.

The exposure may be performed by filling a liquid (immersion medium) having a refractive index higher than that of air between the photosensitive film and a lens at the irradiation with actinic rays or radiation (immersion exposure). By this exposure, the resolution can be enhanced. The immersion medium used is preferably pure eater, but any liquid may be used as long as it has a refractive index higher than that of air. Also, in order to prevent the immersion medium and the photosensitive film from coming into direct contact at the immersion exposure, an overcoat layer may be further provided on the photosensitive film. In this case, the composition can be restrained from dissolving out into the immersion medium from the photosensitive film, and the development defects can be reduced.

Examples of the actinic rays or radiation include infrared light, visible light, ultraviolet light, far ultraviolet light, X-ray and electron beam, but the radiation is preferably far ultraviolet light at a wavelength of 250 nm or less, more preferably 220 nm or less. Specific examples thereof include KrF excimer laser light (248 nm), ArF excimer laser light (193 nm), $F_2$ excimer laser light (157 nm), X-ray and electron beam. ArF excimer laser light, $F_2$ excimer laser light, EUV (13 nm) and electron beam are preferred.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type comprising a light absorbent and a polymer material. Also, the organic antireflection film may be a commercially available organic antireflection film such as DUV30 Series and DUV-40 Series produced by Brewer Science, Inc., and AR-2, AR-3 and AR-S produced by Shipley Co., Ltd.

In the development step, an alkali developer is used as follows. The alkali developer which can be used for the resist composition is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimetylethanolamine and triethanolamine, quaternary ammonium salts such as tetramethylammonium hydroxide and tetraethylammonium hydroxide, and cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

The development time is preferably from 30 to 90 seconds.

The development step may be performed by puddle development where the developer in a static or low-speed rotation state forms a puddle at the resist film surface on a wafer, or puddleless development of not forming a puddle by keeping a high-speed rotation state. The puddle indicates a state such that the developer entirely covers the wafer surface and at the same time, the developer is staying on the wafer.

After the development or rinsing, the developer or rinsing solution adhering on the pattern may removed by a supercritical fluid.

The positive resist composition of the present invention may be applied to a multilayer resist process (particularly, a three-layer resist process). The multilayer resist process comprises the following steps:

(a) forming a lower resist layer comprising an organic material on a substrate to be processed, (b) sequentially stacking on the lower resist layer an interlayer and an upper resist layer comprising an organic material capable of crosslinking or decomposing upon irradiation with radiation, and (c) forming a predetermined pattern on the upper resist layer and then sequentially etching the intermediate layer, the lower layer and the substrate.

In general, an organopolysiloxane (silicone resin) or $SiO_2$ coating solution (SOG) is used for the intermediate layer. As for the lower layer resist, an appropriate organic polymer film is used, but various known photoresists may be used. Examples thereof include various Series such as FH Series and FHi Series produced by Fuji Film Arch Co., Ltd. and PFI Series produced by Sumitomo Chemical Co., Ltd.

The film thickness of the lower resist layer is preferably from 0.1 to 4.0 μm, more preferably from 0.2 to 2.0 μm, still more preferably from 0.25 to 1.5 μm. The film thickness is preferably 0.1 μm or more in view of antireflection or dry etching resistance and preferably 4.0 μm or less in the light of aspect ratio or pattern falling of the formed fine pattern.

EXAMPLES

The present invention is described in greater detail below by referring to Examples, but the present invention should not be construed as being limited thereto.

Synthesis Example 1

Synthesis of Resin (15)

Monomer-1, Monomer-2 and Monomer-3 represented by the structural formulae below were charged at a ratio (by mol) of 50/20/30 and dissolved in PGMEA (propylene glycol monomethyl ether acetate)/PGME (propylene glycol monomethyl ether)=7/3 (by mass) to prepare 450 g of a solution having a solid content concentration of 15 mass %. To this solution, polymerization initiator V-601 produced by Wako Pure Chemical Industries, Ltd. was added to a concentration of 1 mol %. In a nitrogen atmosphere, the resulting solution was added dropwise over 6 hours to 50 g of a mixed solution of PGMEA (propylene glycol monomethyl ether acetate)/PGME (propylene glycol monomethyl ether)=7/3 (by mass) heated at 100° C. After the completion of dropwise addition, the reaction solution was stirred for 2 hours. After the completion of reaction, the reaction solution was cooled to room temperature and crystallized from 5 L of a mixed solvent of hexane/ethyl acetate=9/1, and the white powder precipitated was collected by filtration to recover the objective Resin (15).

The polymer compositional ratio (by mol) determined from NMR was 50/20/30. Also, the weight average molecular weight determined by GPC measurement and calculated in terms of the standard polystyrene was 8,300, and the dispersity was 1.8.

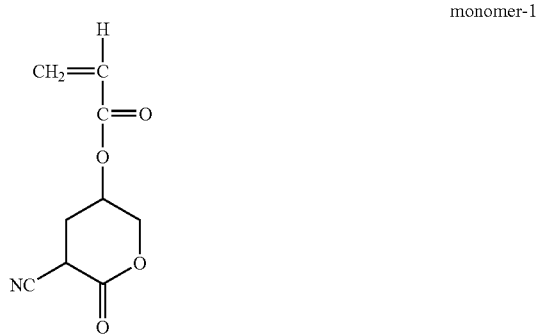

monomer-1

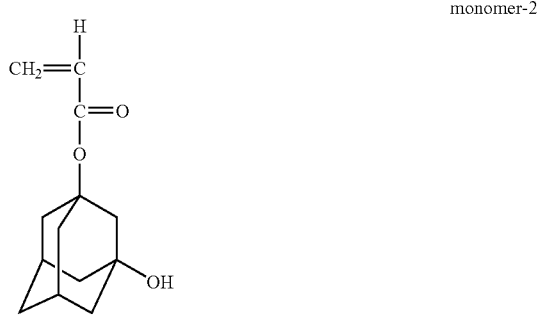

monomer-2

-continued
monomer-3
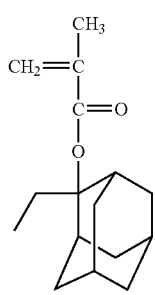
The resins as the component (A) were synthesized in the same manner as in Synthesis Example 1 by changing the kind of monomer, the amount charged, the solid content concentration, the reprecipitation solvent and the like.
The structures of Resins (1) to (26) as the component (A) used in Examples are shown below.
(1)
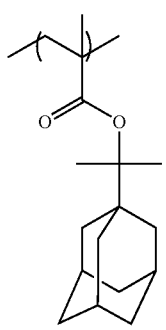
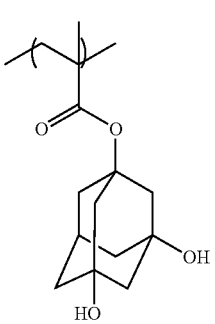
(2)
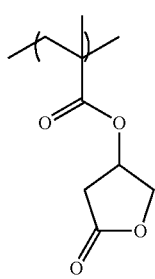
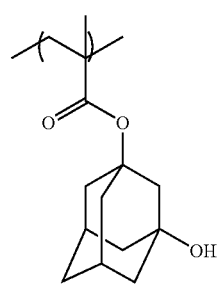
-continued
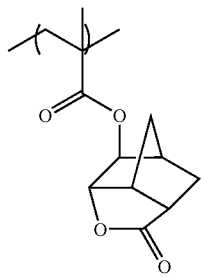
(3)
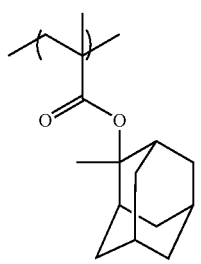 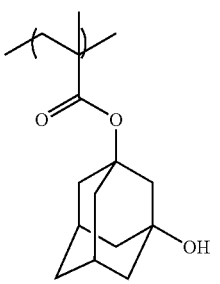
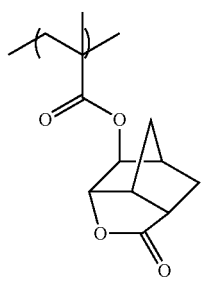
(4)
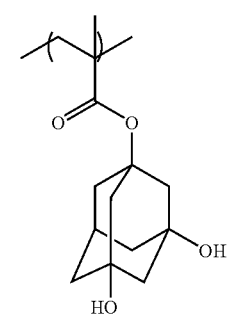
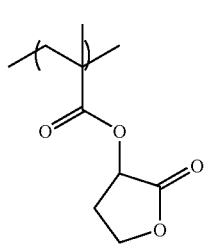

-continued
(5)
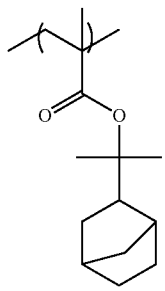 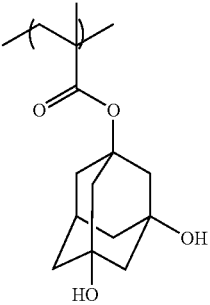
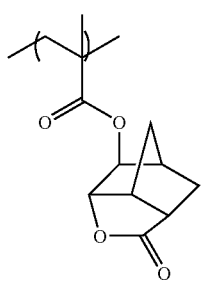
(6)
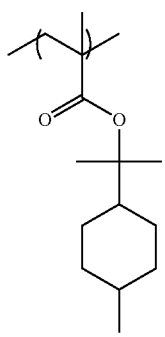 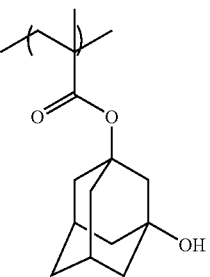
(7)
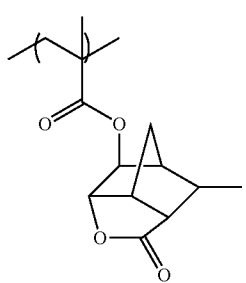
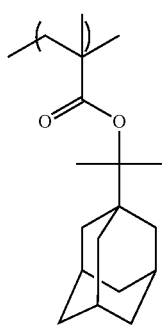 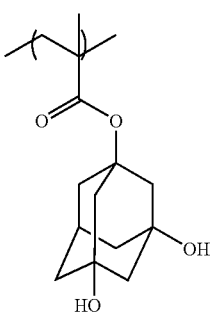
-continued
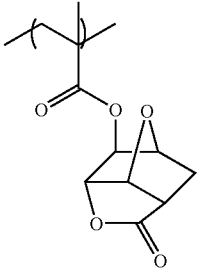
(8)
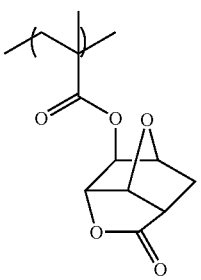
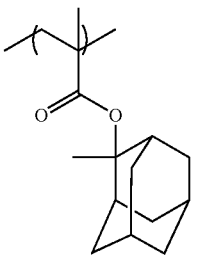
(9)
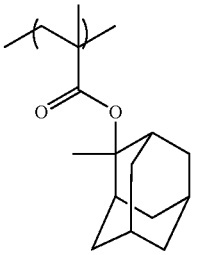
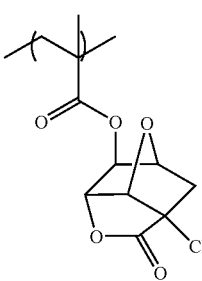

-continued
(10)
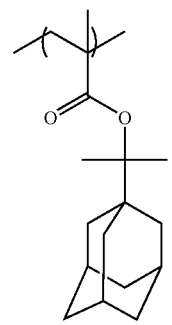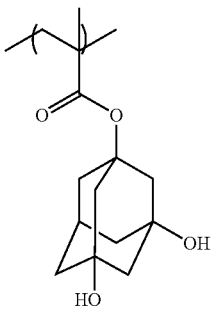
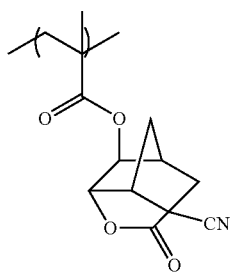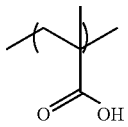
(11)
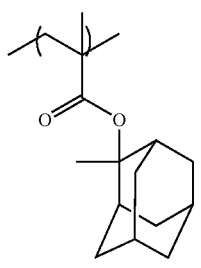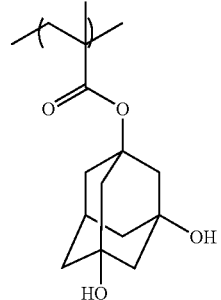
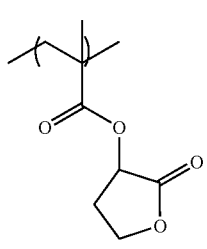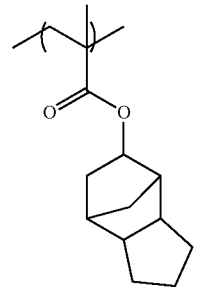
(12)
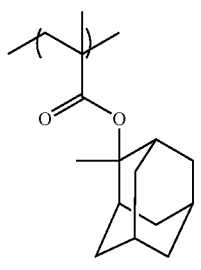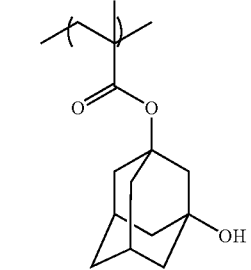
-continued
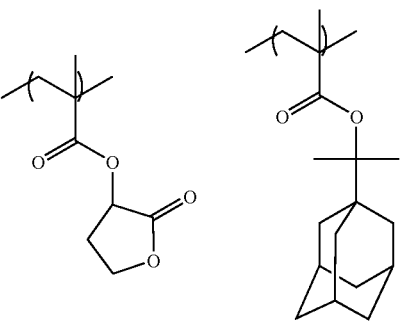
(13)
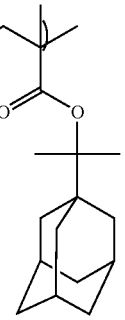
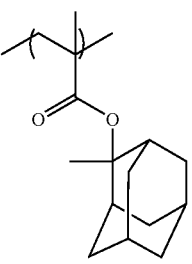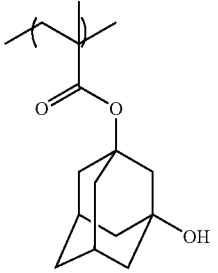
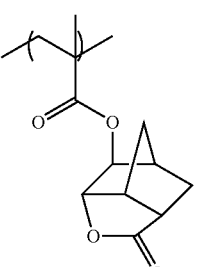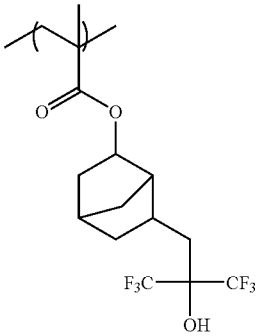
(14)
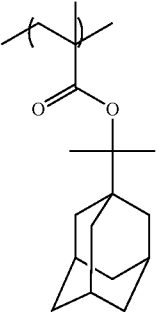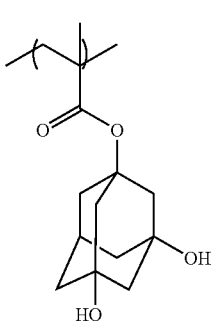
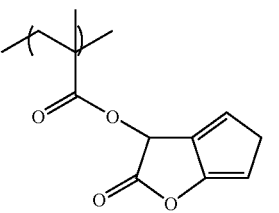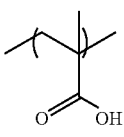

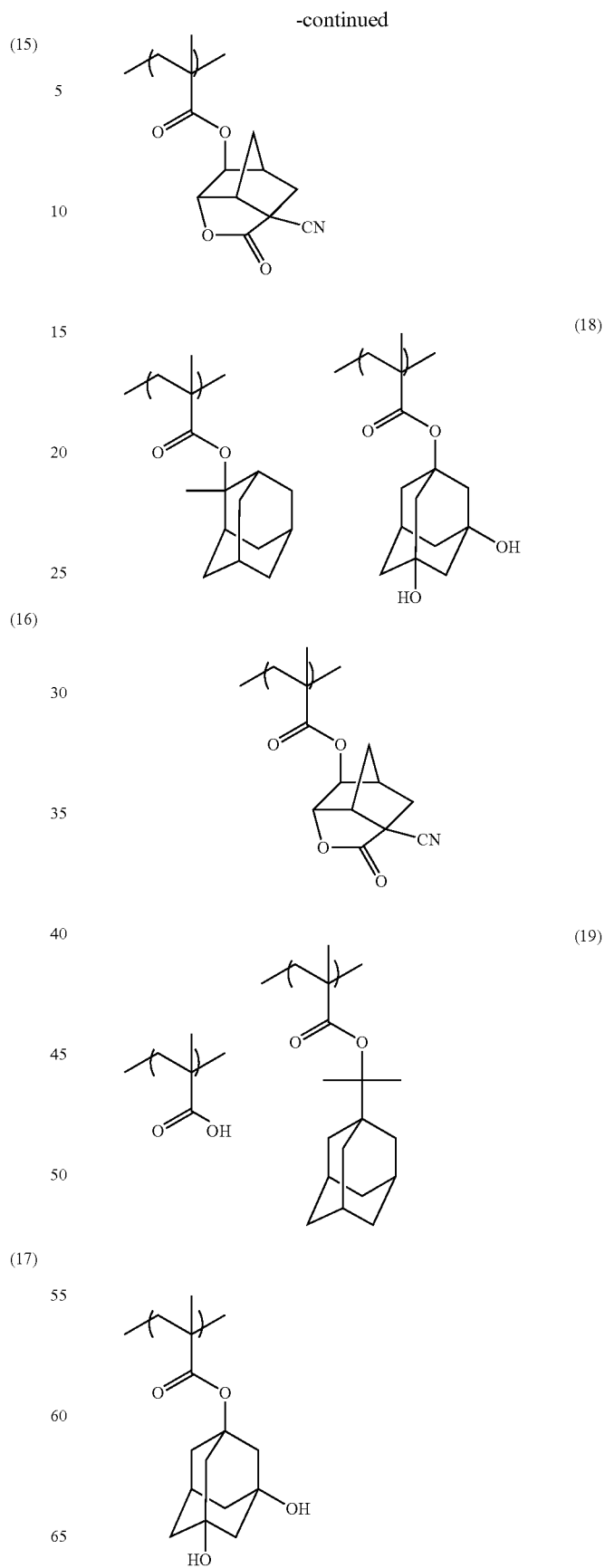

-continued
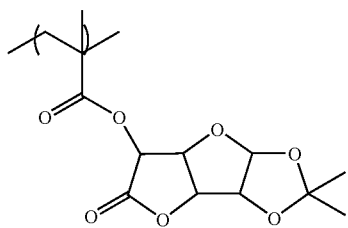
(20)
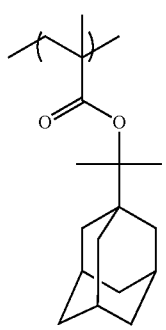 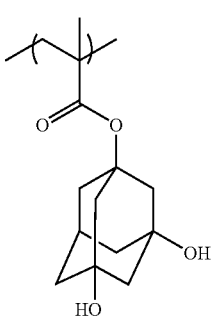
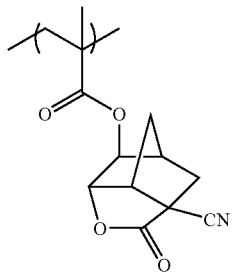 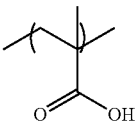
(21)
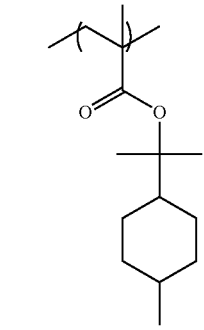 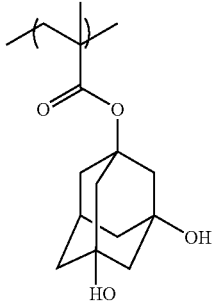
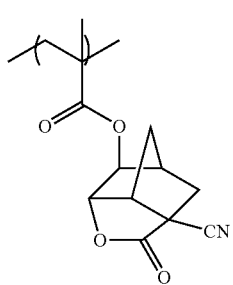
-continued
(22)
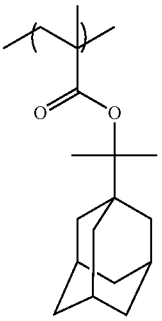 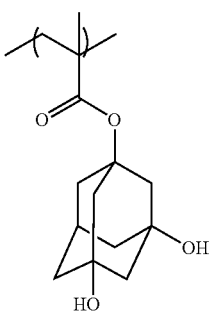
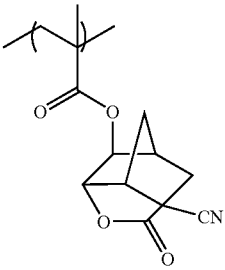
(23)
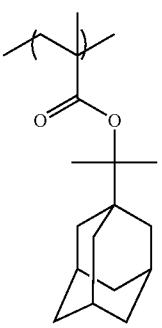 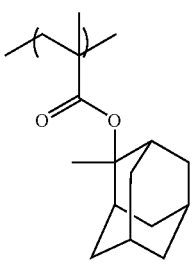
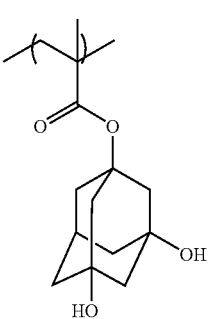 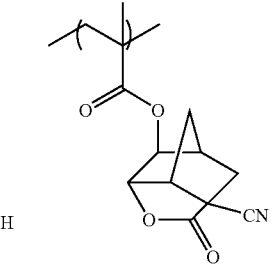
(24)
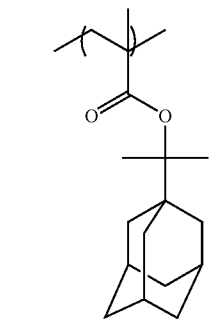 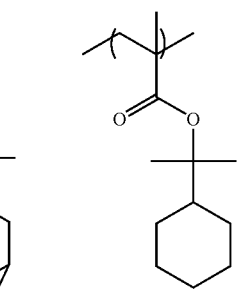

-continued

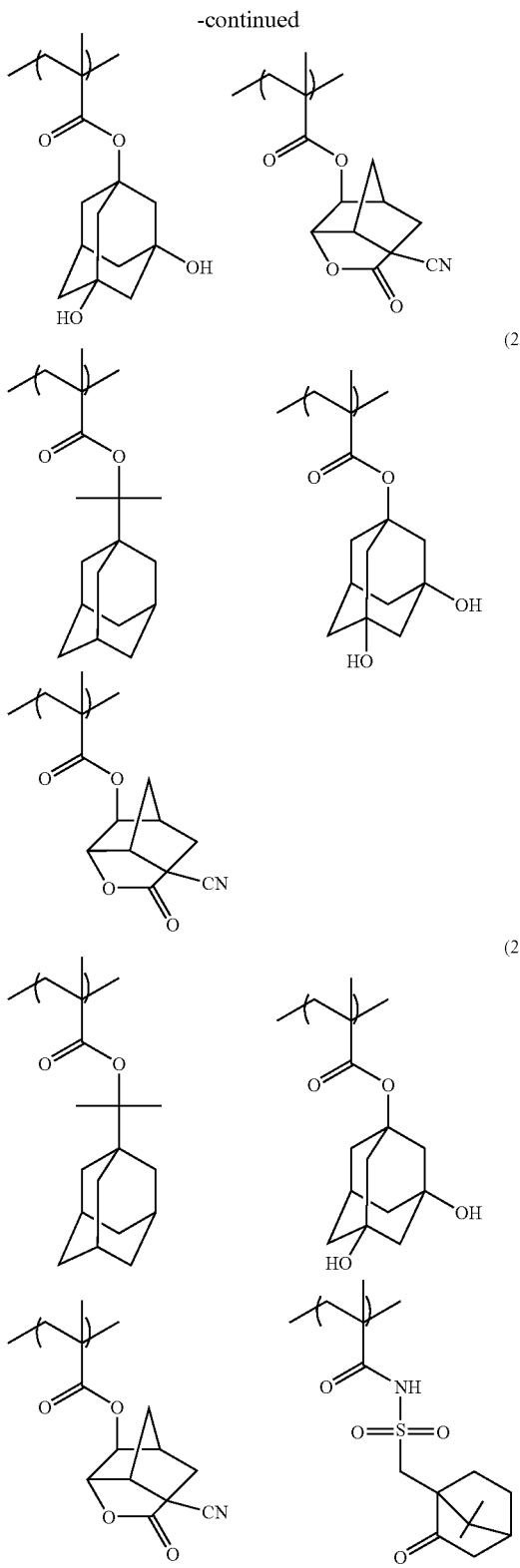

The compositional ratio (by mol), the weight average molecular weight (Mw) and the dispersity (Mw/Mn) of Resins (1) to (26) as the component (A) are shown in Table 1 below. The compositional ratio is a ratio of repeating units from the left in each of Resins (1) to (26).

TABLE 1

| Resin | Compositional Ratio (molar ratio) | Mw | Mw/Mn |
|---|---|---|---|
| 1 | 30/35/35 | 8800 | 2.5 |
| 2 | 40/30/30 | 18500 | 1.8 |
| 3 | 40/25/35 | 6600 | 1.9 |
| 4 | 25/35/50 | 8200 | 2.3 |
| 5 | 35/45/20 | 11000 | 2.2 |
| 6 | 30/30/40 | 10300 | 1.6 |
| 7 | 40/20/40 | 8300 | 2.4 |
| 8 | 40/20/40 | 7700 | 2.0 |
| 9 | 25/45/30 | 8400 | 1.4 |
| 10 | 40/20/30/10 | 8800 | 1.9 |
| 11 | 30/20/30/20 | 6400 | 1.7 |
| 12 | 25/25/35/15 | 7000 | 2.1 |
| 13 | 30/30/30/10 | 8900 | 2.5 |
| 14 | 40/15/30/15 | 9300 | 2.1 |
| 15 | 30/20/50 | 8300 | 1.8 |
| 16 | 40/10/40/10 | 5000 | 2.6 |
| 17 | 40/25/35 | 8500 | 2.2 |
| 18 | 40/15/45 | 9600 | 1.8 |
| 19 | 10/30/20/40 | 7500 | 1.5 |
| 20 | 10/30/20/40 | 5500 | 1.6 |
| 21 | 40/20/40 | 9100 | 1.7 |
| 22 | 30/20/50 | 8300 | 1.7 |
| 23 | 20/20/20/40 | 8000 | 1.6 |
| 24 | 10/30/10/50 | 8200 | 1.5 |
| 25 | 40/20/40 | 6000 | 1.5 |
| 26 | 40/15/35/10 | 7800 | 1.7 |

Synthesis Example 2

Synthesis of Resin (C-1-1)

Methyl α-trifluoromethacrylate and norbornene were charged at a ratio of 50/50 (by mol) and dissolved in propylene glycol monomethyl ether acetate to prepare 450 g of a solution having a solid content concentration of 22 mass %. To this solution, polymerization initiator V-601 produced by Wako Pure Chemical Industries, Ltd. was added to a concentration of 5 mol %. In a nitrogen atmosphere, the resulting solution was added dropwise over 2 hours to 50 mL of propylene glycol monomethyl ether acetate heated at 80° C. After the completion of dropwise addition, the solution was stirred for 2 hours to obtain a reaction solution. After the completion of reaction, the reaction solution was cooled to room temperature and crystallized from a 10-fold amount of a mixed solvent of hexane/ethyl acetate=90/10, and the white powder precipitated was collected by filtration to recover the objective Resin (C-1-1).

The compositional ratio (by mol) of Resin (C-1-1) determined from $^{13}$CNMR was 50/50. Also, the weight average molecular weight determined by the GPC measurement and calculated in terms of standard polystyrene was 13,200, and the dispersity was 2.2.

Resins (C-1-2) to (C-1-4), (C-2) to (C-3), (C-4-1) to (C-4-4) and (C-5) to (C-8) were synthesized in the same manner as in Synthesis Example 2 by appropriately changing the kind of monomer, the amount of monomer charged, the solid content concentration or the like.

Synthesis Example 3

Synthesis of Resin (C-9)

A 1,1,2-trichloro-trifluoroethylene 150 ml solution containing 57.6 g (0.20 mol) of 2-hexafluoropropanyl-(5-norbornene)-2-carboxylate was charged in a 1 L-volume autoclave, and the system was pressurized to 200 psi in a nitrogen atmosphere. Furthermore, 20 g (0.20 mol) of tetrafluoroethylene was poured thereinto, and the mixture was heated at 50° C. under stirring. In this reaction solution, a 1,1,2-trichlorotrifluoroethylene 15 ml solution containing 1.2 g of di(4-tert-butylcyclohexyl)peroxydicarbonate was poured over 20 minutes, and the stirring was further continued for 20 hours. After the completion of reaction, the reaction solution was charged into 2 L of methanol while vigorously stirring to precipitate Resin (C-9) as a white powder.

The obtained Resin (C-9) was measured by gel permeation chromatography (GPC) and found to have a weight average molecular weight of 15,000 and a dispersity of 2.7. Also, the polymer compositional ratio determined from 1H-NMR, 13C-NMR and 19F-NMR was 50/50.

Resin (C-10) was synthesized in the same manner as in Synthesis Example 3 by appropriately changing the kind of monomer, the amount of monomer charged, the solid content concentration or the like.

The structures of Resins (C-1-2) to (C-1-4), (C-2), (C-3), (C-4-1) to (C-4-4) and (C-5) to (C-10) as the component (C) are shown below.

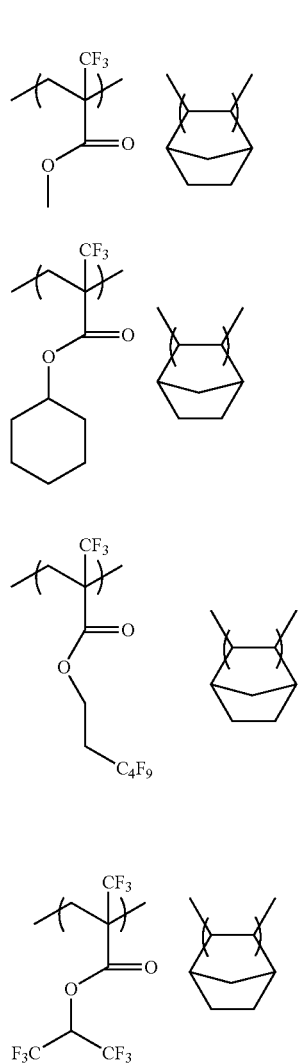

(C-1-1) (C-1-2) (C-1-3) (C-1-4)

(C-2)

(C-3)

(C-4-1) (C-4-2) (C-4-3) (C-4-4)

-continued

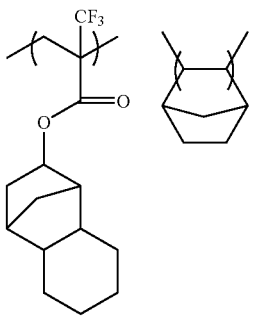

(C-5)

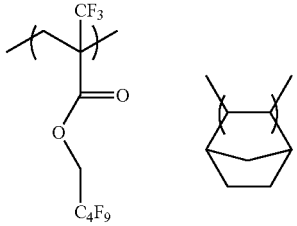

(C-6)

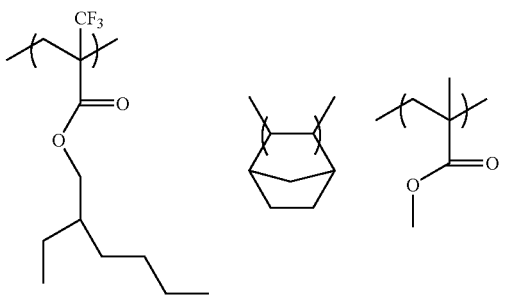

(C-7)

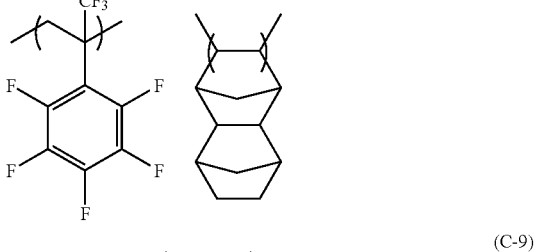

(C-8)

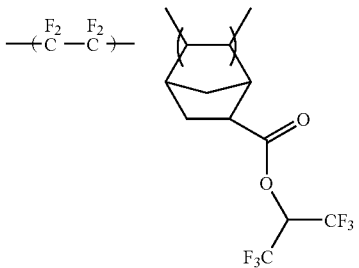

(C-9)

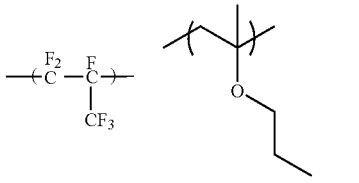

(C-10)

The compositional ratio (by mol), the weight average molecular weight (Mw) and the dispersity (Mw/Mn) of each of Resins (C-1-2) to (C-1-4), (C-2), (C-3), (C-4-1) to (C-4-4) and (C-5) to (C-10) as the component (C) are shown in Table 2 below. The compositional ratio is a ratio of repeating units from the left in each of Resins (C-1-2) to (C-1-4), (C-2), (C-3), (C-4-1) to (C-4-4) and (C-5) to (C-10).

TABLE 2

| Resin | Composition | Mw | Mw/Mn |
|---|---|---|---|
| C-1-1 | 50/50 | 13200 | 2.2 |
| C-1-2 | 50/50 | 2800 | 3.3 |
| C-1-3 | 50/50 | 60000 | 2.9 |
| C-1-4 | 50/50 | 25000 | 2.5 |
| C-2 | 50/50 | 5000 | 1.9 |
| C-3 | 45/45/10 | 25000 | 2.3 |
| C-4-1 | 50/50 | 9000 | 2.2 |
| C-4-2 | 50/50 | 6800 | 1.8 |
| C-4-3 | 50/50 | 5500 | 1.5 |
| C-4-4 | 50/50 | 5000 | 1.1 |
| C-5 | 50/50 | 4000 | 2.6 |
| C-6 | 50/50 | 20000 | 2.5 |
| C-7 | 50/50 | 9000 | 2.4 |
| C-8 | 50/50 | 40000 | 2.9 |
| C-9 | 50/50 | 15000 | 2.7 |
| C-10 | 20/80 | 10000 | 2.2 |

Examples 1 to 48 and Comparative Examples 1 and 2

Preparation of Resist

The components shown in Tables 3 to 6 below were dissolved in a solvent to prepare a solution having a solid content concentration of 7 mass %, and the obtained solution was filtered through a 0.1-m polyethylene filter to prepare a positive resist solution. The positive resist solutions prepared were evaluated by the following methods, and the results are shown in Tables 3 to 6. As for each component in Tables 3 to 6, when a plurality of species were used, the ratio is a ratio by mass.

[Image Performance Test]

(Exposure Condition (1))

An organic antireflection film, ARC29A (produced by Nissan Chemical Industries, Ltd.), was coated on a silicon wafer and baked at 205° C. for 60 seconds to form a 78-nm antireflection film, and the positive resist solution prepared above was coated thereon and baked for 60 seconds at a PB temperature shown in Tables 7 and 8 to form a 250-nm resist film. The obtained wafer was subjected to pattern exposure by using an ArF excimer laser scanner (PAS5500/1100, manufactured by ASML, NA: 0.75, o/i=0.85/0.55). Thereafter, the resist film was heated for 90 seconds at a PEB temperature shown in Tables 7 and 8, developed with an aqueous tetramethylammonium hydroxide solution (2.38 mass %) for a time period shown in Tables 7 and 8, rinsed with pure water and spin-dried to obtain a resist pattern.

(Exposure Condition (2))

This condition is for forming a resist pattern by an immersion exposure method using pure water.

An organic antireflection film, ARC29A (produced by Nissan Chemical Industries, Ltd.), was coated on a silicon wafer and baked at 205° C. for 60 seconds to form a 78-nm antireflection film, and the positive resist solution prepared above was coated thereon and baked for 60 seconds at a PB temperature shown in Tables 7 and 8 to form a 250-nm resist film. The obtained wafer was subjected to pattern exposure by using an ArF excimer laser immersion scanner (NA: 0.75). The immersion liquid used was ultrapure water. Thereafter, the resist film was heated for 80 seconds at a PEB temperature shown in Tables 7 and 8, developed with an aqueous tetramethylammonium hydroxide solution (2.38 mass %) for a time period shown in Tables 7 and 8, rinsed with pure water and spin-dried to obtain a resist pattern.

[Profile]

The profile of the obtained pattern was observed by a scanning electron microscope (S-4800, manufactured by Hitachi, Ltd.) and evaluated. Also, the line width in the pattern cross-section was measured at three points of (a) pattern top, (b) pattern midside and (c) pattern-substrate interface, and the profile was defined as "rectangular" when the difference in the line width among (a) to (c) was less than 5%; as "forwardly tapered" when the line width of (a) is 5% or more smaller than that of (b) and the line width of (b) is 5% or more smaller than that of (c); as "reversedly tapered" when the line width of (a) is 5% or more larger than that of (b) and the line width of (b) is 5% or more larger than that of (c); as "fitting" when the difference in the line width between (a) and (b) is less than 5% and the line width of (b) is 5% or more larger than that of (c); and as "T-Top" when the difference in the line width between (b) and (c) is less than 5% and the line width of (a) is 5% or more larger than (b).

[Followability of Water]

The positive resist solution prepared was coated on a silicon wafer and baked at 115° C. for 60 seconds to form a 200-nm resist film. Subsequently, as shown in FIG. 1, 15 ml of distilled water was dropped on the center part of the resulting positive resist solution-coated wafer 1, and a 10 cm-square quartz plate 3 with a kite string 2 was placed on the distilled water puddle to provide a state such that the gap between the wafer 1 and the quartz plate 3 was entirely filled with distilled water 4.

In the state of the wafer 1 being fixed, the kite string 2 attached to the quartz plate 3 was wound around the rotor of a motor 5 rotating at a rate of 20 cm/sec. The switch of the motor 5 was turned on for 0.5 seconds to move the quartz plate 3 and after the movement of quartz plate 3, the amount of distilled water remaining under the quartz plate 3 was judged according to the following criteria and used as the index for followability of water.

FIG. 2, (a) to (d) schematically show various patterns observed from above the quartz plate 3 after the movement of quartz plate, in which the shaded part 6 is a region where distilled water remains under the quartz plate 3 and the blank part 7 is a region where distilled water could not follow the movement of the quartz plate 3, allowing the entering of air.

The followability of water was rated ⊙ when water remains on the entire substrate surface even after the movement of quartz plate as shown in (a); rated ○ when the area allowing the entering of air is only about 10% based on the entire substrate area as shown in (b); rated Δ when the area allowing the entering of air is from 20 to 50% based on the entire substrate area as shown in (c); and rated x when the area allowing the entering of air is as large as 50% or more based on the entire substrate area as shown in (d).

TABLE 3

| | Composition | | | | | | Evaluation Results | | |
|---|---|---|---|---|---|---|---|---|---|
| | Resin (A) (2 g) | Photoacid Generator (mg) | Resin (C) (mg) | Solvent (mass ratio) | Basic Compound (mg) | Surfactant (mg) | Exposure Condition (1) Profile | Exposure Condition (2) Profile | Followability of Water |
| Example 1 | 1 | z2 (80) | C-2 (80) | SL-1/SL-2 60/40 | N-1 (7) | W-1 (3) | rectangular | rectangular | ◯ |
| Example 2 | 2 | z38 (110) | C-6 (70) | SL-2/SL-4/SL-6 40/59/1 | N-6 (10) | W-3 (3) | rectangular | rectangular | ◯ |
| Example 3 | 3 | z42 (70) | C-7 (30) | SL-2/SL-4 70/30 | N-3 (6) | W-5 (30) | rectangular | rectangular | Δ |
| Example 4 | 4 | z38 (82) | C-3 (80) | SL-2/SL-4 60/40 | — | W-1 (3) | rectangular | rectangular | ⊙ |
| Example 5 | 5 | z2 (80) | C-10 (80) | SL-3/SL-4 30/70 | N-2 (9) | W-1 (3) | rectangular | rectangular | ⊙ |
| Example 6 | 6 | Z65 (93) | C-4-1 (100) | SL-2/SL-4/SL-5 40/58/2 | N-1 (7) | W-1 (3) | rectangular | rectangular | ⊙ |
| Example 7 | 7 | z2 (80) | C-1-2 (70) | SL-1/SL-2 60/40 | N-4 (13) | W-1 (3) | rectangular | rectangular | Δ |
| Example 8 | 8 | z2 (80) | C-1-3 (90) | SL-1/SL-2 60/40 | N-3 (6) | W-5 (3) | rectangular | rectangular | ◯ |
| Example 9 | 9 | z16 (90) | C-1-1 (90) | SL-2/SL-4/SL-6 40/59/1 | N-2 (6) | W-4 (3) | rectangular | rectangular | ⊙ |
| Example 10 | 10 | z2 (80) | C-8 (60) | SL-2/SL-4 70/30 | N-5 (7) | W-6 (30) | rectangular | rectangular | ⊙ |
| Example 11 | 11 | z62 (100) | C-1-4 (65) | SL-2/SL-4 60/40 | N-1 (9) | W-2 (3) | rectangular | rectangular | ⊙ |
| Example 12 | 12 | z56 (99) | C-9 (80) | SL-1/SL-2 70/30 | N-1 (7) | W-1 (3) | rectangular | rectangular | ⊙ |
| Example 13 | 13 | z25 (70) | C-5 (90) | SL-2/SL-4 70/30 | N-3 (6) | W-2 (3) | rectangular | rectangular | ◯ |
| Example 14 | 14 | z60 (99) | C-4-1 (85) | SL-2 100 | N-4 (10) | W-5 (3) | rectangular | rectangular | ⊙ |
| Comparative Example 1 | 1 | z2 (80) | — | SL-1/SL-2 60/40 | N-1 (7) | W-1 (3) | forwardly tapered | T-top | X |
| Comparative Example 2 | 2 | z2 (80) | — | SL-2/SL-4/SL-6 40/59/1 | N-6 (11) | W-3 (3) | forwardly tapered | T-top | X |

TABLE 4

| | Composition | | | | | | Evaluation Results | | |
|---|---|---|---|---|---|---|---|---|---|
| | Resin (A) (2 g) | Photoacid Generator (mg) | Resin (C) (mg) | Solvent (mass ratio) | Basic Compound (mg) | Surfactant (mg) | Exposure Condition (1) Profile | Exposure Condition (2) Profile | Followability of Water |
| Example 15 | 15 | z2 (80) | C-2 (80) | SL-2/SL-4/SL-6 40/59/1 | N-3 (6) | W-5 (30) | rectangular | rectangular | ⊙ |
| Example 16 | 16 | z2 (80) | C-6 (70) | SL-2/SL-4 70/30 | N-2 (9) | W-1 (3) | rectangular | rectangular | ⊙ |
| Example 17 | 17 | z2 (80) | C-8 (35) | SL-2/SL-4 60/40 | N-6 (10) | W-5 (30) | rectangular | rectangular | ⊙ |
| Example 18 | 18 | z2 (80) | C-3 (80) | SL-2/SL-4 60/40 | N-6 (10) | W-3 (3) | rectangular | rectangular | ⊙ |

TABLE 5

| | Composition | | | | | | Evaluation Results | | |
|---|---|---|---|---|---|---|---|---|---|
| | Resin (A) (2 g) | Photoacid Generator (mg) | Resin (C) (mg) | Solvent (mass ratio) | Basic Compound (mg) | Surfactant (mg) | Exposure Condition (1) Profile | Exposure Condition (2) Profile | Followability of Water |
| Example 19 | 19 | z2 (80) | C-2 (80) | SL-1/SL-2 60/40 | N-1 (7) | W-1 (3) | rectangular | rectangular | ◯ |
| Example 20 | 20 | z2 (80) | C-6 (70) | SL-2/SL-4/SL-6 40/59/1 | N-6 (10) | W-3 (3) | rectangular | rectangular | ⊙ |
| Example 21 | 21 | z2 (80) | C-8 (35) | SL-2/SL-4 70/30 | N-3 (6) | W-5 (30) | rectangular | rectangular | ◯ |
| Example 22 | 22 | z2 (80) | C-3 (80) | SL-2/SL-4 60/40 | — | W-1 (3) | rectangular | rectangular | ⊙ |

TABLE 5-continued

| | Composition | | | | | | Evaluation Results | | |
|---|---|---|---|---|---|---|---|---|---|
| | Resin | Photoacid | Resin | | Basic | | | Exposure Condition (2) | |
| | (A) (2 g) | Generator (mg) | (C) (mg) | Solvent (mass ratio) | Compound (mg) | Surfactant (mg) | Exposure Condition (1) Profile | Profile | Followability of Water |
| Example 23 | 23 | z38 (110) | C-10 (80) | SL-3/SL-4 30/70 | N-2 (9) | W-1 (3) | rectangular | rectangular | ⊙ |
| Example 24 | 24 | Z2 (80) | C-4-2 (100) | SL-2/SL-4/SL-5 40/58/2 | N-1 (7) | W-1 (3) | rectangular | rectangular | ⊙ |
| Example 25 | 25 | z16 (90) | C-1-2 (90) | SL-1/SL-2 60/40 | N-4 (13) | W-1 (3) | rectangular | rectangular | ○ |
| Example 26 | 26 | z2 (80) | C-4-2 (100) | SL-1/SL-2 60/40 | N-4 (13) | W-1 (3) | rectangular | rectangular | ⊙ |
| Example 27 | 20 (1 g) 25 (1 g) | z42 (70) | C-1-3 (90) | SL-1/SL-2 60/40 | N-3 (6) | W-5 (3) | rectangular | rectangular | ○ |
| Example 28 | 17 (1 g) 20 (1 g) | z38 (82) | C-1-1 (90) | SL-2/SL-4/SL-6 40/59/1 | N-2 (6) | W-4 (3) | rectangular | rectangular | ⊙ |
| Example 29 | 22 (1 g) 25 (1 g) | z56 (99) | C-7 (60) | SL-2/SL-4 70/30 | N-5 (7) | W-6 (30) | rectangular | rectangular | ⊙ |
| Example 30 | 16 (1 g) 1 (1 g) | z25 (70) | C-3 (65) | SL-2/SL-4 60/40 | N-1 (9) | W-2 (3) | rectangular | rectangular | ⊙ |

TABLE 6

| (Cont'd of Table 5) | | | | | | | | | |
|---|---|---|---|---|---|---|---|---|---|
| Example 31 | 17 | z60 (99) | C-9 (80) | SL-1/SL-2 70/30 | N-1 (7) | W-1 (3) | rectangular | rectangular | ⊙ |
| Example 32 | 10 | z62 (100) | C-5 (90) | SL-2/SL-4 70/30 | N-3 (6) | W-2 (3) | rectangular | rectangular | ⊙ |
| Example 33 | 16 | z65 (93) | C-10 (85) | SL-2 100 | N-4 (10) | W-5 (3) | rectangular | rectangular | ○ |
| Example 34 | 10 | z4 (70) | C-5 (90) | SL-1/SL-2 60/40 | N-5 (7) | W-1 (3) | rectangular | rectangular | ⊙ |
| Example 35 | 16 | z5 (75) | C-4-3 (100) | SL-2/SL-4/SL-6 40/59/1 | N-7 (11) | W-1 (3) | rectangular | rectangular | ⊙ |
| Example 36 | 16 | Z23 (80) | C-4-4 (100) | SL-2/SL-4/SL-6 40/59/1 | N-7 (11) | W-1 (3) | rectangular | rectangular | ⊙ |
| Example 37 | 10 | z51 (100) | C-4 (100) | SL-2/SL-4/SL-6 40/59/1 | N-7 (11) | W-5 (3) | rectangular | rectangular | ⊙ |
| Example 38 | 16 | a63 (95) | C-5 (90) | SL-2/SL-4/SL-6 40/59/1 | N-7 (11) | W-4 (3) | rectangular | rectangular | ⊙ |
| Example 39 | 16 | a68 (90) | C-7 (60) | SL-2/SL-4/SL-6 40/59/1 | N-1 (7) | W-6 (30) | rectangular | rectangular | ⊙ |
| Example 40 | 10 | z69 (105) | C-1-1 (90) | SL-2/SL-4 70/30 | N-3 (6) | W-2 (3) | rectangular | rectangular | ⊙ |
| Example 41 | 16 | z4(35) z51(50) | C-10 (80) | SL-2 100 | N-4 (10) | W-1 (3) | rectangular | rectangular | ⊙ |
| Example 42 | 16 | z5(32) z56(50) | C-4-3 (80) | SL-1/SL-2 60/40 | N-5 (7) | W-1 (3) | rectangular | rectangular | ⊙ |
| Example 43 | 16 | z23(42) z63(60) | C-10 (80) | SL-2/SL-4/SL-6 40/59/1 | N-7 (11) | W-5 (3) | rectangular | rectangular | ⊙ |
| Example 44 | 16 | z5(32) z65(60) | C-5 (90) | SL-2/SL-4/SL-6 40/59/1 | N-1 (7) | W-4 (3) | rectangular | rectangular | ⊙ |
| Example 45 | 16 | z58(130) z5(32) | C-7 (60) | SL-2/SL-4 70/30 | N-3 (6) | W-6 (30) | rectangular | rectangular | ⊙ |
| Example 46 | 16 | z44(130) z23(42) | C-1-1 (90) | SL-2 100 | N-4 (10) | W-2 (3) | rectangular | rectangular | ⊙ |
| Example 47 | 16 | z37(80) z23(42) | C-4-3 (80) | SL-1/SL-2 60/40 | N-5 (7) | W-1 (3) | rectangular | rectangular | ⊙ |
| Example 48 | 16 | Z37(80) z5(32) | C-10 (80) | SL-2/SL-4/SL-6 40/59/1 | N-7 (11) | W-1 (3) | rectangular | rectangular | ⊙ |

TABLE 7

|  | Exposure Condition (1) | | Exposure Condition (2) | | Development Time (common to Exposure Conditions (1) and (2) |
|---|---|---|---|---|---|
|  | PB Temperature | PEB Temperature | PB Temperature | PEB Temperature | |
| Example 1 | 130° C. | 120° C. | 120° C. | 110° C. | 30 s |
| Example 2 | 130° C. | 120° C. | 120° C. | 110° C. | 30 s |
| Example 3 | 130° C. | 120° C. | 120° C. | 110° C. | 30 s |
| Example 4 | 130° C. | 120° C. | 120° C. | 110° C. | 30 s |
| Example 5 | 130° C. | 120° C. | 120° C. | 110° C. | 30 s |
| Example 6 | 130° C. | 120° C. | 120° C. | 110° C. | 30 s |
| Example 7 | 130° C. | 120° C. | 120° C. | 110° C. | 30 s |
| Example 8 | 130° C. | 120° C. | 120° C. | 110° C. | 30 s |
| Example 9 | 130° C. | 120° C. | 120° C. | 110° C. | 30 s |
| Example 10 | 130° C. | 120° C. | 120° C. | 110° C. | 30 s |
| Example 11 | 130° C. | 120° C. | 120° C. | 110° C. | 30 s |
| Example 12 | 130° C. | 120° C. | 120° C. | 110° C. | 30 s |
| Example 13 | 130° C. | 120° C. | 120° C. | 110° C. | 30 s |
| Example 14 | 130° C. | 120° C. | 120° C. | 110° C. | 30 s |
| Comparative Example 1 | 130° C. | 120° C. | 120° C. | 110° C. | 30 s |
| Comparative Example 2 | 130° C. | 120° C. | 120° C. | 110° C. | 30 s |
| Example 15 | 130° C. | 120° C. | 120° C. | 110° C. | 30 s |
| Example 16 | 130° C. | 120° C. | 120° C. | 110° C. | 30 s |
| Example 17 | 130° C. | 120° C. | 120° C. | 110° C. | 30 s |
| Example 18 | 130° C. | 120° C. | 120° C. | 110° C. | 30 s |
| Example 19 | 120° C. | 120° C. | 120° C. | 120° C. | 30 s |
| Example 20 | 120° C. | 120° C. | 120° C. | 120° C. | 30 s |
| Example 21 | 120° C. | 120° C. | 120° C. | 120° C. | 30 s |
| Example 22 | 120° C. | 120° C. | 120° C. | 120° C. | 30 s |
| Example 23 | 120° C. | 120° C. | 120° C. | 120° C. | 30 s |
| Example 24 | 120° C. | 120° C. | 120° C. | 120° C. | 30 s |
| Example 25 | 120° C. | 120° C. | 120° C. | 120° C. | 30 s |
| Example 26 | 120° C. | 120° C. | 120° C. | 120° C. | 30 s |
| Example 27 | 120° C. | 120° C. | 120° C. | 120° C. | 30 s |
| Example 28 | 120° C. | 120° C. | 120° C. | 120° C. | 30 s |
| Example 29 | 120° C. | 120° C. | 120° C. | 120° C. | 30 s |
| Example 30 | 120° C. | 120° C. | 120° C. | 120° C. | 30 s |

TABLE 8

|  | Exposure Condition (1) | | Exposure Condition (2) | | Development Time (common to Exposure Conditions (1) and (2) |
|---|---|---|---|---|---|
|  | PB Temperature | PEB Temperature | PB Temperature | PEB Temperature | |
| Example 31 | 120° C. | 120° C. | 120° C. | 120° C. | 30 s |
| Example 32 | 120° C. | 120° C. | 120° C. | 120° C. | 30 s |
| Example 33 | 120° C. | 120° C. | 120° C. | 120° C. | 60 s |
| Example 34 | 90° C. | 90° C. | 90° C. | 90° C. | 90 s |
| Example 35 | 130° C. | 100° C. | 130° C. | 100° C. | 30 s |
| Example 36 | 110° C. | 110° C. | 110° C. | 110° C. | 30 s |
| Example 37 | 100° C. | 100° C. | 100° C. | 100° C. | 30 s |
| Example 38 | 120° C. | 110° C. | 120° C. | 110° C. | 60 s |
| Example 39 | 120° C. | 100° C. | 120° C. | 100° C. | 90 s |
| Example 40 | 90° C. | 130° C. | 90° C. | 130° C. | 30 s |
| Example 41 | 130° C. | 90° C. | 130° C. | 90° C. | 60 s |
| Example 42 | 110° C. | 100° C. | 110° C. | 100° C. | 60 s |
| Example 43 | 100° C. | 130° C. | 100° C. | 130° C. | 90 s |
| Example 44 | 110° C. | 100° C. | 110° C. | 100° C. | 60 s |
| Example 45 | 130° C. | 120° C. | 130° C. | 120° C. | 90 s |
| Example 46 | 90° C. | 100° C. | 90° C. | 100° C. | 90 s |
| Example 47 | 90° C. | 90° C. | 90° C. | 90° C. | 30 s |
| Example 48 | 130° C. | 130° C. | 130° C. | 130° C. | 30 s |

The symbols in Tables 3 to 6 denote the followings.

The acid generators are corresponding to those described above.

N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
N-7: Triethanolamine
W-1: Megafac F176 (produced by Dainippon Ink & Chemicals, Inc.) (fluorine-containing)
W-2: Megafac $R_{08}$ (produced by Dainippon Ink & Chemicals, Inc.) (fluorine- and silicon-containing)
W-3: Polysiloxane polymer KP-341 (produced by Shin-Etsu Chemical Co., Ltd.) (silicon-containing)
W-4: Troysol S-366 (produced by Troy Chemical)
W-5: PF656 (produced by OMNOVA) (fluorine-containing)
W-6: PF6320 (produced by OMNOVA) (fluorine-containing)
W-7: PF6520 (produced by OMNOVA) (fluorine-containing)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate As seen from the results in Tables 3 to 6, the positive resist composition of the present invention is assured of good followability of water at the immersion exposure and excellent profile at both the normal exposure and the immersion exposure.

According to the present invention, a positive resist composition improved in the pattern profile at normal exposure and immersion exposure and assured of excellent followability of water at the immersion exposure, and a pattern forming method using the positive resist composition can be provided.

The entire disclosure of each and every foreign patent application from which the benefit of foreign priority has been claimed in the present application is incorporated herein by reference, as if fully set forth.

What is claimed is:

1. A positive resist composition comprising:
(A) a resin of which solubility in an alkali developer increases under the action of an acid,
(B) a compound capable of generating an acid upon irradiation with actinic rays or radiation,
(C) a resin having at least one repeating unit selected from fluorine atom-containing repeating units represented by the following formulae (2-1), (1-2) and (1-3), the resin being stable to an acid and insoluble in an alkali developer, and the resin being added in an amount of from 0.1 to 5.0 mass % based on the entire solid content concentration, and
(D) a solvent:

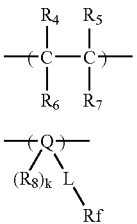
(2-1)

wherein $R_1$ represents a hydrogen atom or an alkyl group;
$R_3$ represents a hydrogen atom or a monovalent organic group;
$R_4$ to $R_7$ each independently represents a hydrogen atom, a fluorine atom, an alkyl group, a fluoroalkyl group, an alkoxy group or a fluoroalkoxy group, provided that at least one of $R_4$ to $R_7$ represents a fluorine atom, and $R_4$ and $R_5$, or $R_6$ and $R_7$ may combine to form a ring;
$R_8$ represents a hydrogen atom, a fluorine atom or a monovalent organic group;
Rf represents a fluorine atom or a fluorine atom-containing monovalent organic group;
L represents a single bond or a divalent linking group;
Q represents an alicyclic structure; and
k represents an integer of 0 to 3; and
wherein when the resin (C) has a repeating unit of the formula (2-1), the resin further comprises the following repeating unit:

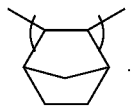

2. The positive resist composition according to claim 1, wherein the resin (A) has a monocyclic or polycyclic alicyclic hydrocarbon structure.

3. The positive resist composition according to claim 1, wherein the resin (A) has (A1) a repeating unit having a lactone structure and a cyano group.

4. The positive resist composition according to claim 3, wherein the repeating unit (A1) having a lactone structure and a cyano group has a structure represented by the following formula (A2):

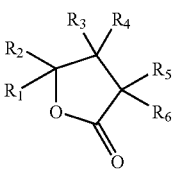
(A2)

wherein $R_1$ to $R_6$ each independently represents a single bond, a hydrogen atom or a substituent, and at least two of $R_1$ to $R_6$ may combine with each other to form a ring structure, provided at least one of $R_1$ to $R_6$ represents a cyano group or a substituent having a cyano group.

5. The positive resist composition according to claim 3, wherein the (A1) repeating unit having a lactone structure and a cyano group has a structure represented by the following formula (A6):

(A6)

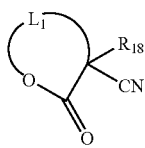

wherein R₁₈ represents a single bond, a hydrogen atom or a substituent;

L₁ represents a linking group for linking the carbon atom at the 2-position of the lactone ring and the oxygen atom of the lactone to form a lactone ring structure; and R₁₈ and L₁ may combine with each other to form a ring structure.

6. The positive resist composition according to claim 1, wherein formula (1-3) is represented by the following formula (3-1):

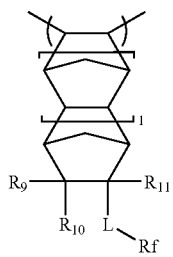

(3-1)

wherein R₉, R₁₀ and R₁₁ each independently represents a hydrogen atom, a fluorine atom or a monovalent organic group, Rf represents a fluorine atom or a fluorine atom-containing monovalent organic group, L represents a single bond or a divalent linking group, and l represents 0 or 1.

7. The positive resist composition according to claim 1, which further comprises (E) a basic compound.

8. The positive resist composition according to claim 1, which further comprises (F) a surfactant.

9. A pattern forming method comprising:

forming a resist film from the positive resist composition according to claim 1; and exposing and developing the resist film.

10. The pattern forming method according to claim 9, wherein the resist film is exposed through an immersion liquid.

11. The positive resist composition as described in claim 1, wherein the resin (A) comprises:

a repeating unit represented by the following formula (R1);

a repeating unit represented by the following formula (R2); and a repeating unit represented by the following formula (R3):

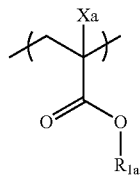

(R1)

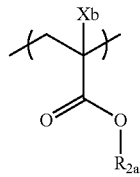

(R2)

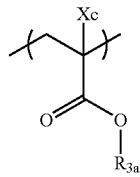

(R3)

wherein Xa, Xb and Xc each independently represents a hydrogen atom or a methyl group, R₁ₐ represents a group having a lactone structure, R₂ₐ represents a monovalent organic group substituted by a hydroxyl group or a cyano group, and R₃ₐ represents a group which desorbs under the action of an acid.

12. The positive resist composition according to claim 1, wherein the resin (A) has a weight average molecular weight of 5,000 to 10,000 and a dispersity of 1.2 to 3.0.

13. The positive resist composition according to claim 1, wherein the compound (B) has a triphenylsulfonium cation structure.

14. The positive resist composition according to claim 1, wherein two or more kinds of solvents are contained as the solvent (D) and at least one solvent is propylene glycol monomethyl ether acetate.

15. The positive resist composition according to claim 1, wherein the solid content concentration is from 3.0 to 10.0 mass %.

16. The positive resist composition according to claim 1, wherein formula (1-3) is represented by the following formula (3-2):

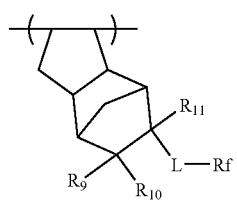

(3-2)

wherein R₉, R₁₀ and R₁₁ each represents a hydrogen atom, a fluorine atom or a monovalent organic group, Rf represents a fluorine atom or a fluorine atom-containing monovalent organic group, and L represents a single bond or a divalent linking group.

* * * * *